United States Patent
He et al.

(10) Patent No.: US 11,196,408 B2
(45) Date of Patent: Dec. 7, 2021

(54) SYSTEM AND METHOD FOR MIXED TRANSMISSION OF SIGNALS AND POWER SUPPLY THROUGH A SINGLE CABLE

(71) Applicant: ZHEJIANG DAHUA TECHNOLOGY CO., LTD., Zhejiang (CN)

(72) Inventors: Yuxiang He, Hangzhou (CN); Qifeng Zhu, Hangzhou (CN); Xingyu Xu, Hangzhou (CN); Zhiji Deng, Hangzhou (CN); Ming Liu, Hangzhou (CN)

(73) Assignee: ZHEJIANG DAHUA TECHNOLOGY CO., LTD., Hangzhou (CN)

( * ) Notice: Subject to any disclaimer, the term of this patent is extended or adjusted under 35 U.S.C. 154(b) by 8 days.

(21) Appl. No.: 16/708,487

(22) Filed: Dec. 10, 2019

(65) Prior Publication Data

US 2020/0119718 A1   Apr. 16, 2020

Related U.S. Application Data

(63) Continuation of application No. PCT/CN2017/119762, filed on Dec. 29, 2017.

(30) Foreign Application Priority Data

Jun. 21, 2017 (CN) .......................... 201710473957.1
Jul. 24, 2017 (CN) .......................... 201710608710.6
Aug. 16, 2017 (CN) .......................... 201710701636.2

(51) Int. Cl.
*H03H 11/04* (2006.01)
*G01R 19/165* (2006.01)
(Continued)

(52) U.S. Cl.
CPC ......... *H03H 11/04* (2013.01); *G01R 19/1659* (2013.01); *H04N 5/63* (2013.01); *H04N 7/102* (2013.01)

(58) Field of Classification Search
CPC ...... H03H 11/04; G01R 19/1659; H04N 5/63; H04N 7/102
See application file for complete search history.

(56) References Cited

U.S. PATENT DOCUMENTS 7,091,792 B2    8/2006  Mehr
2010/0284207 A1  11/2010 Watanabe et al.
(Continued)

FOREIGN PATENT DOCUMENTS

CN    1321003 A    11/2001
CN    201159761 Y  12/2008
(Continued)

OTHER PUBLICATIONS

International Search Report in PCT/CN2017/119762 dated Feb. 24, 2018, 4 pages.
(Continued)

*Primary Examiner* — Daniel C Puentes
(74) *Attorney, Agent, or Firm* — Metis IP LLC

(57) ABSTRACT

A signal processing circuit for dynamically processing an analog signal. The signal processing circuit may include a detection module and a fluctuation filter module. The detection module may be configured to detect a voltage of a first sub-signal of a first frequency band of the analog signal in real time and transmit a first control signal when the voltage of the first sub-signal is out of a first preset voltage range. The fluctuation filter module may be configured to remove a second sub-signal of a second frequency band of the
(Continued)

analog signal from the analog signal upon receiving the first control signal. The second frequency band may cover the first frequency band.

18 Claims, 33 Drawing Sheets

(51) Int. Cl.
*H04N 5/63* (2006.01)
*H04N 7/10* (2006.01)

(56) References Cited

U.S. PATENT DOCUMENTS

| | | | |
|---|---|---|---|
| 2012/0320958 A1 | 12/2012 | Schwager et al. | |
| 2013/0187445 A1 | 7/2013 | Mutzabaugh | |
| 2017/0163867 A1 | 6/2017 | Ihlenburg et al. | |
| 2017/0347062 A1* | 11/2017 | Ye | H04N 7/102 |

FOREIGN PATENT DOCUMENTS

| | | | |
|---|---|---|---|
| CN | 101566645 A | 10/2009 | |
| CN | 101615588 A | 12/2009 | |
| CN | 101860443 A | 10/2010 | |
| CN | 202503261 U | 10/2012 | |
| CN | 103107829 A | 5/2013 | |
| CN | 103780234 A | 5/2014 | |
| CN | 104155502 A | 11/2014 | |
| CN | 104994269 A | 10/2015 | |
| CN | 204795311 U | 11/2015 | |
| CN | 105337374 A | 2/2016 | |
| CN | 105450211 A | 3/2016 | |
| CN | 205176994 U | 4/2016 | |
| CN | 106210668 A | 12/2016 | |
| CN | 106303342 A | 1/2017 | |
| CN | 106713866 A | 5/2017 | |
| CN | 107333085 A | 11/2017 | |
| CN | 107483773 A | 12/2017 | |
| JP | 2005159554 A | 6/2005 | |
| JP | 5371883 B2 | 12/2013 | |

OTHER PUBLICATIONS

Written Opinion in PCT/CN2017/119762 dated Feb. 24, 2018, 7 pages.
First Office Action in Chinese Application No. 201710701636.2 dated Mar. 20, 2019, 9 pages.
First Office Action in Chinese Application No. 201710608710.6 dated Apr. 2, 2019, 11 pages.
First Office Action in Chinese Application No. 201710473957.1 dated July 4, 2 019, 10 pages.
The Extended European Search Report in European Application No. 17914749.1 dated Mar. 17, 2020, 11 pages.

\* cited by examiner

SYSTEM AND METHOD FOR MIXED TRANSMISSION OF SIGNALS AND POWER SUPPLY THROUGH A SINGLE CABLE

CROSS REFERENCE CROSS REFERENCE TO RELATED APPLICATIONS

This application is a Continuation of International Application No. PCT/CN2017/119762 filed on Dec. 29, 2017, which claims priority of Chinese Application No. 201710701636.2 filed on Aug. 16, 2017, priority of Chinese Application No. 201710608710.6 filed on Jul. 24, 2017, and priority of Chinese Application No. 201710473957.1 filed on Jun. 21, 2017. The entire contents of above applications are hereby incorporated by reference.

TECHNICAL FIELD

The present invention generally relates to system and method for power supply transmission and analog signal transmission, and more specifically to system and method for mixed transmission of analog signals and power supply through a single cable.

BACKGROUND

In current signal transmission systems and/or power supply transmission systems, power supply, analog signals, and control signals, etc., are typically transmitted through multiple cables between a frontend device and a backend device, respectively. Such a transmission system may increase the difficulty to install the system and/or to update the system. Transmitting the power supply and the signals through a single cable such as a coaxial cable may greatly reduce the system installing effort and reduce the cost of the saved cables. However, a mixed transmission of the power supply and an analog signal may cause the analog signal being greatly influenced by the power supply. For example, when the power consumption of the frontend device is varied, a voltage of the power supply transmitted from the backend device to the frontend device may be greatly varied, causing a step change of the analog signal. Besides, if a frontend device not supporting the mixed transmission is coupled to a backend device supporting the mixed transmission by mistake, the frontend device may be burned out, causing a great safety issue.

SUMMARY

According to an aspect of the present disclosure, a signal processing circuit for dynamically processing an analog signal may include a detection module and a fluctuation filter module. The detection module may be configured to detect a voltage of a first sub-signal of a first frequency band of the analog signal in real time and transmit a first control signal when the voltage of the first sub-signal is out of a first preset voltage range. The fluctuation filter module may be configured to remove a second sub-signal of a second frequency band of the analog signal from the analog signal upon receiving the first control signal. The second frequency band may cover the first frequency band.

In some embodiments, the first frequency band and the second frequency band may be lower than 25 Hz.

In some embodiments, the detection module may be further configured to transmit a second control signal when the voltage of the first sub-signal is within the first preset voltage range. The fluctuation filter module may be further configured to transmit the analog signal without removing the second sub-signal upon receiving the second control signal.

In some embodiments, the detection module may further include a sub-signal acquisition unit and a fluctuation detection unit. The sub-signal acquisition unit may be configured to obtain the first sub-signal from the analog signal. The fluctuation detection unit may be configured to transmit the first control signal when a voltage of the first sub-signal is out of the first preset voltage range, and transmit the second control signal when the voltage of the first sub-signal is within the first preset voltage range.

In some embodiments, the fluctuation detection unit may further include a first fluctuation unit, a second fluctuation unit, and a comparator. The first fluctuation unit may be configured to transmit a first output voltage based on the first sub-signal. The second fluctuation unit may be configured to transmit a second output voltage based on the first sub-signal. The comparator may be configured to transmit an output signal based on a comparison of the first output voltage and the second output voltage. When the voltage of the first sub-signal is out of the first preset voltage range, the first output voltage may be larger than the second output voltage and the output signal may be the first control signal. When the voltage of the first sub-signal is within the first preset voltage range, the first output voltage may be smaller than the second output voltage and the output signal is the second control signal.

In some embodiments, when the first sub-signal is having a first fluctuation, the first output voltage may be a sum of a first reference voltage and a voltage of the first fluctuation, and the second output voltage may be a second reference voltage. When the first sub-signal is having a second fluctuation, the first output voltage may be the first reference voltage, and the second output voltage may be a difference between the second reference voltage and a voltage of the second fluctuation. The first fluctuation may be in the form of a positive wave, and the second fluctuation may be in the form of a negative wave.

In some embodiments, the signal processing circuit may further include a reverse control signal acquisition module and a reverse control signal superposition module. The reverse control signal acquisition module may be configured to obtain a reverse control signal transmitted by a signal receiver. The reverse control signal may cause a frontend device transmitting the analog signal to perform a corresponding operation. The signal receiver may receive a processed signal obtained by dynamically processing the analog signal, and transmit the reverse control signal through a same electronic path. The reverse control signal superposition module may be configured to superpose the reverse control signal obtained by the reverse control signal acquisition module on the analog signal.

In some embodiments, the reverse control signal may have a high level and a low level. The reverse control signal superposition module may be further configured to block the processed signal when the reverse control signal is at the high level.

According to another aspect of the present disclosure, a method for dynamically processing an analog signal may include detecting, by a detection module, a voltage of a first sub-signal of a first frequency band of the analog signal. The method may also include transmitting, by the detection module, a first control signal when the voltage is out of a first preset voltage range. The method may further include removing, by a fluctuation filter module, a second sub-signal of a second frequency band of the analog signal from the analog signal upon receiving the first control signal. The second frequency band may cover the first frequency band.

In some embodiments, the method may further include transmitting, by the detection module, a second control signal when the voltage of the first sub-signal is within the first preset voltage range; and transmitting, by the fluctuation filter module, the analog signal without removing the second sub-signal upon receiving the second control signal.

In some embodiments, the method may further include obtaining the first sub-signal from the analog signal.

According yet to another aspect of the present disclosure, a backend device for transmitting power supply to a frontend device and receiving an analog signal therefrom through a single cable may include a power, a signal processing circuit, a signal receiver, and a backend interface. The power may be configured to transmit the power supply. The signal processing circuit may be configured to generate a processed signal based on the analog signal. The signal receiver may be configured to receive the processed signal. The backend interface may be configured to receive the analog signal from the cable, receive the power supply from the power, separate the analog signal and the power supply, transmit the analog signal to the signal processing circuit, and transmit the power to the cable.

In some embodiments, the backend interface may include a signal blocking module and a power supply blocking module. The signal blocking module may be configured to block the analog signal while allow a pass of the power supply. The power supply blocking module may be configured to block the power supply while allow a pass of the analog signal.

In some embodiments, the backend interface may include a port for plugging in a frontend device, an identification module, and a processing module. The identification module may be configured to obtain a voltage at the port, determine whether a frontend device is plugged into the port based on the voltage, and determine a rise time of the voltage at the port upon determining that a frontend device is plugged into the port. The processing module may be configured to determine whether the rise time is within a preset time range and transmit a turn-on signal upon determining that the rise time is within the preset time range. The turn-on signal may cause the backend device providing power supply through the cable to the frontend device.

In some embodiments, the backend interface may further include a safety module. The safety module may be configured to transmit a warning signal to the processing module when a current passing through the safety module is out of a preset current range or when the frontend device is unplugged from the port. The warning signal may cause the backend device to stop providing power supply through the cable to the frontend device.

In some embodiments, to generate the processed signal, the signal processing circuit may be further configured to perform a compensation upon the analog signal.

In some embodiments, to generate the processed signal, the signal processing circuit may be configured to detect a voltage of a first sub-signal of a first frequency band of the analog signal, and remove a second sub-signal of a second frequency band of the analog signal from the analog signal when the voltage is out of a first preset voltage range, wherein the second frequency band covers the first frequency band.

In some embodiments, to generate the processed signal, the signal processing circuit may be further configured to transmit the analog signal to the signal receiver without removing the second sub-signal when the voltage is within the first preset voltage range.

In some embodiments, the signal receiver may be further configured to transmit a reverse control signal causing the frontend device to perform a corresponding operation. The signal receiver may receive the processed signal and transmit the reverse control signal through a same electronic path. The signal processing circuit may be further configured to obtain the reverse control signal, and superpose the reverse control signal obtained by the reverse control signal acquisition module on the analog signal.

In some embodiments, the reverse control signal may have a high level and a low level. The signal processing circuit may be further configured to block the processed signal when the reverse control signal is at the high level.

According yet to another aspect of the present disclosure, a method for a backend device providing power supply to a frontend device through a cable is provided. The backend device may include a port for plugging in the cable. The method may include obtaining a voltage at the port in real time, and determining whether the frontend device is plugged into the backend device based on the voltage. The method may also include determining a rise time of the voltage at the port upon determining the frontend device is plugged into the backend device. The method may further include determining whether the rise time is within a preset time range, and, upon determining that the rise time is within the preset time range, providing power supply to the cable while receiving the analog signal from the cable.

In some embodiments, the method may further comprise, upon determining that the rise time is out of the preset time range, receiving the analog signal from the cable without providing power supply to the cable.

In some embodiments, the determining whether the frontend device is plugged into the backend device based on the voltage may include determining whether the voltage is equal to a first predetermined voltage, and determining that the frontend device is plugged into the backend device when the voltage is equal to the first predetermined voltage.

In some embodiments, the determining the rise time of the voltage at the port may comprise setting a time point when the voltage at the port is equal to the first predetermined voltage as a first time point; setting a time point when the voltage at the port is equal to a second predetermined voltage as a second time point; and determining the rise time based on the first time point and the second time point.

According yet to another aspect of the present disclosure, a system for a mixed transmission of power supply and analog signals through a single cable may include an aforementioned backend device, and a frontend device. The frontend device may be configured to transmit an analog signal to the backend device through the cable while receive power supply from the backend device through the cable.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTIONS OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein.

DETAILED DESCRIPTION

Figure 1:
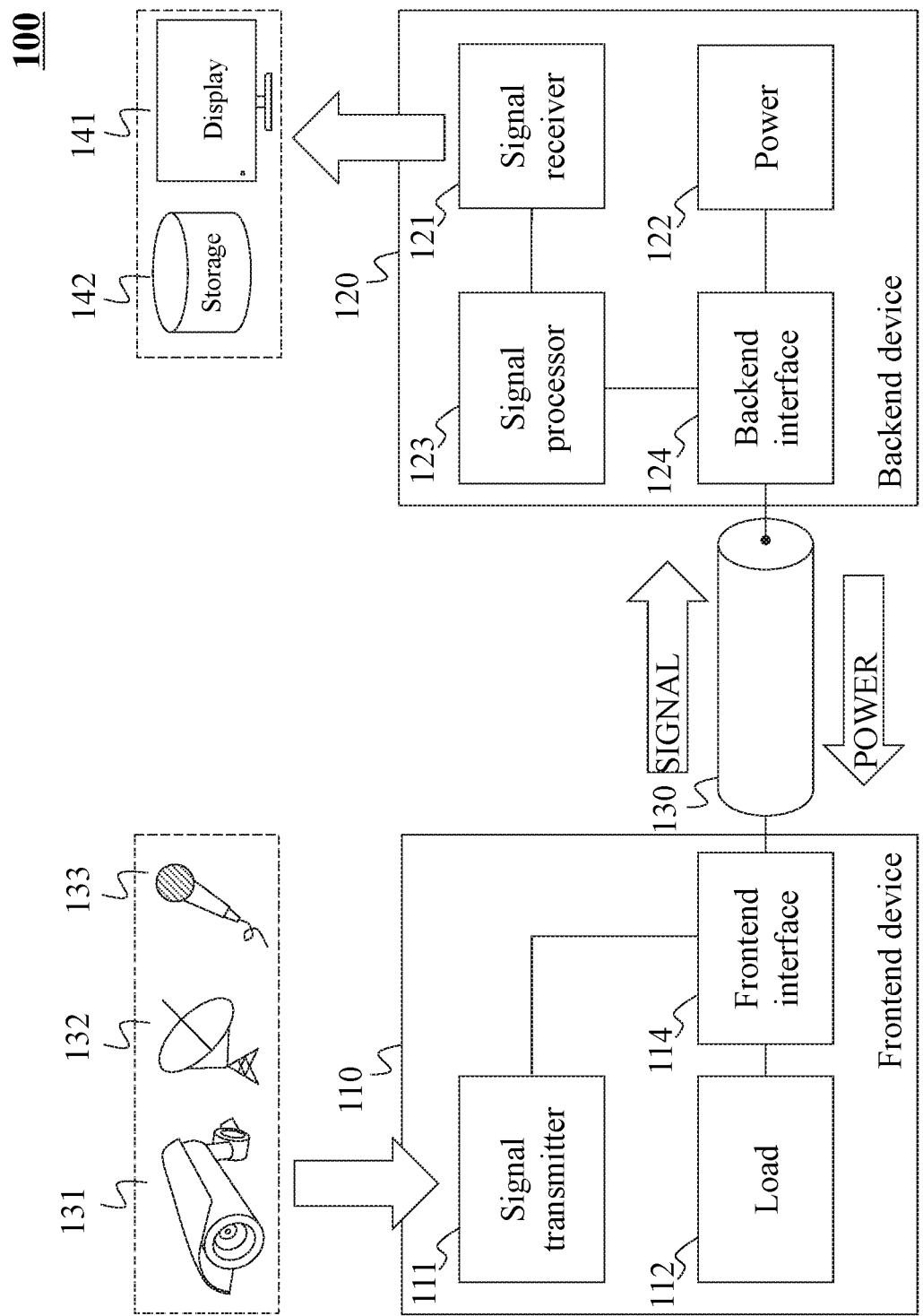
FIG. 1 is a schematic diagram illustrating a system for performing a mixed transmission of signals and power supply through a single cable between a backend device and a frontend device according to some embodiments of the present disclosure.

The present disclosure is directed to a system for mixed transmission of analog signals and power supply through a single cable between a backend device and a frontend device (or be referred to as a MTSP system for simplicity). The MTSP system may dynamically process an analog signal transmitted by the frontend device in response to a real-time detection of a step-change of the transmitted signal. The backend device of the MTSP system may also determine whether the frontend device plugged into the backend device support the mixed transmission of signals and power supply (or be referred to as a MTSP transmission), and determine whether to provide power supply to the frontend device accordingly. The MTSP system may also support a simultaneous transmission of a reverse control signal from the backend device to the frontend device through the same cable.

In the following detailed description, numerous specific details are set forth by way of examples in order to provide a thorough understanding of the relevant disclosure. However, it should be apparent to those skilled in the art that the present disclosure may be practiced without such details. In other instances, well known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that the term "system," "unit," "module," and/or "block" used herein are one method to distinguish different components, elements, parts, section or assembly of different level in ascending order. However, the terms may be displaced by another expression if they achieve the same purpose.

It will be understood that when a unit, engine, module or block is referred to as being "on", "connected to", or "coupled to", another unit, engine, module, or block, it may be on, connected or coupled to, or communicate with the other unit, engine, module, or block, or an intervening unit, engine, module, or block may be present, unless the context clearly indicates otherwise.

The modules (or units, blocks, units) described in the present disclosure may be implemented as hardware modules and/or circuits. The modules or computing device functionality described herein are preferably implemented as hardware modules and/or circuits, but can be software modules as well. In general, the modules described herein refer to logical modules that can be combined with other modules or divided into units despite their physical organization.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure.

FIG. 1 is a schematic diagram illustrating a system for performing a mixed transmission of signals and power supply through a single cable between a backend device and a frontend device according to some embodiments of the present disclosure. MTSP system 100 may be a system for performing a mixed transmission of signals and power supply (MTSP transmission) between a backend device 120 and a frontend device 110 through a cable 130. The frontend device 110 may generate or transmit an analog signal to the backend device 120 through the cable 130. The analog signal may be a video signal, an audio signal, or the like, or a combination thereof. The backend device 120 may receive the analog signal while providing power supply to the frontend device 110 through the same cable 130. The analog signal and the power supply may be transmitted through the cable 130 in opposite direction.

The frontend device 110 may generate an analog signal and transmit the generated signal to the backend device 120 through the cable 130. The frontend device 110 may also receive a signal, convert the received into an analog signal (optional), and transmit the received signal or the converted signal to the backend device 120 through the cable 130. In some embodiments, the frontend device 110 may be or may include a camera 131, a microphone 133, an antenna 132, or the like, or a combination thereof, for generating or receiving a signal. Alternatively or additionally, the frontend device 110 may include a port for plugged in a camera 131, a microphone 133, an antenna 132, or the like, or a combination thereof. In some embodiments, the frontend device may be, or include, or connect with a camera 131 (e.g., a surveillance camera, an in-vehicle camera, a robotic camera). The camera 131 may be zoomed, focused, or rotated. Additionally or alternatively, the camera 131 may also include one or more infrared lights for working in a low-light environment.

In some embodiment, the frontend device 110 may support the MTSP transmission, and the frontend device 110 may also receive power supply from the backend device 120 through the cable 130. The frontend device 110 illustrated in FIG. 1 is a frontend device supporting the MTSP transmission.

Alternatively or additionally, the frontend device 110 may receive a reverse control signal from the backend device 120 and perform a corresponding operation. For example, the frontend device 110 may include a camera (e.g., the camera 131). Upon receiving a reverse control signal corresponding to a camera zoom operation, the frontend device 110 may cause the camera to be zoomed according to the received reverse control signal. Upon receiving a reverse control signal corresponding to an infrared light turning-on operation, the frontend device 110 may cause one or more lights included in the camera to be turned on.

The frontend device may include a signal transmitter 111, a frontend interface 114. All the electric components of the frontend device 110 powered by the backend device 120 may be represented by a load 112. The load 112 may also include the electric components of the signal transmitter 111 and the frontend interface 114 powered by the backend device 120. For example, the voltage supply and/or the current supply of the signal transmitter 111 and the frontend interface 114 powered by the backend device 120 may be included in the load 112. The load 112 and any other load described in the present disclosure may also be viewed as the receiver and executor of the reverse control signal transmitted by the backend device 120 or an embodiment thereof.

For simplicity and demonstration purposes, the load 112 and any other load of an embodiment of the frontend device 110 may be illustrated and described as a single module in FIG. 1 and any other FIGs of the present disclosure. The connection relationship between the signal transmitter 111 and the load 112 (if any) is also omitted.

The signal transmitter 111 may transmit an analog signal (e.g., a video signal, an audio signal). The analog signal may be generated by the frontend device 110 itself (e.g., the camera 131 included in the frontend device), received by the frontend device 110 from a signal source, and/or converted (e.g., through a D/A convertor) from a signal received from a signal source. For demonstration purposes, the present disclosure is described herein by way of example with reference to MTSP systems transmitting analog video signals. However, it is understood that the principle of the present disclosure may be applied to MTSP system transmitting analog signals for other use.

The frontend interface 114 may include a power-out terminal, a signal-in terminal, and a frontend cable terminal. The signal-in terminal may receive an analog signal transmitted by the video signal transmitter 111. The frontend cable terminal may receive power supply transmitted from the coaxial cable 130 and transmit the video signal to the coaxial cable 130. The power-out terminal may transmit the power supply to the load 112.

In some embodiments, the frontend interface 114 may further include a signal blocking module and a power supply blocking module. The signal blocking module may block the analog signal transmitted by the signal transmitter 111 while allow a pass of the power supply provided by the backend device 120, preventing a signal attenuation caused by the load 112 receiving the analog signal. The signal blocking module may also block the reverse control signal transmitted by the backend device 120 or a superposed signal (e.g., a second superposed signal) formed at least by the reverse control signal and the analog signal. Exemplary signal blocking modules are described in connection with FIGS. 28, 40, and 43. The power supply blocking module (e.g., a capacitor or a high-pass circuit) may block power supply (e.g., DC current) provided by the backend device 120 while allow a pass of the analog signal transmitted by the signal transmitter 111. The power supply blocking module may also allow a pass of the second superposed signal.

In some embodiments, the frontend interface may further obtain the reverse control signal from the second superposed signal and transmit the reverse control signal to the load 112. Detailed descriptions of the reverse control signal acquisition is provided elsewhere in the present disclosure (e.g., in connection with FIGS. 40 to 42)

In some embodiment, the frontend interface 114 may also facilitate the backend device 120 identifying whether the frontend device 110 supports the MTSP transmission. Alternatively or additionally, the frontend interface 114 may increase the discharge speed of the frontend device 110.

The backend device 110 may receive the analog signal transmitted by the frontend device 110 through the cable 130. The backend device 110 may also provide power supply to the frontend device 110 through the cable 130. The backend device 110 may display the received analog signal and/or store the received analog signal. For example, the backend device may include, be connected with, or communicate with a display 141 and/or a storage device 142 for displaying and/or storing the received analog signal. The displaying and/or the storing may involve an A/D conversion, a signal encoding, a signal decoding, or the like, or a combination thereof. For example, the backend device 110 may convert the received analog signal into data that can be stored and/or displayed and then transmit the data to the storage device 142 and/or display 141. The backend device 110 may transmit the data through one or more cables. In some embodiments, the backend device 110 may transmit the data wirelessly.

In some embodiments, the backend device 110 may dynamically process an analog signal transmitted by the frontend device. The backend device 110 may dynamically process the analog signal in response to a real-time detection of a step-change of the analog signal. The analog signal may be viewed as formed by a plurality of sub-signals of different frequency bands. The sub-signals may be mixed or superposed to form the analog signal. The frequency bands may have arbitrary frequency ranges and may be arbitrary determined based on the full frequency range of the analog signal. As a sub-signal of a lower frequency band (e.g., lower than 25 Hz) may be affected more by the analog signal, a sub-signal of a lower frequency band (e.g., a first sub-signal of a first frequency band) may be obtained for the real-time detection of the step change. When a step change is detected or determined, the backend device 110 may remove a sub-signal affected more by the step change (e.g., a second sub-signal of a second frequency band) from the analog signal to obtain a filtered signal. Detailed descriptions of the dynamical signal processing and the real-time signal step-change detection are provided elsewhere (e.g., in connection with FIGS. 4 to 23) in the present disclosure.

In some embodiments, to avoid providing power supply to a frontend device which doesn't support the MTSP transmission causing the frontend device or the backend device 110 to be burned out, the frontend device 110 may determine whether the frontend device plug-in supports the MTSP transmission and only provide power supply to a frontend device that supports the MTSP transmission. However, a frontend device that doesn't support the MTSP transmission may still be able to transmit a signal to the backend device 110. Detailed descriptions may be found elsewhere in the present disclosure (e.g., in connection with FIGS. 24 to 26).

In some embodiments, the backend device 110 may also transmit a reverse control signal to the frontend device 110 causing the frontend device 110 to perform a corresponding operation.

The backend device 110 may include a signal receiver 121, a signal processor 123, a power 122, and a backend interface 124.

The power 122 may provide power supply (electric current). The power 122 may power the backend device 120 and/or the frontend device 110 (through the cable 130). The power 122 may be an adapter or transformer coupled to an electric socket, one or more batteries (e.g., on-vehicle batteries), and/or one or more solar panels. For simplicity, the connection relationship between the power 122 and other modules in the backend device 120 is omitted in FIG. 1.

The backend interface 124 may include a signal-out terminal, a power-in terminal and a backend cable terminal. The power-in terminal may receive power supply transmitted by the power 122. The backend cable terminal may receive an analog signal transmitted from the cable 130 and transmit the power supply to the cable 130. The signal-out terminal may transmit the analog signal to the signal processor 123. In some embodiments, the backend cable terminal may be or may include a port for plugging in the frontend device 110 through the cable 130.

In some embodiments, the backend interface 124 may further include a signal blocking module (e.g., a circuit or circuits) and a power supply blocking module (e.g., a circuit or circuits). The signal blocking module may block the analog signal transmitted by the frontend device 110 while allow a pass of the power supply provided by the power 122, preventing a signal attenuation caused by the power 122 receiving the analog signal. The signal blocking module may also block a reverse control signal transmitted by the signal receiver 121 or a superposed signal (e.g., a second superposed signal) formed at least by the reverse control signal and the analog signal. Exemplary signal blocking modules are described in connection with FIGS. 28, 40, and 43. The power supply blocking module (e.g., a circuit or circuits) (e.g., a capacitor or a high-pass circuit) may block power supply (e.g., DC current) provided by the power 122 while allow a pass of the analog signal transmitted by the frontend device 110. The power supply blocking module may also allow a pass of the second superposed signal.

In some embodiment, the backend interface 124 may also identify whether the frontend device 110 supports the MTSP transmission. Alternatively or additionally, the frontend interface 114 may also include a safety module (e.g., a circuit or circuits) to cut-off the power supply provided by the backend device 120 when an overcurrent occurs and/or when the frontend device 110 is unplugged from the backend device 120. Detailed description of the safety module is provided elsewhere in the present disclosure (e.g., in connection with FIGS. 35 and 36).

The signal processor 123 may receive the analog signal transmitted from the backend interface 124. The signal processor 123 may dynamically process the transmitted analog signal in response to a real-time detection of a step-change of the transmitted signal according to some embodiments of the present disclosure. The signal processor 123 may dynamically process the analog signal in a manner as described in connection with FIGS. 4 to 23 and generate a filtered signal. Alternatively or additionally, the signal processor 123 may compensate for signal loss or signal attenuation of the analog signal or the filtered signal, and generate a compensated signal. Both the filtered signal and the compensated signal may be referred to as a processed signal In some embodiments, the signal processor 123 may also receive a reverse control signal transmitted by the signal receiver 121 or a superposed signal (e.g., a first superposed signal) formed at least by the processed signal and the reverse control signal. The signal processor 123 may obtain the reverse control signal from the first superposed signal and superpose the reverse control signal on the analog signal transmitted from the backend interface 124 to generate the second superposed signal. The second superposed signal and the power supply may be transmitted in a mixed manner. Detailed descriptions of the superposition of the reverse control signal are provided elsewhere in the present disclosure (e.g., in connection with FIGS. 32 and 33).

The signal receiver 121 may receive the processed signal transmitted by the signal processor 123. The signal receiver 121 may also transmit a reverse control signal to the signal processor 123 through a same cable or a same electric path for transmitting the processed signal.

The cable 130 may form an electric path between the frontend device 110 and the backend device 120. In some embodiments of the present disclosure, the cable 130 may be a coaxial cable. A MTSP system using a coaxial cable for MTSP transmission may also be referred to as a power over coax (POC) system, and the related transmission technique may also be referred to as POC transmission techniques. For demonstration purposes, the present disclosure is described herein by way of example with reference to POC systems transmitting analog video signal. However, it is understood that the principle of the present disclosure may be applied to POC system transmitting analog signals for other use, and/or MTSP system using other using any other proper electric cable capable of forming a single electric path between the frontend device 110 and the backend device 120.

In some embodiments, the backend device 120/or the frontend device 110 may be a standalone device. For example, the signal processor 123, the signal receiver 121, the backend interface 124 and the power 122 may be circuits and electric components of the standalone device and may not be separated by a non-professional user. In some embodiments, the backend device 120/or the frontend device 110 may be a plurality of standalone devices connected by cables (e.g., coaxial cables). For example, one or more of the signal processor 123, the signal receiver 121, the backend interface 124 and the power 122 may be standalone devices, and the cables for connecting them may be easily plugged or unplugged.

It may be noticed that, the above description about the MTSP system 100 is only for illustration purposes, and is not intended to limit the present disclosure. It is understandable that, after learning the major concept and the mechanism of the present disclosure, a person of ordinary skill in the art may alter the MTSP system 100 in an uncreative manner. The alteration may include combining and/or splitting modules or units, adding or removing optional modules or units, etc. All such modifications are within the protection scope of the present disclosure. It may also be understood that, the connection relationship between the modules and/or units of the MTSP system 100 are also only for demonstration purposes and not intended to be limiting, and may be varied accordingly when modules or units of the backend device 2400 are combined or split, and/or when optional modules or units are added or removed.

Figure 2:
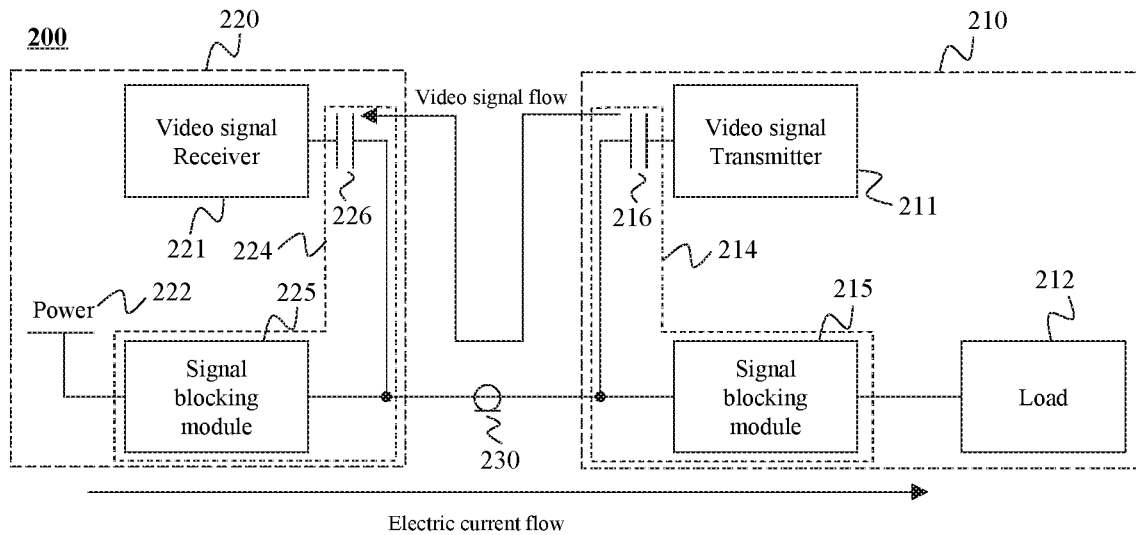
FIGS. 2 and 3 are schematic diagrams illustrating analog video signal transmission systems using power over coax transmission techniques.
Figure 3:
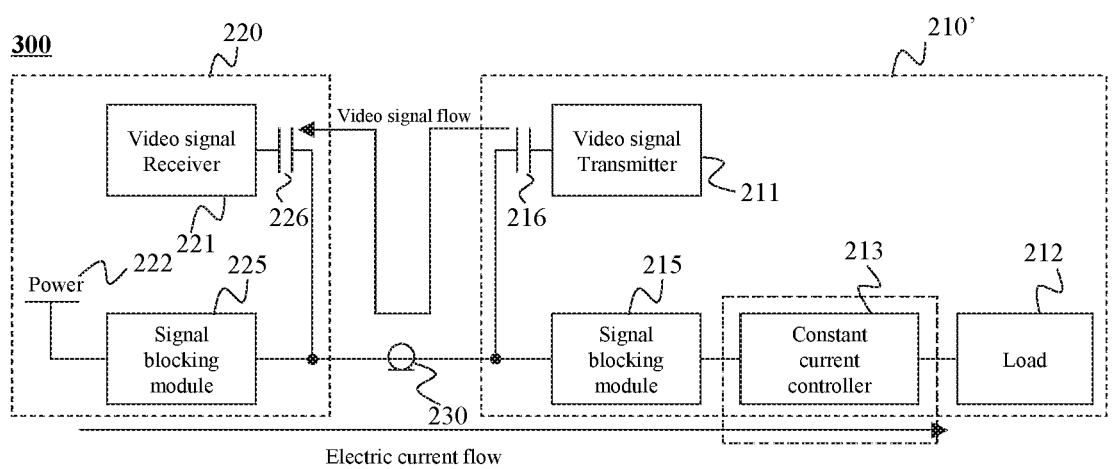

FIGS. 2 and 3 are schematic diagrams illustrating analog signal (e.g., analog video signal) transmission systems using power over coax (POC) transmission techniques. A POC technique may support a mixed transmission of power supply (DC current) and analog signals between a backend device and a frontend device through a coaxial cable, so that the installation and arrangement of the backend device, the frontend device, and the cable (the coaxial cable) connecting therewith may be simplified.

FIG. 2 illustrating a POC system 200. The POC system 200 may include a backend device 220 and a frontend device 210. As shown in FIG. 2, the backend device 220 may provide power supply to the frontend device 210 using the POC technique thorough a coaxial cable 230, wherein a video signal transmitter 211 of a frontend device 210 may provide or transmit a video signal to a video signal receiver 221 of a backend device 220 coaxially (through the coaxial cable 230) in a forward direction (video signal flow), and a power 222 of the backend device 220 may provide power supply (electric current) to a load 212 of the frontend device 210 coaxially in a reverse direction (electric current flow).

The backend device 220 may include a backend interface 224, and the frontend device 210 may include a frontend interface 214. The backend interface 224 may receive the power supply from the power 222, receive the video signal from the coaxial cable 230, separate the video signal from the power supply, transmit the video signal to the video signal receiver 220, and transmit the power supply to the coaxial cable 230. The frontend interface 214 may receive the power supply from the coaxial cable 230, receive the video signal from the video signal transmitter, separate the video signal from the power supply, transmit the video signal to the coaxial cable 230, and transmit the power supply to the load 212 (including the video transmitter 211).

The backend interface 224 may include a signal blocking module (e.g., a circuit or circuits) 225 and a capacitor 226. The frontend interface 214 may include a signal blocking module (e.g., a circuit or circuits) 215 and a capacitor 216. The signal blocking modules 225 and 215 may block the video signal transmitted through the coaxial cable 430 while allow the pass of the power supply (e.g., DC current). The capacitors 226 and 216 may block the power supply while allow the pass of the video signal.

When the power of the load 212 changes (for example, one or more infrared lights of the camera 131 are turned on, the camera 131 zooms, etc.), the voltages across the capacitors 226 and 216 may also change. As a result, the video signal passing through the capacitors 226 and 216 may have a step change. A voltage of the capacity 226 at the video signal receiver 221 side and a voltage of the capacity 216 at the video signal transmitter 211 side may need a long time to return to their original voltages. During the voltage recovery process, the video signal may be in the step-change state all the time. Consequently, the video signal may be entirely abnormal and the video receiver 221 may not receive the abnormal video signal. As a result, a blank screen may occur during the displaying (e.g., by the display 141) of the video signal received by the video signal receiver 220. As a sub-signal of the video signal with a lower frequency may need a longer period to return to normal, their step-change state may also have a longer duration time after the interference of the power change of the load 212, resulting in a long-time blank screen that reducing the watching experience of a user.

In order to solve this problem, the most commonly used method is to add a constant current controller into the POC system 200 to form a POC system 300 as illustrated in FIG. 3. The POC system 300 may include a frontend device 210' instead of the frontend device 210. Compared to the frontend device 210, the frontend device 210' may further include a constant current controller 213 connecting with the signal blocking module 215 and the load 212. As shown in FIG. 3, the constant current controller may ensure that the total load power is constant for the backend device 220 when the load power of the load 212 changes. That is, the sum of power consumptions of the load 212 and the constant current controller 213 is invariant. In order to fulfill the need, the constant current control 213 may consume additional power. For example, when a load power of the load 212 is 2 watts, the constant current control 213 may have a power consumption of 3 watts and a total load power of 5 watts may be presented for the backend device 220; when the load power of the load 212 changes from 2 watts to 4 watts, the power consumption of the constant current control 213 may changes from 3 watts to 1 watt, so that a total power consumption (5 watts) may remain unchanged. That is, the total power consumption for the backend device 220, a current between the signal blocking modules 225 and 215, and a voltage across the capacitors 226 and 216, may remain unchanged. As a result, the generation of abnormal signals may be suppressed, and a long-time blank screen problem caused by the displaying (e.g., by the display 141) of video signal including abnormal signals may be solved.

However, the constant current control technique may cause an additional power consumption of the constant current controller 213 and an increase of the total heat generated by the POC system 300. The higher the additional power consumption, the more the heat generated. Additional heat sinks and other auxiliary devices may be required for the dissipation of the additional heat.

For addressing the blank screen problem as well as reducing the power consumption (and/or the heat generation) of the whole power-supply system, embodiments of the MTSP system 100 are described in detail as following. The embodiments of the MTSP system 100 may not include the constant current controller 213 for reducing the influence of the step change of the signal.

Figure 4:
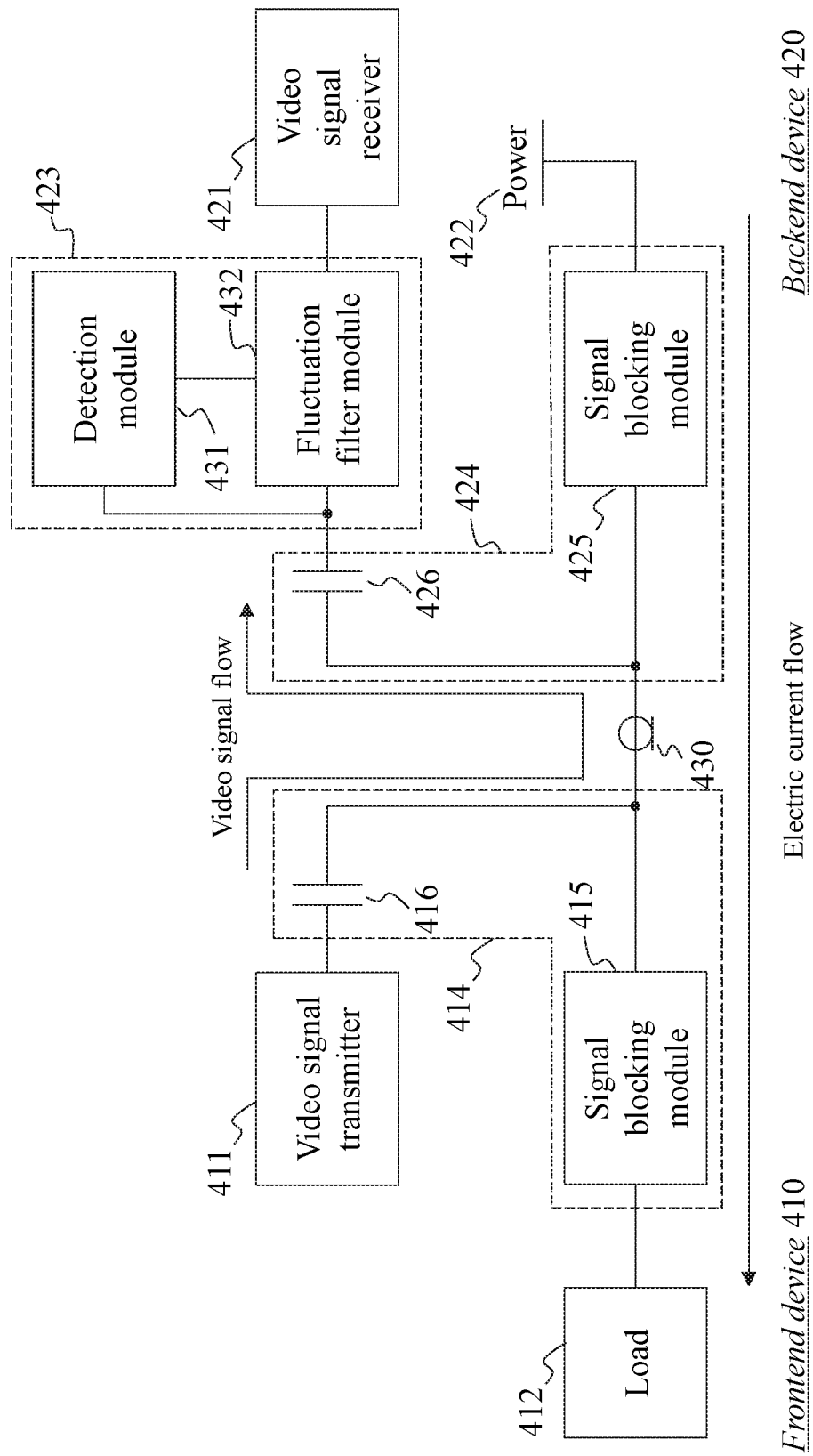
FIGS. 4 and 5 are schematic diagrams illustrating exemplary POC systems according to some embodiments of the present disclosure.

FIG. 4 is a schematic diagram illustrating an exemplary POC system according to some embodiments of the present disclosure. POC system 400 may be an exemplary embodiment of the MTSP system 100 (e.g., illustrated in FIG. 1). The POC system 400 may allow a mixed transmission of power supply (electric current) and analog video signals between a backend device 420 and a frontend device 410 through a coaxial cable 430. The backend device 420 may include a video signal receiver 421, a power 422, a video signal processor 423, and a backend interface 424. The frontend device 410 may include a video signal transmitter 411 and a frontend interface 414. All the electric components powered by the backend device 420 may be represented by a load 412. The frontend device 410, the backend device 420, the coaxial cable 430, the video signal transmitter 411, the frontend interface 414, the video signal receiver 421, the power 422, the video signal processor 423, and the backend interface 424 may be exemplary embodiments of the frontend device 110, the backend device 120, the coaxial cable 130, the video signal transmitter 111, the frontend interface 114, the signal receiver 121, the power 122, the signal processor 123, and the backend interface 124, respectively, the descriptions of which are not repeated here.

The backend interface 424 may include a power-in terminal, a signal-out terminal, and a backend cable terminal. The power terminal may be couple to the power 422 and may be used to receive power supply (e.g., a DC current) from the power 422. The cable terminal may be coupled to the coaxial cable 430. The backend cable terminal may be used to receive a video signal from the coaxial cable 430 and transmit the power supply to the coaxial cable 430. The signal-out terminal may be coupled to an input terminal of the video signal processor 423 and may be used to transmit the video signal to the signal processor 423.

The frontend interface 414 may include a power-out terminal, a signal-in terminal, and a frontend cable terminal. The signal-in terminal may be coupled to the video signal transmitter 411 and may receive a video signal from the video signal transmitter 411. The frontend cable terminal may be coupled to the coaxial cable 430. The frontend cable terminal may receive power supply from the coaxial cable 430 and transmit the video signal to the coaxial cable 430. The power-out terminal may be couple to the load 412 and may transmit the power supply to the load 412.

In some embodiments, the backend interface 424 may include a signal blocking module (e.g., a circuit or circuits) 425 and a capacitor 426. A first terminal of the signal blocking module 425, which may be viewed as the power-in terminal of the backend interface 424, may be coupled to the power 422. A second terminal of the signal blocking module (e.g., a circuit or circuits) 415, which may be viewed as the backend cable terminal of the backend interface 424, may be coupled to a first terminal of the capacitor 426. A second terminal of the capacitor 426, which may be viewed as the signal-out terminal of the backend interface 424, may be coupled to the input terminal of the video signal processor 423.

In some embodiments, the frontend interface 414 may include a signal blocking module 415 and a capacitor 416. A first terminal of the signal blocking module 415, which may be viewed as the power-out terminal of the frontend interface 414, may be coupled to the load 412. A second terminal of the signal blocking module 415, which may be viewed as the frontend cable terminal of the frontend interface 414, may be coupled to a first terminal of the capacitor 416. A second terminal of the capacitor 416, which may be viewed as the signal-in terminal of the frontend interface 414, may be coupled to the video signal transmitter 411.

The signal blocking modules 425 and 415 may block the video signal transmitted through the coaxial cable 430 while allow the pass of the power supply (e.g., DC current), preventing the attenuation of the video signal (outputted by the video signal transmitter 411) caused by a voltage of the power supply provided by the power 422 and/or a voltage across the load 412. In some embodiments, the signal blocking modules 425 and 415 may also reduce the attenuation of the power supply provided by the power 422 during its transmission. The capacitors 426 and 416 may block the power supply while allow the pass of the video signal.

It may be noted that, the backend interface 424 and the frontend interface 414 may include one or more additional functional modules. The capacitors 426 and 416 may be replaced by any other power supply blocking modules (e.g., a high-pass circuit). It may also be understood that, the connection relationship between the modules and/or units of the POC system 400 are also only for demonstration purposes and not intended to be limiting, and may be varied accordingly when modules or units of the POC system 400 are combined or split, and/or when optional modules or units are added or removed.

As shown in FIG. 4, the video signal processor 423 may be coupled to the video signal receiver 421 and the backend interface 424 (e.g. the capacitor 426). The video signal processor 423 may include a detection module (e.g., a circuit or circuits) 431 and a fluctuation filter module 431. The video signal processor 423 is an exemplary embodiment of the video signal processor 123, which is only for demonstration purposes and not intended to be limiting.

An input terminal of the detection module 431, which may be viewed as an input terminal of the video signal processor 423, may be coupled to the signal-out terminal of the backend interface 424 (e.g. the second terminal of the capacitor 426). An output terminal of the detection module 431 may be coupled to a first input terminal of the fluctuation filter module (e.g., a circuit or circuits) 432. The detection module 431 may be configured to receive an input video signal and detect a voltage (or amplitude) of a first sub-signal of a first frequency band of the input video signal. When the detected voltage is out of a first preset voltage range, the detection module 431 may generate a first control signal and transmit the first control signal to the fluctuation filter module 431.

The second input terminal of the fluctuation filtering module 432, which may also be viewed as the input terminal of the video signal processor 423, may be coupled to the signal-out terminal of the backend interface 424 (e.g. the second terminal of the capacitor 426) and the input terminal of the detection module 431. An output terminal of the fluctuation filtering module 432 may be coupled to the video signal receiver 421. The fluctuation filtering module 432 may be configured to receive an input video signal and remove (e.g., by filtering) a second sub-signal of a second frequency band of the input video signal upon receiving the first control signal transmitted by the detection module 431. The fluctuation filter module 432 may then transmit a video signal obtained by removing the second sub-signal from the input video signal (may also be referred as a filtered video signal) to the video signal receiver 421. The first frequency band and the second frequency band may be the same or different.

In some embodiments, the fluctuation filter module 432 may further perform a compensation for signal attenuation or signal loss on the filtered video signal. Alternatively, the compensation may be skipped or omitted.

The detection module 431 may be configured to detect whether the input video signal is abnormal, and transmit the first control signal to the fluctuation filter module 432 when the video signal is abnormal. During this process, the detection module 431 may detect whether the voltage of the first sub-signal is in a first preset voltage range. When the voltage is within the first preset voltage range, the first control signal may be transmitted. For example, when the voltage across the capacitor 226 changes, the input video signal may have a step change. As the step change may have a larger interference to sub-signals of a lower frequency band, the detection module 431 may detect a voltage (or amplitude) of a sub-signal of a lower frequency band (first frequency band). In some embodiments, the lower frequency band may be a frequency band lower than 20 Hz, 23 Hz, 25 Hz, 28 Hz, 30 Hz, etc. When the voltage is out of the first preset voltage range, the detection module 431 may determine that the input video signal is abnormal and then transmit the first control signal to the fluctuation filter module 432.

Upon receiving the first control signal transmitted by the detection module 431, the fluctuation filter module 432 may remove the second sub-signal of the video signal from the video signal. The first frequency band and the second frequency band may be the same or different. As the step change may have a larger interference to sub-signals of a lower frequency band, for detecting (or determining) whether the video signal is abnormal, the first video signal detected by the detection module 431 may be a sub-signal of a lower frequency band. For removing the sub-signal affected by the step change, the second sub-signal removed by the fluctuation filter module 432 may also be a sub-signal of a lower frequency band. In some embodiments, the first frequency band may be included in the second frequency band.

For example, the first frequency band may be the same as the second frequency band. When the voltage of the first sub-signal is out of the first preset voltage range, the video signal may be determined as abnormal, and the sub-signal of the first frequency band (including the first sub-signal) of the video signal may be determined as abnormal. As the first frequency band is the same as the second frequency band, the second sub-signal removed by the fluctuation filter module 432 is the determined abnormal signal. The video signal obtained by removing the abnormal sub-signal (filtered video signal) may be transmitted to the video signal receiver 421 and be displayed by the display 141, ensuring that there is no long-time blank screen during the display 141 displaying the video signals received by the video signal receiver 421. In other words, when it is detected that (by the detection module 423) a voltage of a first sub-signal is out of the first preset voltage range, the sub-signal of the first frequency band (including the first sub-signal) may be removed (by the fluctuation filter module 432). It is understood that, when the sub-signal of the first frequency band is removed, sub-signals of another frequency band (e.g., an adjacent frequency band) may also be removed as well (the second frequency band may include the first frequency band and the another frequency band).

In some embodiments, when the voltage of the first sub-signal is within the first preset voltage range, the detection module 423 may generate a second control signal and transmit the second control signal to the fluctuation filter module 431. Upon receiving the second control signal, the fluctuation filter module 431 may transmit the video signal to the video signal receiver 421 without removing sub-signals of the second frequency band.

It may be noted that, the video signal processor 423 and its embodiments may be implemented in signal processing systems and signal transmission systems other than the POC system 400 (or an embodiment thereof) for dynamically processing the video signal (or analog signal for other use) in response to a real-time detected step change of the signal or any other signal abnormal phenomenon. The first frequency band and the second frequency band may also be high frequency bands and/or medium frequency bands based on the nature of the abnormal signal. The first preset voltage range may also be set accordingly.

In the embodiment illustrated in FIG. 4, the POC system 400 may include a detection module 431 for receiving an input video signal and detecting a voltage of a first sub-signal of the input video signal. If the voltage detected (or determined) is out of a first preset voltage range, a first control signal may be transmitted (by the detection module 431) to the fluctuation filter module 432. Upon receiving the first control signal, the fluctuation module 432 may remove a second sub-signal of the input video signal, and transmit the video signal obtained by removing the sub-signal of the second frequency band (filtered video signal) to the video signal receiver 421. Sequentially, when the voltage across the capacitor 426 changes during the transmission of a video signal, a step change of the video signal may be caused and a voltage of a first sub-signal of the video signal may be out of the first preset voltage range. The fluctuation filter module 432 may remove a second sub-signal of the second frequency band of the video signal. As a result, a long-time blank screen problem occurred when the video signal is abnormal caused by a signal mixing between the second sub-signal and abnormal signals (caused by the step change) may be solved without adopting the constant-current control technique, so that problems related to an over-sized system and an increase of the hardware cost caused by the constant-current control technique may be avoided.

Figure 5:
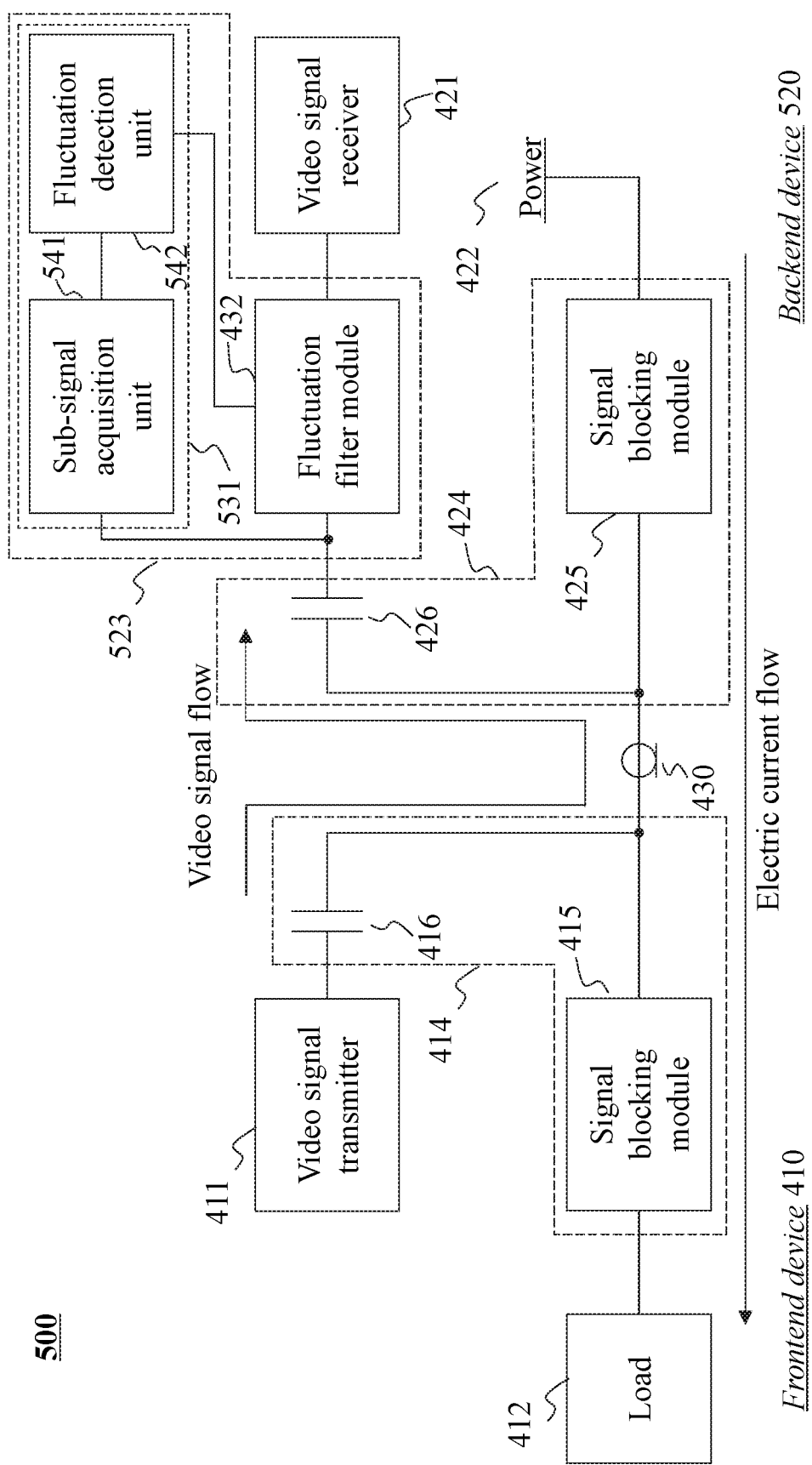

FIG. 5 is a schematic diagram illustrating an exemplary POC system according to some embodiments of the present disclosure. POC system 500 is an exemplary embodiment of the POC system 400 (e.g., illustrated in FIG. 4). Compared to the POC system 400, the POC system 500 may include a backend device 520, which is an exemplary embodiment of the backend device 420. The backend device 520 may include a video signal processor 523 implementing the video processor 423. Compared to the video signal 423, the video processor 523 may include a detection module (e.g., a circuit or circuits) 531, which is an exemplary embodiment of the detection module 431. As shown in FIG. 5, the detection module 531 may include a sub-signal acquisition unit 541 and a fluctuation detection unit 542.

An input terminal of the sub-signal acquisition unit 541, which may also be viewed as an input terminal of the detection module 531, may be coupled to the signal-out terminal of the backend interface 424 (e.g. the second terminal of the capacitor 426). An output terminal of the sub-signal acquisition unit 541 may be coupled to an input terminal of the fluctuation detection unit 542. The sub-signal acquisition unit 541 may be configured to receive an input video signal and obtain (or isolate) a first sub-signal of a first frequency band of the input video signal and transmit the first sub-signal to the fluctuation detection unit 542.

An output terminal of the fluctuation detection unit 542, which may be viewed as an output terminal of the detection module 531, may be coupled to the first input terminal of the fluctuation filter module 432. The fluctuation detection unit 542 may be configured to receive the first sub-signal transmitted by the sub-signal acquisition unit 541, detect (or determine) a voltage of the first sub-signal, and transmit a first control signal to the fluctuation filter module 432 when the detected voltage is out of a first preset voltage range. In some embodiments, the fluctuation detection unit 542 may transmit a second control signal to the fluctuation filter module 432 when the detected voltage is within the first preset voltage range.

As the step change has more influence on a sub-signal of a lower frequency band of a video signal, for detecting whether the video sub-signal is abnormal, the first sub-signal detected by the abnormal detection module 531 may be a sub-signal of a lower frequency band of the video signal. When the voltage of the first sub-signal is out of a first preset voltage range, a first control signal may be transmitted (by the abnormal detection module 531) to the fluctuation filter module 432. The abnormal detection module 531 may detect the voltage of the first sub-signal of the video signal directly. The abnormal detection module 531 may also obtain (or isolate) the first sub-signal, then detect the voltage of the obtained (or isolated) first sub-signal.

Figure 6:
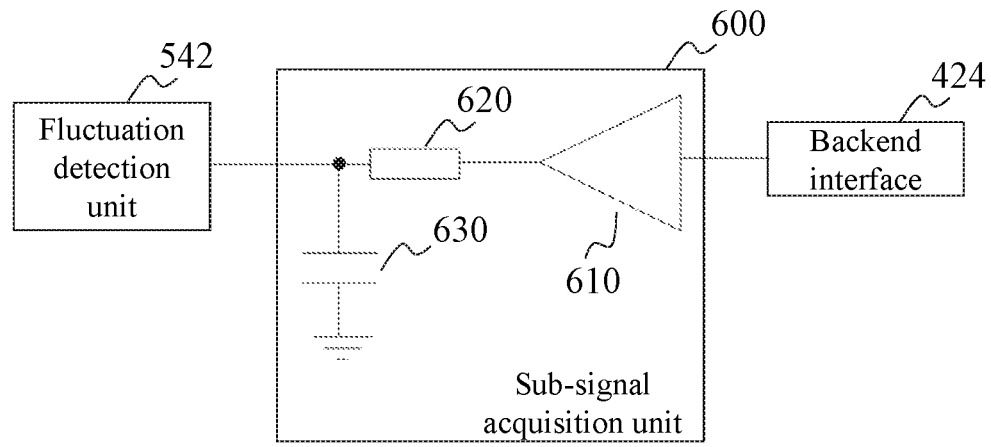
FIG. 6 is a schematic diagram illustrating an exemplary sub-signal acquisition unit according to some embodiments of the present disclosure.

FIG. 6 is a schematic diagram illustrating an exemplary sub-signal acquisition unit according to some embodiments of the present disclosure. Sub-signal acquisition unit 600 is an exemplary embodiment of the sub-signal acquisition unit 541 (e.g., illustrated in FIG. 5). The sub-signal acquisition unit 600 may be configured to receive an input video signal and obtain (or isolate) a first sub-signal of a first frequency band of the input video signal and transmit the first sub-signal to the fluctuation detection unit 542 or an embodiment thereof.

The sub-signal acquisition unit 600 may include a video signal drive 610, a resistor 620 and a capacitor 630. An input terminal of the video signal drive 610, which may be viewed as an input terminal of the sub-signal acquisition unit 600, may be coupled to the signal-out terminal of the backend interface 424 (e.g. the second terminal of the capacitor 426), and an output terminal of the video signal drive 610 may be coupled to a first terminal of the resistor 620. A second terminal of the resistor 620, which may be viewed as an output terminal of the sub-signal acquisition unit 600, may be coupled to a first terminal of the capacitor 630 and the input terminal of the fluctuation detection unit 542. A second terminal of the capacitor 630 may be coupled to ground.

The video signal drive 610 may be configured to perform an isolation of the received video signal (transmitted from the signal-out terminal of the backend interface 420) for further signal processing (e.g., filtering). During the isolation of the video signal, an isolated video signal same as or similar to the received video signal may be generated by the video signal drive 610. In some embodiments, the video signal drive 610 may further perform a preliminary filtering to the received video signal or the isolated video signal. Alternatively or additionally, the video signal drive 610 may further amplify the received video signal or the isolated video signal. By isolating the video signal, no matter whatever operation is performed on the isolated video signal, the received video signal (which may also be received by the fluctuation filter module 432) may not be affected. In some embodiments, the video signal drive 610 may be or include a buffer amplifier and/or an operational amplifier for isolating the video signal.

When a video signal is having a step change, the sub-signals of a lower frequency band (e.g., the first frequency band, the second frequency band) may be affected more by the step change, and a sub-signal of a lower frequency band (e.g., a first sub-signal or a plurality of sub-signals) of the video signal may be obtained by filtering for signal detection. The resistor 620 and the capacitor 630 may form a low-pass filter circuit, which may filter out the first sub-signal. The first sub-signal may be a sub-signal of a lower frequency band of the video signal. The low-pass filter circuit may be configured to filter out a sub-signal of a specific frequency band (the first frequency band). The specific frequency band may be decided by an electric resistance of the resistor 620 and a capacitance of the capacitor 630. The low-pass filter circuit is known in prior art, the descriptions of which are not repeated here. In some embodiments of the present disclosure, the sub-signal acquisition unit 600 may filter out a sub-signal of a lower frequency band. For example, the sub-signal acquisition unit 600 may filter out a sub-signal with a frequency lower than 25 Hz.

It may be noted that, the sub-signal acquisition unit 600 is only provided for demonstration purposes and is not intended to be limiting. For example, the low-pass filter included in the filter unit 600 may have other forms.

Figure 7:
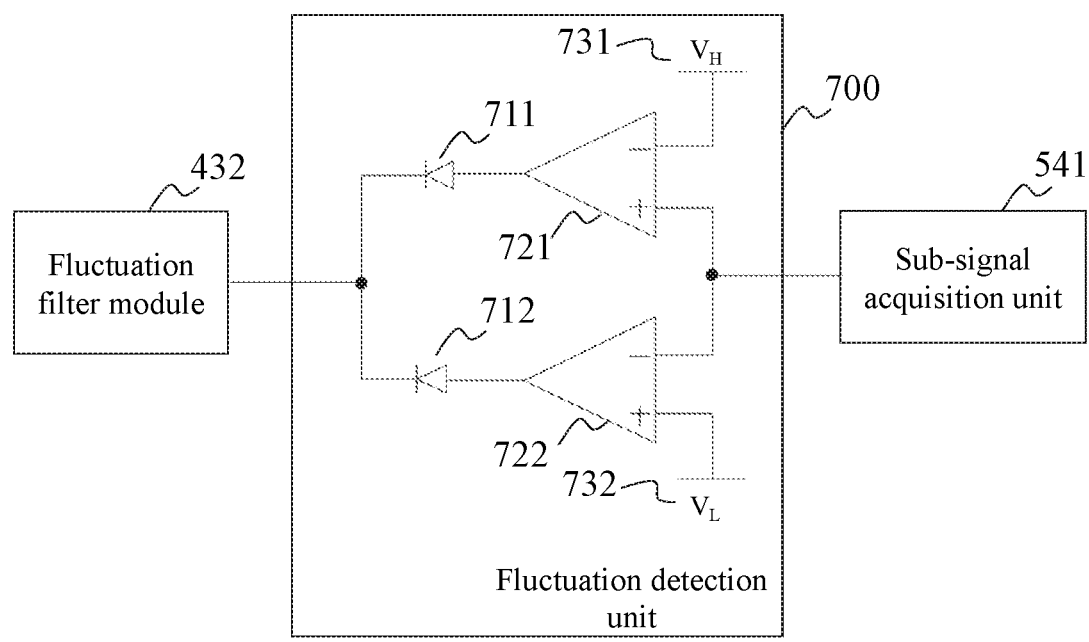
FIG. 7 is a schematic diagram illustrating an exemplary fluctuation detection unit according to some embodiments of the present disclosure.

FIG. 7 is a schematic diagram illustrating an exemplary fluctuation detection unit according to some embodiments of the present disclosure. The fluctuation detection unit 700 is an exemplary embodiment of the sub-signal acquisition unit 542 (e.g., illustrated in FIG. 5). The fluctuation detection unit 700 may be configured to receive the first sub-signal transmitted by the sub-signal acquisition unit 541 (or an embodiment thereof), detect (or determine) a voltage of the first sub-signal, and transmit a first control signal to the fluctuation filter module 432 (or an embodiment thereof) when the detected voltage is out of a first preset voltage range. In some embodiments, the fluctuation detection unit 700 may transmit a second control signal to the fluctuation filter module 432 when the detected voltage is within the first preset voltage range. It may be noted that, the fluctuation detection unit 700 is only provided for demonstration purposes and is not intended to be limiting.

The fluctuation detection unit 700 may include a comparator 721, a comparator 722, a diode 711 (e.g., a crystal diode), a diode 712, a voltage supply 731 and a voltage supply 732. An inverting input terminal of the comparator 721 may be coupled to the voltage supply 731. A non-inverting input terminal of the comparator 721, which may be viewed as an input terminal of the fluctuation detection unit 700, may be coupled to an inverting input terminal of the comparator 722 and an output terminal of the sub-signal acquisition unit 541. An output terminal of the comparator 721 may be coupled to an anode of the diode 711. A non-inverting input terminal of the comparator 722 may be coupled to the voltage supply 732. An output terminal of the comparator 722 may be coupled to an anode of the diode 712. A cathode of the diode 711, which may be viewed as an output terminal of the fluctuation detection unit 700, may be coupled to a cathode of the diode 712 and the first input terminal of the fluctuation filter module 432.

The fluctuation detection unit 700 may be configured to detect a voltage (or amplitude) of a first sub-signal of a video signal, and transmit a first control signal when the voltage detected is out of a first preset voltage range. A detailed description of the fluctuation sub-detection module 700 is described as following.

A signal (e.g., the first sub-signal) outputted by the sub-signal acquisition unit 541 may be input into the non-inverting input terminal of the comparator 721 and the inverting input terminal of the comparator 722, respectively. A voltage $V_H$ provided by the voltage supply 731 is higher than a voltage $V_L$ provided by the voltage supply 732. When a voltage of the signal outputted by the sub-signal acquisition unit 541 is higher than the voltage $V_H$, the comparator 721 may output a high-level signal while the comparator 722 may output a low-level signal. The diode 711 may be turned on, and the diode 712 may be turned off. Consequently, the output terminal of the fluctuation detection unit 700 may output a high-level signal (first control signal). When a voltage of the signal outputted by the sub-signal acquisition unit 541 is lower than the voltage $V_L$, the comparator 721 may output a low-level signal while the comparator 722 may output a high-level signal. The diode 711 may be turned off, and the diode 712 may be turned on. Consequently, the output terminal of the fluctuation detection unit 700 may output a high-level signal (first control signal). When a voltage of the signal outputted by the sub-signal acquisition unit 541 is higher than the voltage $V_L$ and lower than the voltage $V_H$, the comparator 721 may output a low-level signal while the comparator 722 may output a high-level signal. The diode 711 may be turned off, and the diode 712 may also be turned off. Consequently, the output terminal of the fluctuation detection unit 700 may output a low-level signal (second control signal).

According to the aforementioned description of the fluctuation detection unit 700, the voltage $V_H$ and the voltage $V_L$ may be set based on the first preset voltage range for checking the first sub-signal, so that whether the first sub-signal is within the first preset voltage range (voltage range) may be determined and a corresponding control signal (e.g., the first control signal, the second control signal) may be outputted by the fluctuation detection unit 700.

For ensuring that the removing of sub-signals of the second frequency band may not be performed when the received video signal is a normal video signal. The fluctuation filter module 432 may receive the second control signal transmitted by the fluctuation detection unit 700 when a voltage detected by the fluctuation detection unit 700 is within the first preset voltage range. The fluctuation filter module 432 may also be configured to transmit the video signal to the video signal receiver 421 (or 121) based on the second control signal. For example, when the voltage detected by the fluctuation detection unit 700 is within the first preset voltage range, the video signal may be considered or determined as normal. The fluctuation filter module 432 may transmit the received video signal to the video signal receiver 421 without performing a filtering (which may affect a quality of a normal video signal) upon receiving the second control signal, ensuring that a normal video signal may be received by the video signal receiver 421.

As described in the aforementioned examples, when a voltage of the signal outputted by the sub-signal acquisition unit 541 is higher than the voltage $V_L$ and lower than the voltage $V_H$, the comparator 721 may output a low-level signal while the comparator 722 may also output a high-level signal. Consequently, the diode 711 may be turned off, the diode 712 may also be turned off, causing a low-level signal outputted by the output terminal of the fluctuation detection unit 700. The fluctuation filter module 432 may transmit the video signal to the video signal receiver 421 (or 121) in response to the low-level signal, that is, the second control signal.

It may be noted that, the fluctuation detection unit 700 is only provided for demonstration purposes and is not intended to be limiting. The fluctuation detection unit 542 may be implemented by circuits of other forms as well. The fluctuation detection unit 700 includes two comparators, which may occupy a large area on a circuit board of the backend device 520 (or 420) and have a large power consumption. For addressing these problems, the present disclosure also provides other embodiments (or circuit designs) of the fluctuation detection unit 542, each of which may include only one comparator. Detailed descriptions of these embodiments are provided elsewhere in the present disclosure (e.g., in connection with FIGS. 8 to 17)

Figure 8:
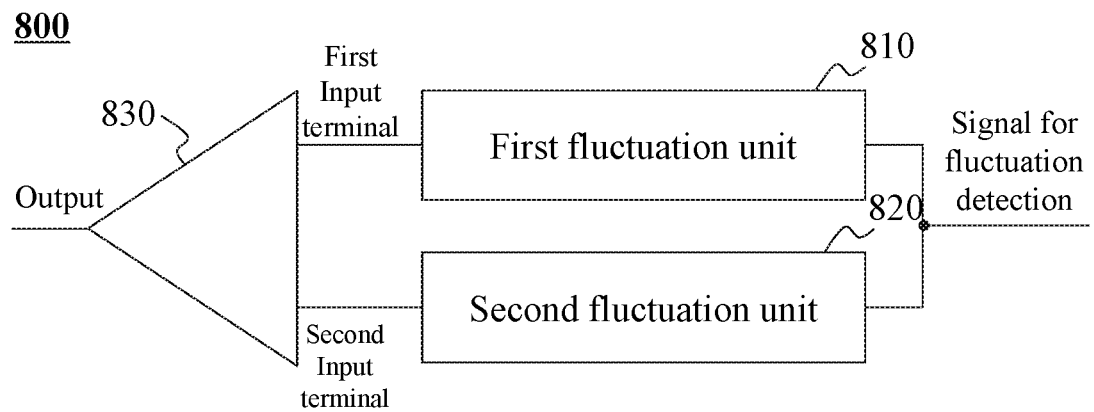
FIG. 8 is a schematic diagram illustrating an exemplary fluctuation detection unit according to some embodiments of the present disclosure.

FIG. 8 is a schematic diagram illustrating an exemplary fluctuation detection unit according to some embodiments of the present disclosure. Fluctuation detection unit 800 is an exemplary embodiment of the fluctuation detection unit 542 (e.g., illustrated in FIG. 5). The fluctuation detection unit 800 may include a comparator (or amplifier) and may be configured to detect (or determine) a voltage of the first sub-signal and transmit a first control signal to the fluctuation filter module 432 (or an embodiment thereof) when the detected voltage is out of a first preset voltage range. It may be noted that, the fluctuation detection unit 800 may also be implemented in signal transmission systems other than the POC system 500 (or an embodiment thereof) for detecting possible signal fluctuation.

The fluctuation detection unit 800 may include a comparator 830, a first fluctuation unit 810, and a second fluctuation unit 820. The fluctuation detection unit 800 may be configured to detect a fluctuation of a received signal (e.g., a first sub-signal). If the received signal is having a fluctuation out of an allowable voltage range (e.g., a detected voltage is out of a first preset voltage range), the fluctuation detection unit 800 may output a first control signal. Otherwise, the fluctuation detection unit 800 may output a second control signal in some embodiments of the present disclosure.

An input terminal of the first fluctuation unit 810 may be coupled to a signal source (e.g., the output terminal of the sub-signal acquisition unit 541) for receiving the signal (e.g., the first sub-signal) for fluctuation detection. An output terminal of the first fluctuation unit 810 may be coupled to a first input terminal of the comparator 830. The first fluctuation unit 810 may be configured to transmit a first output voltage to the comparator 830. When the received signal is having a first fluctuation, the first output voltage may be a sum of a first reference voltage and an amplitude (in the form of voltage) of the first fluctuation. Otherwise (e.g., the received signal is not having a first fluctuation), the first output voltage may be the first reference voltage. The first fluctuation may be in the form of a positive wave (e.g., a positive pulse).

An input terminal of the second fluctuation unit 820 may also be coupled to the signal source for receiving the signal for the fluctuation detection. An output terminal of the second fluctuation unit 820 may be coupled to a second input terminal of the comparator 830. The second fluctuation unit 820 may be configured to transmit a second output voltage to the comparator 830. When the received signal is having a second fluctuation, the second output voltage may be a difference between a second reference voltage and an amplitude (in the form of a voltage) of the second fluctuation. Otherwise (e.g., the received signal is not having a second fluctuation), the second output voltage may be the second reference voltage. The second fluctuation may be in the form of a negative wave (e.g., a negative pulse).

The input terminal of the first fluctuation unit 810 or the input terminal of the second fluctuation unit 820 may be viewed as an input terminal of the fluctuation detection unit 800, and the output terminal of the comparator 830 may be viewed as an output terminal of the fluctuation detection unit 800.

The second reference voltage may be larger than the first reference voltage. The first reference voltage or the second reference voltage may be the voltage outputted by the first fluctuation unit 810 or the second fluctuation unit 820 when the received signal is not having the first fluctuation or the second fluctuation.

As the present disclosure mainly focuses on POC systems or MTSP systems, the signal for the fluctuation detection may be referred to as "the first sub-signal", and the fluctuation detection unit 800 and embodiments thereof may also be described as being integrated into the embodiments of the POC system 500 for demonstration purposes. However, it is understood that the fluctuation detection unit 800 and embodiments thereof may also be implemented in signal transmission related systems other than embodiments of the POC system 500, and the signal for the fluctuation detection may be any designated signals.

The first input terminal and the second input terminal of the comparator 830 may be coupled to the output terminal of the first fluctuation unit 810 and the output terminal of the second fluctuation unit 820, respectively. The comparator 830 may output a comparison result (e.g., the first control signal or the second control signal) based on the first output voltage inputted from the first input terminal and the second output voltage inputted from the second input terminal. In some embodiments, the comparator 830, the first fluctuation unit 810, and the second fluctuation unit 820 may be configured so that: when the amplitude or voltage of the first sub-signal is out of the first preset voltage range (no matter the first sub-signal is having the first fluctuation and the second fluctuation), the first output voltage may be larger than the second output voltage, and the output signal transmitted by the comparator 830 is the first control signal; when the voltage of the first sub-signal is within the first preset voltage range, the first output voltage may be smaller than the second output voltage, and the output signal transmitted by the comparator 830 may be the second control signal.

The output terminal of the comparator 830 may be coupled to a downstream circuit, for example, the fluctuation filter module 432.

In the present disclosure, the first reference voltage and the second reference voltage may be determined based on a voltage of the first sub-signal when the first sub-signal is not having a fluctuation. The first reference voltage and the second reference voltage may be determined further based on a maximum amplitude allowed for the first sub-signal (may be referred to as a threshold amplitude). In some embodiments, the first reference voltage may be the same as the voltage of the first sub-signal when the first sub-signal is not having a fluctuation. Alternatively, the second reference voltage may be the same as the voltage of the first sub-signal when the first sub-signal is not having a fluctuation. The difference between the second reference voltage and the first reference voltage may be equal to the threshold amplitude. For example, if the first reference voltage and the voltage of the first sub-signal without a fluctuation are both 10 V and the threshold amplitude is 2 V (i.e., a normal voltage range of the first sub-signal is 10±2 V), since the second reference voltage is higher than the first reference voltage, the second reference voltage may be 12 V. Also, since the second reference voltage is higher than the first reference voltage, if the second reference voltage is 10 V and the threshold amplitude remains 2 V, the first reference voltage may be 8 V The first input terminal and the second input terminal of the comparator 830 may have different polarities. Based on the different polarities of the first input terminal and the second input terminal, the comparator 830 may indicate the signal fluctuation using signals with different level. When the first sub-signal is having a fluctuation (e.g., the first fluctuation, the second fluctuation) with an amplitude exceed the threshold amplitude (or an voltage of the first sub-signal is out of a first preset voltage range), if the first input terminal is a non-inverting input terminal and the second input terminal is an inverting input terminal, the comparator 830 may output a high-level signal (first control signal); if the first input terminal is an inverting input terminal and the second input terminal is a non-inverting input terminal, the comparator 830 may output a low-level signal (second control signal).

In some embodiments, the first input terminal of the comparator 830 may be a non-inverting input terminal and the second input terminal may be an inverting input terminal. When the first sub-signal is not having a fluctuation, the first fluctuation unit 810 may output the first reference voltage as the first output voltage, and the second fluctuation unit 820 may output the second reference voltage as the second output voltage. As the second output voltage is higher than the first output voltage, the comparator 830 may output a low-level signal (the second control signal).

When the first sub-signal is having a fluctuation with an amplitude lower than a difference between the second reference voltage and the first reference voltage, if the fluctuation is the first fluctuation, the first fluctuation unit 810 may output a sum of the first reference voltage and the amplitude of the fluctuation as the first output voltage, the second fluctuation may output the second reference voltage as the second output voltage, and the comparator 830 may output a low-level signal (the second control signal) because the second reference voltage is higher than the first reference voltage while the first reference voltage plus the fluctuation amplitude (lower than the difference between the second reference voltage and the first reference voltage) is still lower than the second reference voltage; if the fluctuation is the second fluctuation, the first fluctuation unit 810 may output the first reference voltage as the first output voltage, the second fluctuation unit 820 may output a difference between the second reference voltage and the fluctuation amplitude as the second output voltage, and the comparator 830 may output a low-level signal (the second control signal) because the second reference voltage is higher than the first reference voltage while the second reference voltage minus the fluctuation amplitude (lower than the difference between the second reference voltage and the first reference voltage) is still higher than the first reference voltage.

When the first sub-signal is having a fluctuation with an amplitude higher than a difference between the second reference voltage and the first reference voltage (e.g., caused by a step-change of the transmitted video signal), if the fluctuation is the first fluctuation, the first fluctuation unit 810 may output a sum of the first reference voltage and the amplitude of the fluctuation as the first output voltage, the second fluctuation may output the second reference voltage as the second output voltage, and the comparator 830 may output a high-level signal (the first control signal) because the second output voltage is lower than the first output voltage; if the fluctuation is the second fluctuation, the first fluctuation unit 810 may output the first reference voltage as the first output voltage, the second fluctuation unit 820 may output a difference between the second reference voltage and the fluctuation amplitude as the second output voltage, and the comparator 830 may output a high-level (the first control signal) signal because the second output voltage is still lower than the first output voltage.

For example, the first input terminal of the comparator 830 may be a non-inverting input terminal and the second input terminal may be an inverting input terminal; the first reference voltage and the voltage of the first sub-signal without a fluctuation may be both 10 V; the threshold amplitude may be 2 V, that is, the difference between the first reference voltage and the second reference voltage may be 2 V; the second reference voltage may be 12 V. When the first sub-signal is having a fluctuation with an amplitude (e.g., 1 V) lower than a difference between the second reference voltage and the first reference voltage, if the fluctuation is the first fluctuation, the first output voltage outputted by the first fluctuation unit 810 may be 11 V, the second output voltage outputted by the second fluctuation unit 820 may be 12 V, and the comparator 830 may output a low-level signal because the second output voltage (12 V) is higher than the first output voltage (11 V); if the fluctuation is the second fluctuation, the first output voltage outputted by the first fluctuation unit 810 may be 10 V, the second output voltage outputted by the second fluctuation unit 820 may be 11 V, and the comparator 830 may output a low-level signal because the second output voltage (11 V) is higher than the first output voltage (10 V). When the first sub-signal is having a fluctuation with an amplitude (e.g., 3 V) higher than the threshold amplitude, if the fluctuation is the first fluctuation, the first output voltage outputted by the first fluctuation unit 810 may be 13 V, the second output voltage outputted by the second fluctuation unit 820 may be 12 V, and the comparator 830 may output a high-level signal because the second output voltage (12 V) is lower than the first output voltage (13 V); if the fluctuation is the second fluctuation, the first output voltage outputted by the first fluctuation unit 810 may be 10 V, the second output voltage outputted by the second fluctuation unit 820 may be 9 V, and the comparator 830 may output a high-level signal because the second output voltage (9 V) is lower than the first output voltage (10 V).

Alternatively, the first input terminal of the comparator 830 may be an inverting input terminal and the second input terminal may be a non-inverting terminal. When the first sub-signal is not having a fluctuation, the first fluctuation unit 810 may output the first reference voltage as the first output voltage, and the second fluctuation unit 820 may output the second reference voltage as the second output voltage. As the second output voltage is higher than the first output voltage, the comparator 830 may output a high-level signal (the second control signal).

When the first sub-signal is having a fluctuation with an amplitude lower than a difference between the second reference voltage and the first reference voltage, if the fluctuation is the first fluctuation, the first fluctuation unit 810 may output a sum of the first reference voltage and the amplitude of the fluctuation as the first output voltage, the second fluctuation may output the second reference voltage as the second output voltage, and the comparator 830 may output a high-level signal (the second control signal) because the second output voltage is higher than the first output voltage; if the fluctuation is the second fluctuation, the first fluctuation unit 810 may output the first reference voltage as the first output voltage, the second fluctuation unit 820 may output a difference between the second reference voltage and the fluctuation amplitude as the second output voltage, and the comparator 830 may output a high-level signal (the second control signal) because the second output voltage is still higher than the first output voltage.

When the first sub-signal is having a fluctuation with an amplitude higher than a difference between the second reference voltage and the first reference voltage, if the fluctuation is the first fluctuation, the first fluctuation unit 810 may output a sum of the first reference voltage and the amplitude of the fluctuation as the first output voltage, the second fluctuation may output the second reference voltage as the second output voltage, and the comparator 830 may output a low-level signal (the first control signal) because the second output voltage is lower than the first output voltage; if the fluctuation is the second fluctuation, the first fluctuation unit 810 may output the first reference voltage as the first output voltage, the second fluctuation unit 820 may output a difference between the second reference voltage and the fluctuation amplitude as the second output voltage, and the comparator 830 may output a low-level signal (the first control signal) because the second output voltage is still lower than the first output voltage.

In the present disclosure, based on a detection range of the fluctuation detection unit 800, and a connection between the first fluctuation unit 810, the second fluctuation unit 820, the non-inverting input terminal, and the inverting input terminal of the comparator 830, the output level of the comparator 830 corresponding to a negative result that the first sub-signal (or the video signal transmitted from the coaxial cable) is not having a fluctuation or is having a fluctuation with an amplitude within an allowable voltage range of the fluctuation detection unit 800 (e.g., the first preset voltage range for detecting the first sub-signal) may be decided correspondingly. During the detection of the first sub-signal, by determining that whether an output level of the comparator 830 is opposite to the output level corresponding to the negative result, the fluctuation detection unit 800 may determine whether the first sub-signal is having a fluctuation with an amplitude out of the allowable voltage range (positive result).

In the present disclosure, the first fluctuation unit 810 may determine a first output voltage based on the first reference voltage and an amplitude of a first fluctuation of the first sub-signal, the second fluctuation unit 820 may determine a second output voltage based on the second reference voltage and an amplitude of a second fluctuation of the first sub-signal, and the comparator 830 may determine whether the first sub-signal is having an fluctuation with an amplitude (or voltage) out of a normal range (the allowable voltage range, the first preset voltage range). The fluctuation detection unit 800 may use only one comparator for detecting a fluctuation of a received signal (e.g., the first sub-signal), thus a cost, a circuit volume, and a power consumption of the fluctuation detection unit 800 may be reduced compared to traditional two-comparator circuit designs.

Exemplary circuits for implementing the fluctuation detection unit 800, the first fluctuation unit 810 and/or the second fluctuation unit 820 are provided elsewhere in the present disclosure (e.g., in connection with FIGS. 9 to 17), which are only for demonstration purposes and not intended to be limiting.

Figure 9:
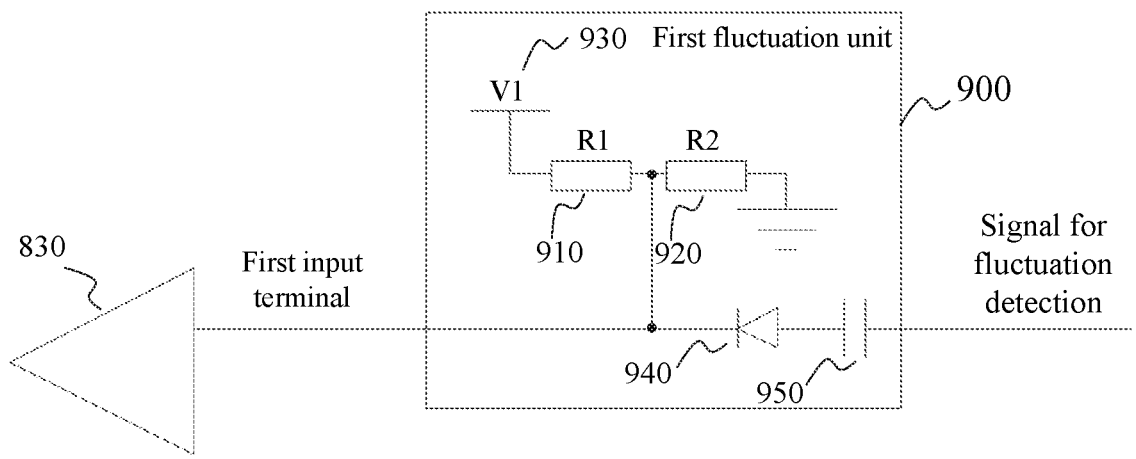
FIG. 9 is a schematic diagram illustrating an exemplary first fluctuation unit according to some embodiments of the present disclosure.

FIG. 9 is a schematic diagram illustrating an exemplary first fluctuation unit according to some embodiments of the present disclosure. First fluctuation unit 900 is an exemplary embodiment of the first fluctuation unit 810 (e.g., illustrated in FIG. 8). The first fluctuation unit 900 may include a voltage supply 930, a resistor 910, a resistor 920, a diode 940, and a capacitor 950. A first terminal of the resistor 910 may be coupled to the voltage supply 930, and a second terminal of the resistor 910 may be coupled to a first terminal of the resistor 920 (the voltage supply 930, the resistor 910, and the resistor 920 may be connected in series). A second terminal of the resistor 920 may be coupled to ground. An anode of the diode 940 may be coupled to a first terminal of the capacitor 950. A second terminal of the capacitor 950, which may be viewed as an input terminal of the first fluctuation unit 900, may be coupled to a signal source (e.g., the output terminal of the sub-signal acquisition unit 541) for receiving a signal (e.g., the first sub-signal) for fluctuation detection. A cathode of the diode 940, which may be viewed as an output terminal of the first fluctuation unit 900, may be coupled to the first terminal of the resistor 920 and the first input terminal of the comparator 830. When the first sub-signal is not having a fluctuation, a voltage across the resistor 920 may be equal to the first reference voltage.

Electric resistance R1 of the resistor 910, the electric resistance R2 of the resistor 920 and a voltage V1 outputted by the voltage supply 930 may be determined based on the first reference voltage, meeting that when the resistor 910, the resistor 920, and the voltage supply 930 is connected in a manner as illustrated in FIG. 9, the voltage across the resistor 920 is equal to the first reference voltage. That is, R2/(R1+R2)*V1 is equal to the first reference voltage.

Specifically, when the first sub-signal is not having a fluctuation, a voltage at the first terminal (coupled to the diode 940) of the capacitor 950 may be equal to a voltage across the resistor 920 and the first reference voltage. A voltage at the second terminal of the capacitor 950 may be equal to a voltage of the first sub-signal. When the first sub-signal is not having a fluctuation, the capacitor 950 may not be charged or discharged, and the first output voltage transmitted to the comparator 830 may be equal to the voltage across the resistor 920, that is, the first reference voltage. When the first sub-signal is having a first fluctuation, the capacitor 950 may be charged and discharged, and a voltage at the first terminal of the capacitor 950, starting from the first reference voltage (i.e., the voltage across the resistor 920 when the first sub-signal is not having a fluctuation), may also have the first fluctuation (or a positive wave having an amplitude the same as that of the first fluctuation) with the first sub-signal simultaneously. Consequently, a voltage at the anode of the diode 940 may be higher than a voltage at the cathode of the diode 940, the diode 940 may be turned on, and the first output voltage transmitted to the comparator 830 may be equal to a sum of the first reference voltage and the amplitude of the first fluctuation. When the first sub-signal is having a second fluctuation, the capacitor 950 may be charged and discharged, and a voltage at the first terminal of the capacitor 950, starting from the first reference voltage (i.e., the voltage across the resistor 920 when the first sub-signal is not having a fluctuation), may also have the second fluctuation (or a negative wave having an amplitude the same as that of the second fluctuation) with the first sub-signal simultaneously. Consequently, a voltage at the anode of the diode 940 may be lower than a voltage at the cathode of the diode 940, the diode 940 may be turned off, and the first output voltage transmitted to the comparator 830 may be the voltage across the resistor 920, i.e., the first reference voltage.

Figure 10:
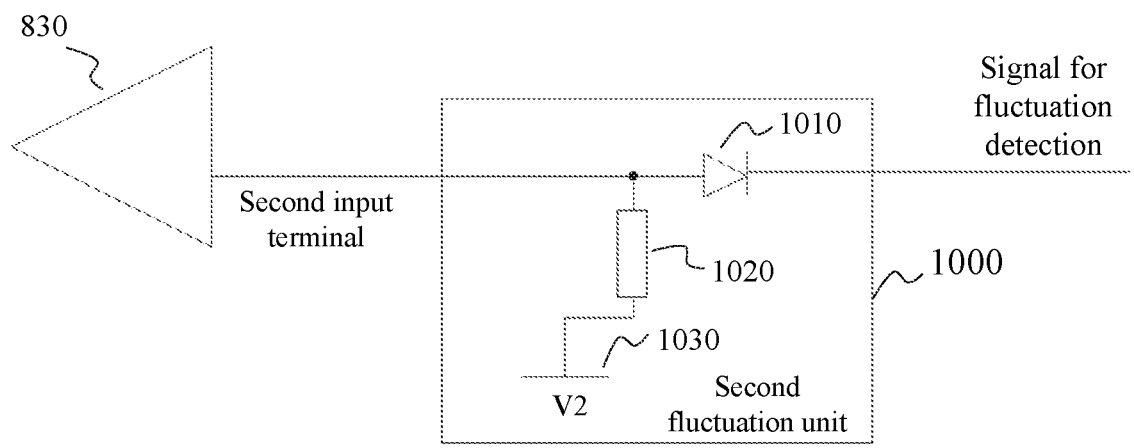
FIGS. 10 and 11 are schematic diagrams illustrating exemplary second fluctuation units according to some embodiments of the present disclosure.
Figure 11:
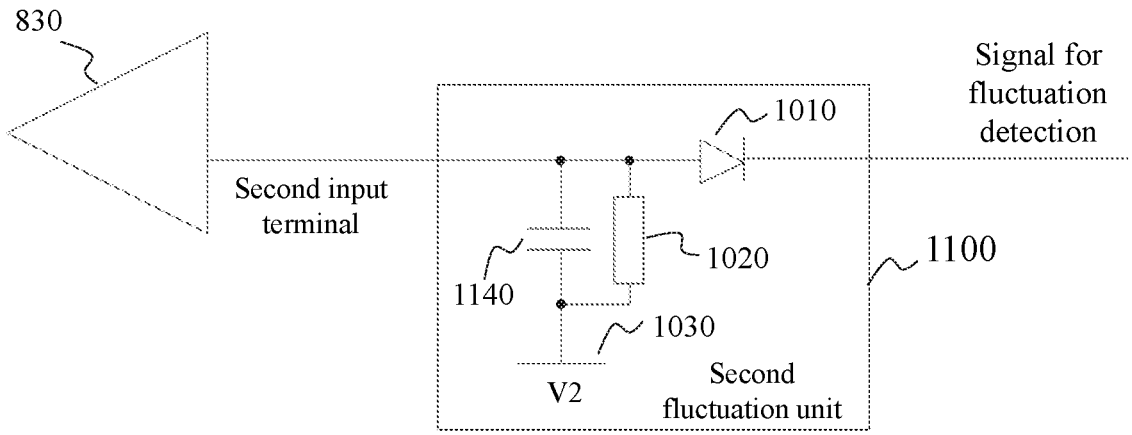

FIGS. 10 and 11 are schematic diagrams illustrating exemplary second fluctuation units according to some embodiments of the present disclosure. Second fluctuation units 1000 and 1100 are embodiments of the second fluctuation unit 820 (e.g., illustrated in FIG. 8), wherein the second reference voltage may be equal to a voltage of a signal for fluctuation detection (e.g., the first sub-signal) when the signal is not having a fluctuation. The second fluctuation unit 1000 may include a voltage supply 1030, a resistor 1020, and a diode 1010. A first terminal of the resistor 1020 may be coupled to the voltage supply 1030. A second terminal of the resistor 1020 may be coupled to an anode of the diode 1010. A cathode of the diode 1010, which may be viewed as an input terminal of the second fluctuation unit 1000, may be coupled to a signal source (e.g., the output terminal of the sub-signal acquisition unit 541) for receiving the signal (e.g., the first sub-signal) for fluctuation detection. The second terminal of the resistor 1020, which may be viewed as an output terminal of the second fluctuation unit 1000, may also be coupled to the second input terminal of the comparator 830. A voltage V2 outputted by the voltage 1030 may be equal to the second reference voltage.

The voltage V2 outputted by the voltage supply 1030 may be determined based on the second reference voltage, for example, the voltage V2 may be equal to the second reference voltage. Specifically, when the first sub-signal is not having a fluctuation, a voltage at the anode of the diode 1010 may be the voltage V2 of the voltage supply 1030, and a voltage at the cathode of the diode 1010 may be a voltage of the first sub-signal without a fluctuation, which may be equal to the voltage V2 of the voltage supply 1030. Consequently, the diode 1010 may be turned off and the second output voltage transmitted to the comparator 830 may be the second reference voltage. When the first sub-signal is having a first fluctuation, a voltage at the anode of the diode 1010 may be lower than a voltage at the cathode of the diode 1010, the diode 1010 may be turned off, and the second output voltage transmitted to the comparator 830 may also be the second reference voltage. When the first sub-signal is having a second fluctuation, a voltage at the anode of the diode 1010 may be higher than a voltage at the cathode of the diode 1010, the diode 1010 may be turned on, and the second output voltage transmitted to the comparator 830 may be a current voltage of the first sub-signal, wherein the current voltage of the first sub-signal may be a difference between the second reference voltage and an amplitude of the second fluctuation.

In order to facilitate the comparator 830 obtaining the second output voltage outputted by the second fluctuation unit 1000 when the first sub-signal is having a second fluctuation, the second fluctuation unit 1000 may further include another capacitor which may connect with the resistor 1020 in parallel (e.g., as illustrated in FIG. 11).

The second fluctuation unit 1100 illustrated in FIG. 11 is a variation of the second fluctuation unit 1000. The cathode of the diode 1010 and the second terminal of the resistor 1020 may also be viewed as an input terminal and an output terminal of the second fluctuation unit 1100. In addition to the circuit structure of the second fluctuation unit 1000, the second fluctuation unit 1100 further includes a capacitor 1140 connecting with the resistor 1020 in parallel. Specifically, a first terminal of the capacitor 1140 may be coupled to the first terminal of the resistor 1020, and a second terminal of the capacitor 1140 may be coupled to the second terminal of the resistor 1020. When the first sub-signal is having a second fluctuation, a voltage at the cathode of the diode 1010 may be lower than a voltage at the anode of the diode 1010, and the diode 1010 may be turned on. Consequently, a voltage at the second terminal (coupled to the anode of the diode 1010) of the capacitor 1140 may be lower than a voltage at the first terminal (coupled to the voltage supply 1030) of the capacitor 1140, and the capacitor 1140 may be charged. When the second fluctuation of the first sub-signal is over, the capacitor 1140 and the resistor 1020 may form a closed loop circuit, the capacitor 1140 may be discharged, and the effect of the second fluctuation on the second fluctuation unit 1100 may be extended. Consequently, the time for the comparator 830 receiving the second output voltage corresponding to the second fluctuation may be prolonged.

Figure 12:
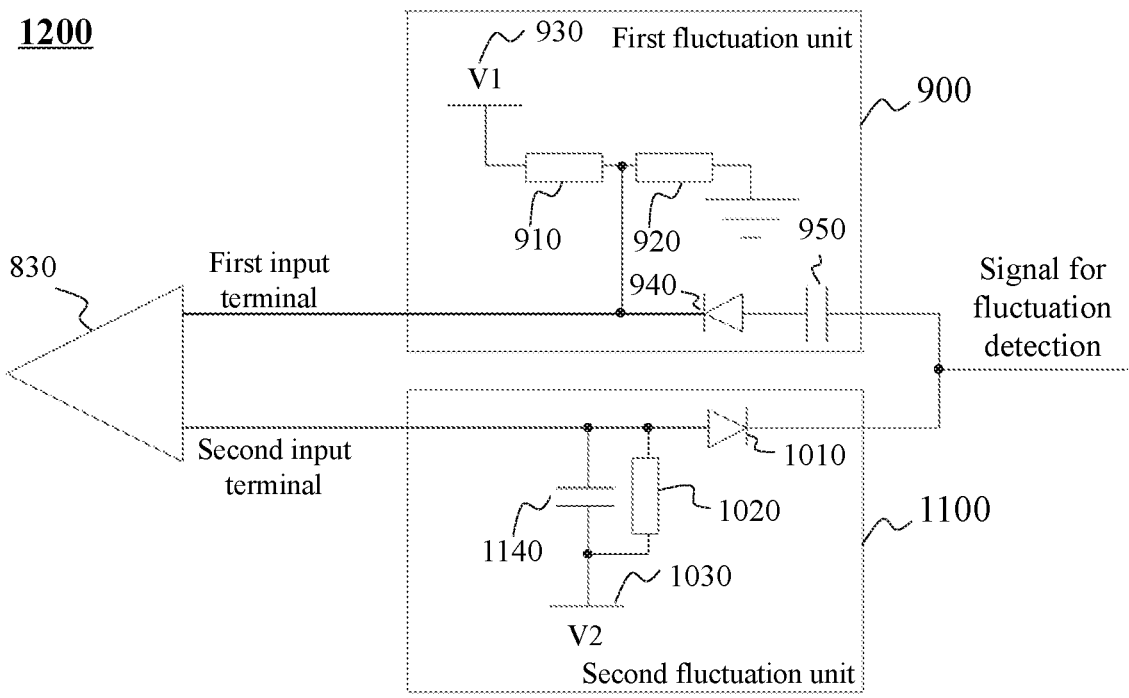
FIG. 12 is a schematic diagram illustrating an exemplary fluctuation detection unit according to some embodiments of the present disclosure.

FIG. 12 is a schematic diagram illustrating an exemplary fluctuation detection unit according to some embodiments of the present disclosure. Fluctuation detection unit 1200 is an exemplary embodiment of the fluctuation detection unit 800 (e.g., illustrated in FIG. 8). The fluctuation detection unit 1200 may be a combination of the first fluctuation unit 900 illustrated in FIG. 9 and the second fluctuation unit 1100 illustrated in FIG. 11. The output terminal of the first fluctuation unit 900 and the output terminal of the second fluctuation unit 1100 may be coupled to the first input terminal of the comparator 830 and the second input terminal of the comparator 830 respectively, while the input terminal of the first fluctuation unit 900 and the input terminal of the second fluctuation unit 1100 may both be coupled to a signal source (e.g., the output terminal of the sub-signal acquisition unit 541) for receiving a signal (e.g., the first sub-signal) for fluctuation detection. It may be noted that, the fluctuation detection unit 1200 is only for demonstration purposes and not intended to be limiting.

When the first sub-signal is not having a fluctuation, the capacitor 950 may not be charged or discharged, and the diode 1010 may be turned off. The first output voltage outputted by the first fluctuation unit 900 may be the first reference voltage, and the second output voltage outputted by the second fluctuation unit 1100 may be the second reference voltage. The comparator 830 may output a first comparison result based on the first output voltage and the second output voltage.

When the first sub-signal is having a first fluctuation, the capacitor 950 may be charged and discharged. Starting from the first reference voltage, a voltage at the first terminal (coupled to the diode 940) of the capacitor 950 may also have the first fluctuation (or a positive wave having an amplitude the same as that of the first fluctuation) with the first sub-signal simultaneously. A voltage at the anode of the diode 940 may be higher than a voltage at the cathode of the diode 940, and the diode 940 may be turned on. A voltage at the anode of the diode 1010 may be lower than a voltage at the cathode of the diode 1010, and the diode 1010 may be turned off. Consequently, the first fluctuation unit 900 may transmit a first output voltage equal to a sum of the first reference voltage and an amplitude of the first fluctuation to the comparator 830, while the second fluctuation unit 1100 may transmit a second output voltage equal to the second reference voltage to the comparator 830. The comparator 830 may output a second comparison result based on the first output voltage and the second output voltage.

When the first sub-signal is having a second fluctuation, the capacitor 950 may be charged and discharged. Starting from the first reference voltage, a voltage at the first terminal (coupled to the diode 940) of the capacitor 950 may also have the second fluctuation (or a negative wave having an amplitude the same as the second fluctuation) with the first sub-signal simultaneously. A voltage at the anode of the diode 940 may be lower than a voltage at the cathode of the diode 940, and the diode 940 may be turned off. A voltage at the anode of the diode 1010 may be higher than a voltage at the cathode of the diode 1010, and the diode 1010 may be turned on. Consequently, the first fluctuation unit 900 may transmit a first output voltage equal to the first reference voltage, while the second fluctuation unit 1100 may transmit a second output voltage equal to a current voltage of the first sub-signal, which is equal to a difference between the second reference voltage and the amplitude of the second fluctuation, to the comparator 830. The comparator 830 may output a third comparison result based on the first output voltage and the second output voltage.

In some embodiments, the first input terminal of the comparator 830 may be a non-inverting input terminal and the second input terminal of the comparator 830 may be an inverting input terminal. The first comparison result may be a low-level signal (the second control signal). When the amplitude of the first fluctuation or the second fluctuation is lower than a difference between the second reference voltage and the first reference voltage, the second comparison result or the third comparison result may also be a low-level signal. When the amplitude of the first fluctuation or the second fluctuation is higher than a difference between the second reference voltage and the first reference voltage, the second comparison result or the third comparison result may be a high-level signal (the first control signal).

In some embodiments, the first input terminal of the comparator 830 may be an inverting input terminal and the second input terminal of the comparator 830 may be a non-inverting input terminal. The first comparison result may be a high-level signal (the second control signal). When the amplitude of the first fluctuation or the second fluctuation is lower than a difference between the second reference voltage and the first reference voltage, the second comparison result or the third comparison result may also be a high-level signal. When the amplitude of the first fluctuation or the second fluctuation is higher than a difference between the second reference voltage and the first reference voltage, the second comparison result or the third comparison result may be a low-level signal (the first control signal).

Figure 13:
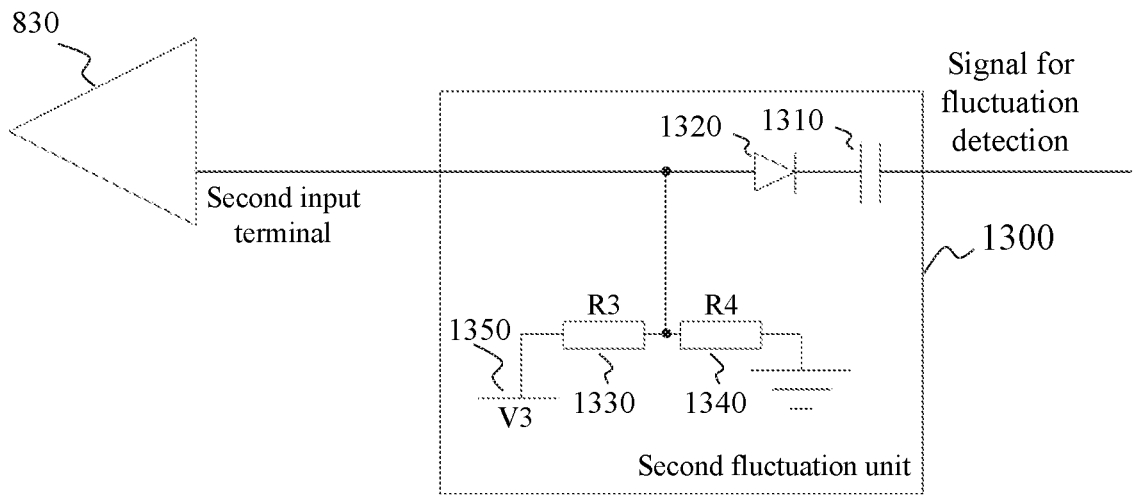
FIG. 13 is a schematic diagram illustrating an exemplary second fluctuation unit according to some embodiments of the present disclosure.

FIG. 13 is a schematic diagram illustrating an exemplary second fluctuation unit according to some embodiments of the present disclosure. Second fluctuation unit 1300 is an exemplary embodiment of the second fluctuation unit 820 (e.g., illustrated in FIG. 8). The second fluctuation unit 1300 may include a voltage supply 1350, a resistor 1330, a resistor 1340, a diode 1320, and a capacitor 1310. A first terminal of the resistor 1330 may be coupled to the voltage supply 1350, and a second terminal of the resistor 1330 may be coupled to a first terminal of the resistor 1340 (the voltage supply 1350, the resistor 1330, and the resistor 1340 may be connected in series). A second terminal of the resistor 1340 may be coupled to ground. A cathode of the diode 1320 may be coupled to a first terminal of the capacitor 1310. A second terminal of the capacitor 1310, which may be viewed as an input terminal of the second fluctuation unit 1300, may be coupled to a signal source (e.g., the output terminal of the sub-signal acquisition unit 541) for receiving a signal (e.g., the first sub-signal) for fluctuation detection. An anode of the diode 1320, which may be viewed as an output terminal of the second fluctuation unit 1300, may be coupled to the second terminal of the resistor 1330 and the second input terminal of the comparator 830. When the first sub-signal is not having a fluctuation, a voltage across the resistor 1340 may be equal to the second reference voltage.

Electric resistance R3 of the resistor 1330, the electric resistance R4 of the resistor 1340 and a voltage V3 outputted by the voltage supply 1350 may be determined based on the second reference voltage, meeting that when the resistor 1330, the resistor 1340, and the voltage supply 1350 is connected in a manner as illustrated in FIG. 13, the voltage across the resistor 1340 is equal to the second reference voltage. That is, $R4/(R3+R4)*V3$ is equal to the second reference voltage.

Specifically, when the first sub-signal is not having a fluctuation, a voltage at the first terminal (coupled to the diode 1320) of the capacitor 1310 may be equal to a voltage across the resistor 1340 and the second reference voltage. A voltage at the second terminal of the capacitor 1310 may be equal to a voltage of the first sub-signal. When the first sub-signal is not having a fluctuation, the capacitor 1310 may not be charged or discharged, and the second output voltage transmitted to the comparator 830 may be equal to the voltage across the resistor 1340, that is, the second reference voltage. When the first sub-signal is having a first fluctuation, the capacitor 1310 may be charged and discharged, and a voltage at the first terminal of the capacitor 1310, starting from the second reference voltage (i.e., the voltage across the resistor 1340 when the first sub-signal is not having a fluctuation), may also have the first fluctuation (or a positive wave having an amplitude the same as that of the first fluctuation) with the first sub-signal simultaneously. Consequently, a voltage at the anode of the diode 1320 may be lower than a voltage at the cathode of the diode 1320, the diode 1320 may be turned off, and the second output voltage transmitted to the comparator 830 may be the second reference voltage. When the first sub-signal is having a second fluctuation, the capacitor 1310 may be charged and discharged, and a voltage at the first terminal of the capacitor 1310, starting from the second reference voltage (i.e., the voltage across the resistor 1340 when the first sub-signal is not having a fluctuation), may also have the second fluctuation (or a negative wave having an amplitude the same as that of the second fluctuation) with the first sub-signal simultaneously. Consequently, a voltage at the anode of the diode 1320 may be higher than a voltage at the cathode of the diode 1320, the diode 1320 may be turned on, and the second output voltage transmitted to the comparator 830 may be equal to a difference between the second reference voltage and the amplitude of the second fluctuation.

Figure 14:
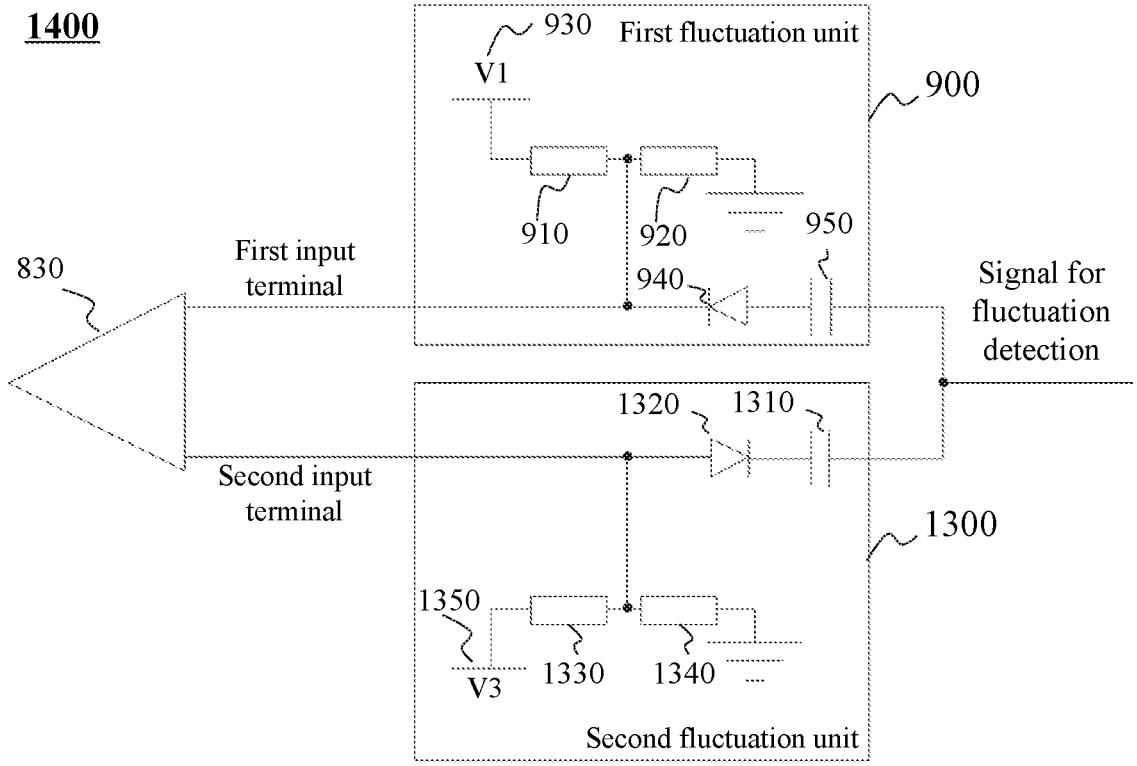
FIG. 14 is a schematic diagram illustrating an exemplary fluctuation detection unit according to some embodiments of the present disclosure.

FIG. 14 is a schematic diagram illustrating an exemplary fluctuation detection unit according to some embodiments of the present disclosure. Fluctuation detection unit 1400 is an exemplary embodiment of the fluctuation detection unit 800 (e.g., illustrated in FIG. 8). The fluctuation detection unit 1400 may be a combination of the first fluctuation unit 900 illustrated in FIG. 9 and the second fluctuation unit 1300 illustrated in FIG. 13. The output terminal of the first fluctuation unit 900 and the output terminal of the second fluctuation unit 1300 may be coupled to the first input terminal of the comparator 830 and the second input terminal of the comparator 830 respectively, while the input terminal of the first fluctuation unit 900 and the input terminal of the second fluctuation unit 1300 may both be coupled to a signal source (e.g., the output terminal of the sub-signal acquisition unit 541) for receiving a signal (e.g., the first sub-signal) for fluctuation detection. It may be noted that, the fluctuation detection unit 1400 is only for demonstration purposes and not intended to be limiting.

When the first sub-signal is not having a fluctuation, the capacitor 950 and the capacitor 1310 may not be charged or discharged. The first output voltage outputted by the first fluctuation unit 900 may be the first reference voltage, and the second output voltage outputted by the second fluctuation unit 1300 may be the second reference voltage. The comparator 830 may output a first comparison result based on the first output voltage and the second output voltage.

When the first sub-signal is having a first fluctuation, a voltage at the first terminal (coupled to the diode 940) of the capacitor 950, stating from the first reference voltage, may also have the first fluctuation (or a positive wave having an amplitude the same as that of the first fluctuation) with the first sub-signal simultaneously. The diode 940 may be turned on, and the first fluctuation unit 900 may transmit a first output voltage equal to a sum of the first reference voltage and an amplitude of the first fluctuation to the comparator 830. A voltage at the first terminal (coupled to the diode 1320) of the capacitor 1310, stating from the second reference voltage, may also have the first fluctuation (or a positive wave having an amplitude the same as that of the first fluctuation) with the first sub-signal simultaneously. The diode 1320 may be turned off, and the second fluctuation unit 1300 may transmit a second output voltage equal to the second reference voltage to the comparator 830. The comparator 830 may output a second comparison result based on the first output voltage and the second output voltage.

When the first sub-signal is having a second fluctuation, a voltage at the first terminal (coupled to the diode 940) of the capacitor 950, stating from the first reference voltage, may also have the second fluctuation (or a negative wave having an amplitude the same as that of the second fluctuation) with the first sub-signal simultaneously. The diode 940 may be turned off, and the first fluctuation unit 900 may transmit a first output voltage equal to the first reference voltage to the comparator 830. A voltage at the first terminal (coupled to the diode 1320) of the capacitor 1310, stating from the second reference voltage, may also have the second fluctuation (or a negative wave having an amplitude the same as that of the second fluctuation) with the first sub-signal simultaneously. The diode 1320 may be turned on, and the second fluctuation unit 1300 may transmit a second output voltage equal to a difference between the second reference voltage and an amplitude of the second fluctuation to the comparator 830. The comparator 830 may output a third comparison result based on the first output voltage and the second output voltage.

In some embodiments, the first input terminal of the comparator 830 may be a non-inverting input terminal and the second input terminal of the comparator 830 may be an inverting input terminal. The first comparison result may be a low-level signal (the second control signal). When the amplitude of the first fluctuation or the second fluctuation is lower than a difference between the second reference voltage and the first reference voltage, the second comparison result or the third comparison result may also be a low-level signal. When the amplitude of the first fluctuation or the second fluctuation is higher than a difference between the second reference voltage and the first reference voltage, the second comparison result or the third comparison result may be a high-level signal (the first control signal).

In some embodiments, the first input terminal of the comparator 830 may be an inverting input terminal and the second input terminal of the comparator 830 may be a non-inverting input terminal. The first comparison result may be a high-level signal (the second control signal). When the amplitude of the first fluctuation or the second fluctuation is lower than a difference between the second reference voltage and the first reference voltage, the second comparison result or the third comparison result may also be a high-level signal. When the amplitude of the first fluctuation or the second fluctuation is higher than a difference between the second reference voltage and the first reference voltage, the second comparison result or the third comparison result may be a low-level signal (the first control signal).

Figure 15:
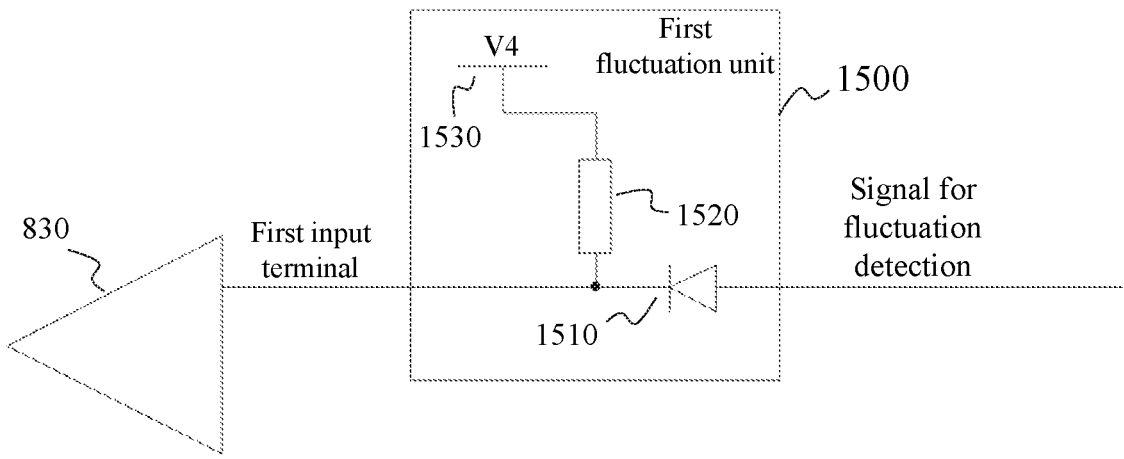
FIGS. 15 and 16 are schematic diagrams illustrating exemplary first fluctuation units according to some embodiments of the present disclosure.
Figure 16:
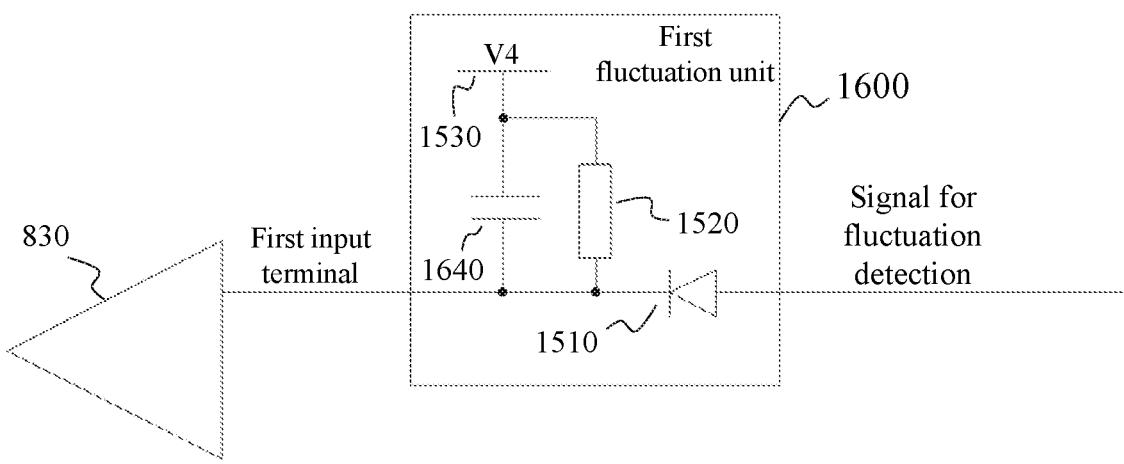

FIGS. 15 and 16 are schematic diagrams illustrating exemplary first fluctuation units according to some embodiments of the present disclosure. First fluctuation units 1500 and 1600 are embodiments of the first fluctuation unit 810 (e.g., illustrated in FIG. 8). The first reference voltage may be equal to a voltage of a signal for fluctuation detection (e.g., the first sub-signal) when the signal is not having a fluctuation. The first fluctuation unit 1500 may include a voltage supply 1530, a resistor 1520, and a diode 1510. A first terminal of the resistor 1520 may be coupled to the voltage supply 1530. A second terminal of the resistor 1520 may be coupled to a cathode of the diode 1510. An anode of the diode 1510, which may be viewed as an input terminal of the first fluctuation unit 1500, may be coupled to a signal source (e.g., the output terminal of the sub-signal acquisition unit 541) for receiving the signal (e.g., the first sub-signal) for fluctuation detection. The second terminal of the resistor 1520, which may be viewed as an output terminal of the second fluctuation unit 1500, may also be coupled to the first input terminal of the comparator 830. A voltage V4 outputted by the voltage 1530 may be equal to the first reference voltage.

The voltage V4 outputted by the voltage supply 1530 may be determined based on the first reference voltage, for example, the voltage V4 may be equal to the first reference voltage. Specifically, when the first sub-signal is not having a fluctuation, a voltage at the cathode of the diode 1510 may be the voltage V4 of the voltage supply 1530, and a voltage at the anode of the diode 1510 may be a voltage of the first sub-signal without a fluctuation, which may be equal to the voltage V4 of the voltage supply 1530. Consequently, the diode 1510 may be turned off and the first output voltage transmitted to the comparator 830 may be the first reference voltage. When the first sub-signal is having a first fluctuation, a voltage at the cathode of the diode 1510 may be lower than a voltage at the anode of the diode 1510, the diode 1510 may be turned on, and the first output voltage transmitted to the comparator 830 may be a current voltage of the first sub-signal, wherein the current voltage of the first sub-signal may be a sum of the first reference voltage and an amplitude of the first fluctuation. When the first sub-signal is having a second fluctuation, a voltage at the cathode of the diode 1510 may be higher than a voltage at the anode of the diode 1510, and a difference between a voltage at the cathode of the diode 1510 and a voltage at the anode of the diode 1510 may be equal to an amplitude of the second fluctuation. Consequently, the diode 1510 may be turned off, and the first output voltage transmitted to the comparator 830 may be the first reference voltage.

In order to facilitate the comparator 830 obtaining the first output voltage outputted by the first fluctuation unit 1500 when the first sub-signal is having a second fluctuation, the first fluctuation unit 1500 may further include another capacitor which may connect with the resistor 1520 in parallel (e.g., as illustrated in FIG. 16).

FIG. 16 illustrate a first fluctuation unit 1600 which is a variation of the first fluctuation unit 1500. The anode of the diode 1510 and the second terminal of the resistor 1520 may also be viewed as an input terminal and an output terminal of the first fluctuation unit 1600. In addition to the circuit structure of the first fluctuation unit 1000, the first fluctuation unit 1600 further includes a capacitor 1640 connecting with the resistor 1520 in parallel. Specifically, a first terminal of the capacitor 1640 may be coupled to the first terminal of the resistor 1520, and a second terminal of the capacitor 1640 may be coupled to the second terminal of the resistor 1520. When the first sub-signal is having a first fluctuation, a voltage at the cathode of the diode 1010 may be lower than a voltage at the anode of the diode 1510, and the diode 1510 may be turned on. Consequently, a voltage at the second terminal (coupled to the cathode of the diode 1510) of the capacitor 1640 may be lower than a voltage at the first terminal (coupled to the voltage supply 1530) of the capacitor 1640, and the capacitor 1640 may be charged. When the first fluctuation of the first sub-signal is over, the capacitor 1640 and the resistor 1520 may form a closed loop circuit, the capacitor 1640 may be discharged, and the effect of the first fluctuation on the first fluctuation unit 1600 may be extended. Consequently, the time for the comparator 830 receiving the first output voltage corresponding to the first fluctuation may be prolonged.

Figure 17:
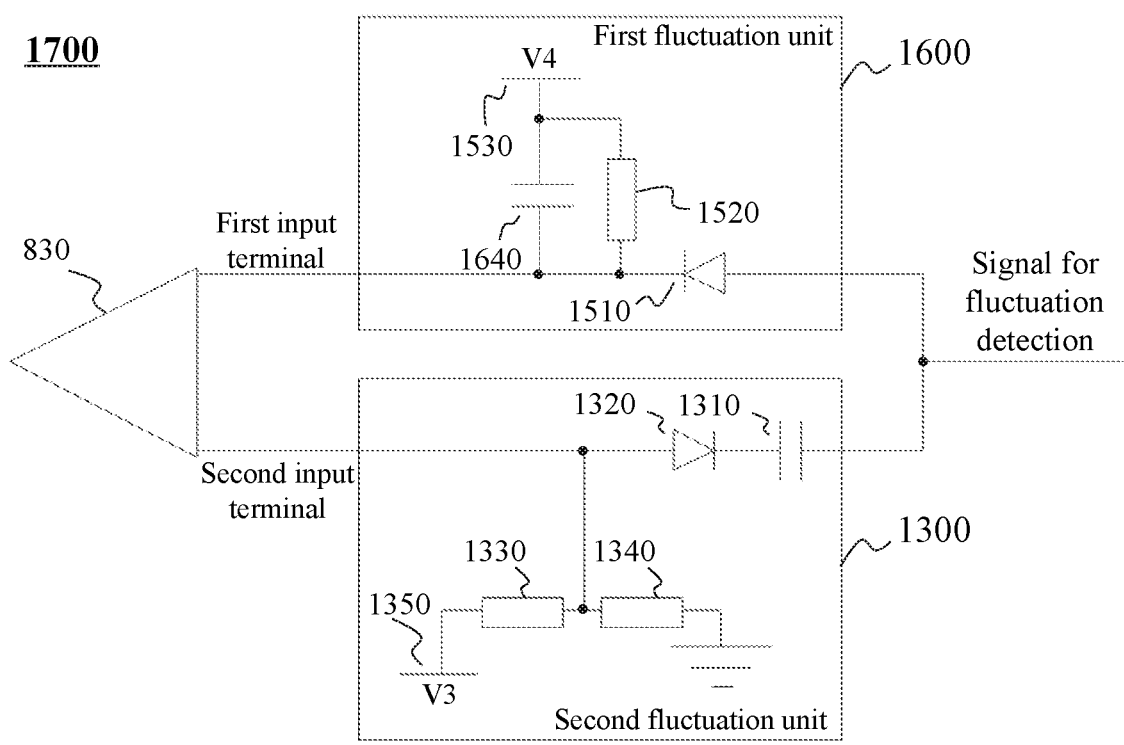
FIG. 17 is a schematic diagram illustrating an exemplary fluctuation detection unit according to some embodiments of the present disclosure.

FIG. 17 is a schematic diagram illustrating an exemplary fluctuation detection unit according to some embodiments of the present disclosure. Fluctuation detection unit 1700 is an exemplary embodiment of the fluctuation detection unit 800 (e.g., illustrated in FIG. 8). The fluctuation detection unit 1700 may be a combination of the first fluctuation unit 1600 illustrated in FIG. 16 and the second fluctuation unit 1300 illustrated in FIG. 13. The output terminal of the first fluctuation unit 1700 and the output terminal of the second fluctuation unit 1300 may be coupled to the first input terminal of the comparator 830 and the second input terminal of the comparator 830 respectively, while the input terminal of the first fluctuation unit 1700 and the input terminal of the second fluctuation unit 1300 may both be coupled to a signal source (e.g., the output terminal of the sub-signal acquisition unit 541) for receiving a signal (e.g., the first sub-signal) for fluctuation detection. It may be noted that, the fluctuation detection unit 1700 is only for demonstration purposes and not intended to be limiting.

When the first sub-signal is not having a fluctuation, the diode 1510 may be turned off, and the capacitor 1310 may not be charged or discharged. The first output voltage outputted by first fluctuation unit 1600 may be the first reference voltage, and the second output voltage outputted by the second fluctuation unit 1300 may be the second reference voltage. The comparator 830 may output a first comparison result based on the first output voltage and the second output voltage.

When the first sub-signal is having a first fluctuation, a voltage at the anode of the diode 1520 may be higher than a voltage at the cathode of the diode 1520, and the diode 1520 may be turned on. A voltage at the first terminal of the capacitor 1310, starting from the second reference voltage (i.e., the voltage across the resistor 1340 when the first sub-signal is not having a fluctuation), may also have the first fluctuation (or a positive wave having an amplitude the same as that of the first fluctuation) with the first sub-signal simultaneously, and the diode 1320 may be turned off. Consequently, the first output voltage outputted by the first fluctuation unit 1600 may be a sum of the first reference voltage and an amplitude of the first fluctuation, and the second output voltage outputted by the second fluctuation unit may be the second reference voltage. The comparator 830 may output a second comparison result based on the first output voltage and the second output voltage.

When the first sub-signal is having a second fluctuation, a voltage at the anode of the diode 1520 may be lower than a voltage at the cathode of the diode 1520, and the diode 1520 may be turned off. A voltage at the first terminal of the capacitor 1310, starting from the second reference voltage (i.e., the voltage across the resistor 1340 when the first sub-signal is not having a fluctuation), may also have the second fluctuation (or a negative wave having an amplitude the same as that of the second fluctuation) with the first sub-signal simultaneously, and the diode 1320 may be turned on. Consequently, the first output voltage outputted by the first fluctuation unit 1600 may be the first reference voltage, and the second output voltage outputted by the second fluctuation unit may be a difference between the second reference voltage and an amplitude of the second fluctuation. The comparator 830 may output a third comparison result based on the first output voltage and the second output voltage.

In some embodiments, the first input terminal of the comparator 830 may be a non-inverting input terminal and the second input terminal of the comparator 830 may be an inverting input terminal. The first comparison result may be a low-level signal (the second control signal). When the amplitude of the first fluctuation or the second fluctuation is lower than a difference between the second reference voltage and the first reference voltage, the second comparison result or the third comparison result may also be a low-level signal. When the amplitude of the first fluctuation or the second fluctuation is higher than a difference between the second reference voltage and the first reference voltage, the second comparison result or the third comparison result may be a high-level signal (the first control signal).

In some embodiments, the first input terminal of the comparator 830 may be an inverting input terminal and the second input terminal of the comparator 830 may be a non-inverting input terminal. The first comparison result may be a high-level signal (the second control signal). When the amplitude of the first fluctuation or the second fluctuation is lower than a difference between the second reference voltage and the first reference voltage, the second comparison result or the third comparison result may also be a high-level signal. When the amplitude of the first fluctuation or the second fluctuation is higher than a difference between the second reference voltage and the first reference voltage, the second comparison result or the third comparison result may be a low-level signal (the first control signal).

It may be noted that, the fluctuation detection unit 800 may be an arbitrary combination of the first fluctuation units 900, 1500, and 1600, the second fluctuation units 1000, 1100, 1300, and any other proper circuits. It may also be noted that, the fluctuation detection unit 542 may be implemented by any one of the circuit structures in connection with FIGS. 7, 8, 12, 14 and 17, or any other proper circuits.

Based on the adopted circuit structure, the first control signal and/or the second control signal outputted by the fluctuation detection unit 542 may be in any proper forms. For example, the first control signal may be in the form of a high-level signal while the second control signal may be in the form of a low-level signal for the fluctuation detection unit 700 and the fluctuation detection unit 800 when the first fluctuation unit 810 or an embodiment thereof is coupled to the non-inverting input terminal of the comparator 830 while the second fluctuation 820 or an embodiment thereof is coupled to the inverting input terminal of the comparator 830. As another example, the first control signal may be in the form of a low-level signal while the second control signal may be in the form of a high-level signal for the fluctuation detection unit 800 when the first fluctuation unit 810 or an embodiment thereof is coupled to the inverting input terminal of the comparator 830 while the second fluctuation 820 or an embodiment thereof is coupled to the non-inverting input terminal of the comparator 830.

For demonstration purposes, the present disclosure is described herein by way of example with reference to the fluctuation detection unit 700, wherein the first control signal outputted by the fluctuation detection unit 700 is a high-level signal while the second control signal outputted by the fluctuation detection unit 700 is a low-level signal. However, it is understood that the principle of the present disclosure may be applied to other circuit structures disclosed or not disclosed in the present disclosure. The first control signal and the second control signal may also be in any proper forms.

Figure 18:
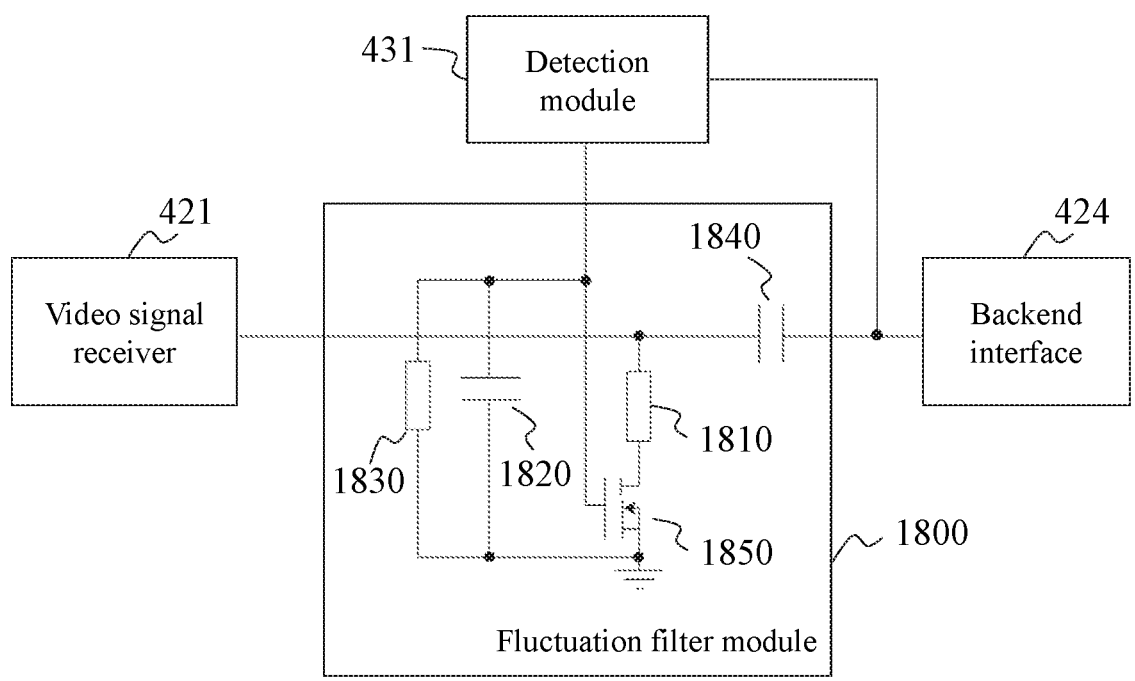
FIG. 18 is a schematic diagram illustrating an exemplary fluctuation filter module according to some embodiments of the present disclosure.

FIG. 18 is a schematic diagram illustrating an exemplary fluctuation filter module according to some embodiments of the present disclosure. Fluctuation filter module (e.g., a circuit or circuits) 1800 is an exemplary embodiment of the fluctuation filter module 432 (e.g., illustrated in FIG. 4).

The fluctuation filter module 1800 may include a capacitor 1820, a capacitor 1840, a resistor 1810, a resistor 1830, and a transistor 1850. For demonstration purposes, the transistor 1850 is described herein by way of example with reference to an n-channel metal-oxide-semiconductor field-effect transistor (MOSFET). However, it is understood that the principle of the transistor 1850 may be applied to all kinds of transistors, which may include bipolar junction transistors (BJTs), field-effect transistors (FETs), or the like, or a combination thereof (e.g., Darlington transistor).

A first terminal of the capacitor 1820, which may be viewed as a first input terminal of the fluctuation filter module 1800, may be coupled to a first terminal of the resistor 1830, a gate terminal of the transistor 1850, and the output terminal of the detection module 431 (or the detection module 531, the fluctuation detection unit 542). A second terminal of the resistor 1830, a second terminal of the capacitor 1820, and a source terminal of the transistor 1850 may be coupled to ground. A drain terminal of the transistor 1850 may be coupled to a first terminal of the resistor 1810. A second terminal of the resistor 1810, which may be viewed as an output terminal of the fluctuation filter module 1800, may be coupled to a first terminal of the capacitor 1840 and the video signal receiver 421. A second terminal of the capacitor 1840, which may be viewed as a second input terminal of the fluctuation filter module 1800, may be coupled to the signal-out terminal of the backend interface 424 (e.g. the second terminal of the capacitor 426).

When a transmitted video signal is having a step change, a first sub-signal of a first frequency band of the video signal may be out of a first preset voltage range, and the detection module 431 (or 531) may transmit a first control signal to the fluctuation filter module 1800. Upon receiving the first control signal, the fluctuation filter module 1800 may remove (e.g., by filtering) a second sub-signal of a second frequency band of the video signal, and transmit a video signal obtained by removing the second sub-signal from the video signal (filtered video signal) to the video signal receiver 421. For example, the first control signal may be a high-level signal, and the transistor 1850 may be turned on. Consequently, the capacitor 1840 and the resistor 1810 may form a high-pass filter circuit, and a sub-signal of a lower frequency band (e.g., the second frequency band) may be removed by the high-pass filter circuit. The sub-signal of which frequency band the high-pass filter circuit may remove may be decided by an electric resistance of the resistor 1810 and a capacitance of the capacitor 1840. In some embodiments of the present disclosure, the sub-signal acquisition unit 600 may filter out a sub-signal of a lower frequency band. For example, the sub-signal acquisition unit 600 may filter out a sub-signal with a frequency lower than 25 Hz. The video signal obtained by removing the second sub-signal (filtered video signal) may then be transmitted to the video signal receiver.

When the transmitted video signal is not having a step change, a first sub-signal of a first frequency band of the video signal may be within the first preset voltage range. The detection module 431 (or 531) may transmit a second control signal to the fluctuation filter module 1800. Upon receiving the second control signal, the fluctuation filter module 1800 may transmit the video signal to the video signal receiver 421. For example, the control signal may be a low-level signal, and the transistor 1850 may be turned off. The capacitor 1840 and the resistor 1820 may not form a low-pass filter circuit, and the capacitor 1840 may only have a function of DC blocking. Consequently, the fluctuation filter module may transmit the received video signal to the video signal receiver 421.

The capacitor 1820 and the resistor 1830 may be optional. When the detection module 431 (or the fluctuation detection unit 542) is transmitting the first control signal (e.g., high-level signal) to the fluctuation filter module 1800, the capacitor 1820 may be charged. When the first control signal is over, the capacitor 1820 and the resistor 1830 may form a closed loop circuit, the capacitor 1820 may be discharged, and the effect of the first control signal on the fluctuation filter module 1800 may be extended. Consequently, the time for the transistor 1850 receiving the first control signal may be prolonged.

It may be noted that, the fluctuation filter module 1800 is only provided for demonstration purposes and is not intended to be limiting. Under a same or similar principle, the fluctuation filter module 1800 (or 432) may take other forms. For example, the capacitor 1820 and the resistor 1830 may be removed from the fluctuation filter module 1800. As another example, the high-pass circuit included in the fluctuation filter module 1800 may take other forms.

Figure 19:
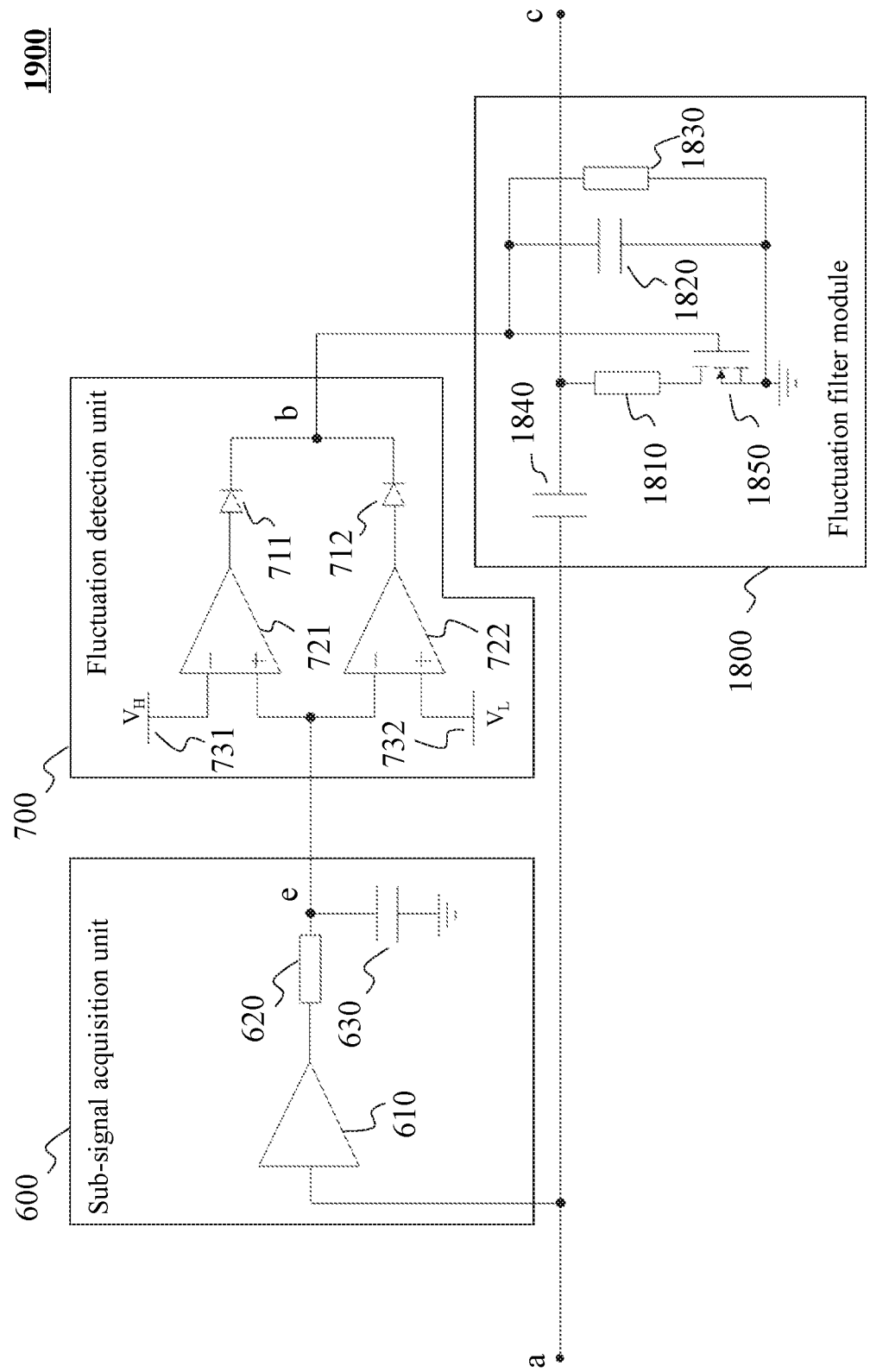
FIG. 19 is a schematic diagram illustrating an exemplary video signal processor according to some embodiments of the present disclosure.

FIG. 19 is a schematic diagram illustrating an exemplary video signal processor according to some embodiments of the present disclosure. Video signal processor 1900 is an exemplary embodiment of the video signal processor 523 (e.g., illustrated in FIG. 5). The video signal processor 1900 may be a combination of the sub-signal acquisition unit 600 illustrated in FIG. 6, the fluctuation detection unit 700 illustrated in FIG. 7, and the fluctuation filter module 1800 illustrated in FIG. 18. The output terminal of the sub-signal acquisition unit 600 may be coupled to the input terminal of the fluctuation detection unit 700. The output terminal of the fluctuation detection unit 700 may be coupled to the first input terminal of the fluctuation filter module 1800. The input terminal of the sub-signal acquisition unit 600, which may be viewed as an input terminal of the video signal processor 1900, may be coupled to the second input terminal of the fluctuation filter module 1800 and the signal-out terminal of the backend interface 424 (point a, e.g. the second terminal of the capacitor 426). The output terminal of the fluctuation filter module 1800 (point a), which may be viewed as an output terminal of the video signal processor 1900, may be coupled to the video signal receiver 421.

It may be noted that, the video signal processor 1900 is only for demonstration purposes and not intended to be limiting. The components of the video signal processor 1900 may be altered or replaced. For example, the fluctuation detection unit 700 may be replace by any proper embodiment of the fluctuation detection unit 800.

For demonstration purpose, the whole signal processor 1900, including a sub-signal acquisition part (the sub-signal acquisition unit 60), a fluctuation detection part (the fluctuation detection unit 700), and a fluctuation filter part (the fluctuation filter module 1800), may be described briefly. The sub-signal acquisition part may include the video drive 610, the resistor 620, and the capacitor 630. The fluctuation detection part may include the comparator 721, the comparator 722, the diode 711, the diode 712, the voltage supply 731, and the voltage supply 732. The fluctuation filter part may include the capacitor 1820, the capacitor 1840, the resistor 1810, the resistor 1830, and the transistor 1850.

The input terminal of the video signal drive 610, which may be viewed as the input terminal of the signal processor 1900, may be coupled to the signal-out terminal (e.g., the second terminal of the capacitor 426) of the backend circuit 424. The output terminal of the video signal drive 610 may be coupled to the first terminal of the resistor 620. The second terminal of the resistor 620 may be coupled to the capacitor 630, the non-inverting input terminal of the comparator 721, and the inverting input terminal of the comparator 722. The second terminal of the capacitor 630 may be coupled to ground. The inverting input terminal of the comparator 721 may be coupled to the voltage supply 731. The output terminal of the comparator 721 may be coupled to the anode of the diode 711. The non-inverting input terminal of the comparator 722 may be coupled to the voltage supply 732. The output terminal of the comparator 712 may be coupled to the anode of the diode 712. The cathode of the diode 711 may be coupled to the cathode of the diode 712, the first terminal of the resistor 1830, the first terminal of the capacitor 1820, and the gate terminal of the transistor 1850. The second terminal of the resistor 1830, the second terminal of the capacitor 1820, and the source terminal of the transistor 1850 may be coupled to ground. The drain terminal of the transistor 1850 may be coupled to the first terminal of the resistor 1810. The second terminal of the resistor 1810 may be coupled to the video signal receiver 421 and the first terminal of the capacitor 1840. The second terminal of the capacitor 1840, which may also be viewed as the input terminal of the signal processor 1900, may also be coupled to the signal-out terminal (e.g., the second terminal of the capacitor 426) of the backend circuit 424.

When a power consumption of the load 412 of the POC system 400 changes, the voltage across the capacitor 426 may also change correspondingly, and the video signal may have a step change after being transmitted through the capacitor 426. After the video signal having the step change passes through the video signal drive 610 and the low-pass filter circuit formed by the resistor 620 and the capacitor 630, only a sub-signal of a lower frequency band, that is, the first sub-signal, may be left and further transmitted.

For example, when the video signal is having a step change, a sub-signal of a lower frequency band may be affected more. If the video signal including the affected sub-signal of the lower frequency band is displayed, a long-time blank screen may be caused. Therefore, only a voltage of the sub-signal of the lower frequency band (e.g., the first sub-signal) of the video signal may need to be detected (or determined). According to prior arts, a cut-off frequency of the low-pass filter circuit formed by the resistor 620 and the capacitor 630 may be set as 25 Hz (or any other proper frequency) through setting the electric resistance of the resistor 620 and the capacitance of the capacitor 630 (or through selecting a resistor and/or a capacitor with required electric resistance or capacitance). After the video signal passes through the low-pass filter circuit, only the sub-signal having a frequency lower than 25 Hz (or any other proper frequency based on the setting of the low-pass filter) may be left at the second terminal of the resistor 620 (point e).

The voltage $V_H$ provided by the voltage supply 731 and the voltage $V_L$ provided by the voltage supply 732 may be an upper limit and a lower limit of the first preset voltage range for detecting the signal fluctuation. When a voltage of the signal passing through the low-pass filter (the first sub-signal) exceed the voltage $V_H$ provided by the voltage supply 731, the comparator 731 may output a high-level signal, and the comparator 732 may output a low-level signal. The diode 711 may be turned on, and the diode 712 may be turned off. Consequently, the signal outputted by the output terminal (point b) of the whole fluctuation detection part (the fluctuation detection unit 700) may be the high-level signal (the first control signal) outputted by the comparator 721.

The high-level signal outputted by the comparator 721 may pass through the diode 711 and be transmitted to the gate terminal of the transistor 1850, and the transistor 1850 may be turned on. The resistor 1810 and the capacitor 1840 may form a high-pass filter circuit, which may remove a second sub-signal of a second frequency band of the video signal.

For example, when the video signal is having a step change, a sub-signal of a lower frequency band may be affected more. If the video signal including the affected sub-signal of the lower frequency band is displayed, a long-time blank screen may be caused. Therefore, only the sub-signal of the lower frequency band (e.g., the second sub-signal) of the video signal may need to be removed. According to prior arts, a cut-off frequency of the high-pass filter circuit formed by the resistor 1810 and the capacitor 1840 may be set as 25 Hz (or any other proper frequency) through setting the electric resistance of the resistor 1810 and the capacitance of the capacitor 1840 (or through selecting a resistor and/or a capacitor with required electric resistance or capacitance). The sub-signal with a frequency lower than 25 Hz (or any other proper frequency based on the setting of the high-pass filter) may be removed. It may be noted that, the second frequency band may be the first frequency band, or further include an adjacent frequency band.

The voltage at the signal-out terminal of the backend interface 424 (e.g., at the second terminal of the capacitor 426) may return back to its normal state or original state (a supposed voltage without a step change) gradually. When a voltage of the signal passing through the low-pass filter (the first sub-signal) is within the first preset voltage range, the comparators 721 and 722 may both output a low-level signal, and both of the diodes 711 and 712 may be turned off. Consequently, the signal outputted by the output terminal of the whole fluctuation detection part (the fluctuation detection unit 700) may be a low-level signal (the second control signal), and the transistor 1850 may be turned off. The resistor 1810 and the capacitor 1840 may not form a high-pass filter, and the capacitor 1840 may only have a function of DC blocking. The video signal received by the video signal processor 1900 may be transmitted to the video signal receiver 421 through only the capacitor 1840, without removing the second sub-signal.

Figure 20:
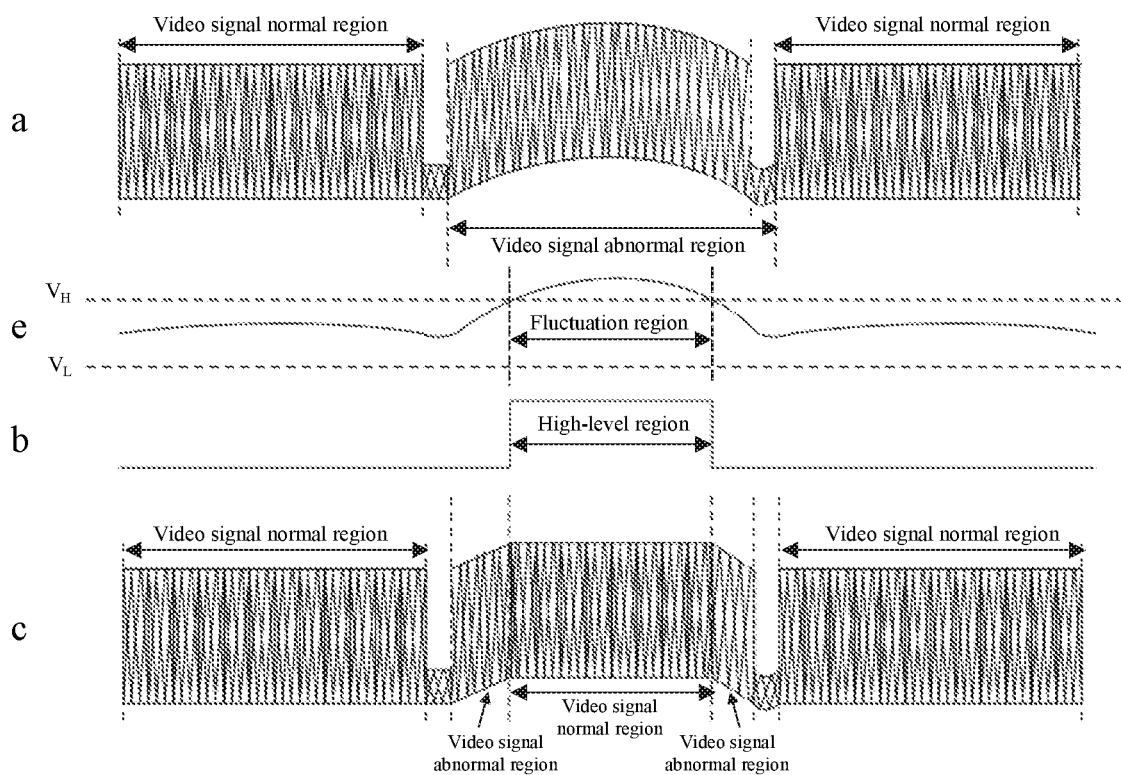
FIGS. 20 and 21 are schematic diagrams illustrating the signals at different points of the video signal processor illustrated in FIG. 19.
Figure 21:
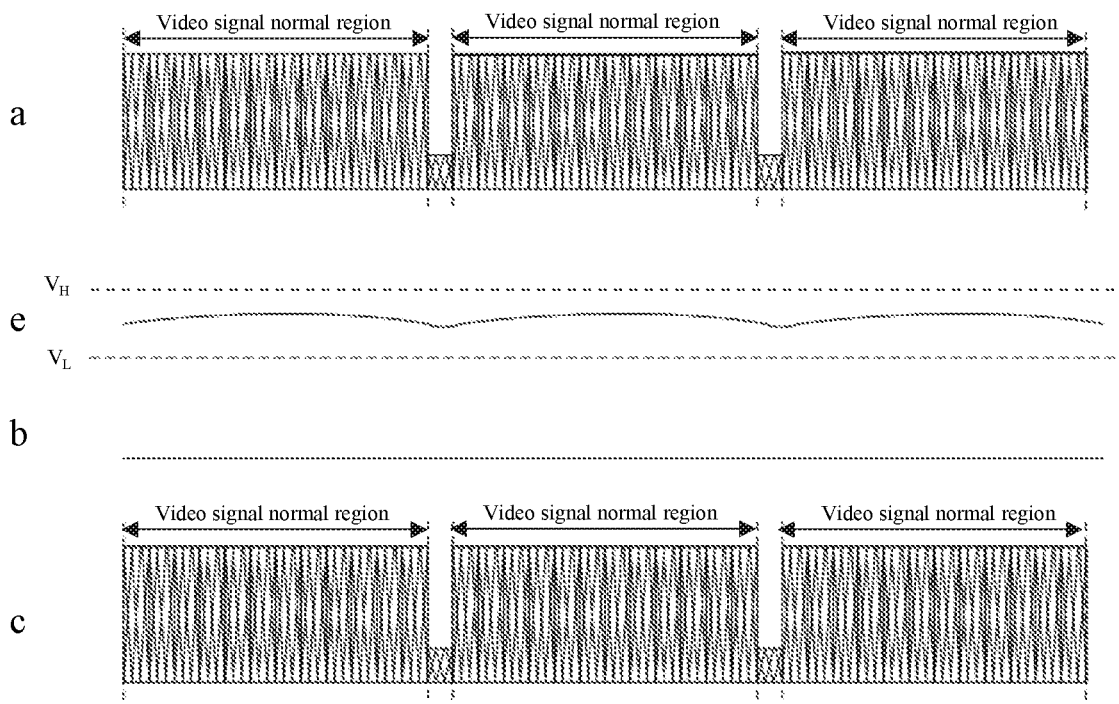

For demonstrations purposes, the signals at the points a, b, c, e are illustrated in FIGS. 20 and 21.

FIGS. 20 and 21 are schematic diagrams illustrating the signals at different points of the video signal processor illustrated in FIG. 19.

FIG. 20 illustrate the signals at the points a, e, b, c of the video signal processor 1900 when a video signal transmitted by the POC system 400 is having a step change. The portion of the video signal within a video signal abnormal region (e.g., caused by a step change of the video signal) may not be normally received by the video signal receiver 421 and/or displayed (e.g., by the display 141), causing a long-time blank screen during the displaying of the video signal. The portion of the video signal within a video signal normal region may be normally received by the video signal receiver 421 and/or displayed (e.g., by the display 141), and a long-time blank screen may not occur. As shown in FIG. 20, when a video signal abnormal region is included in a signal (the video signal transmitted from the backend interface) at the point a, the signal at the point e (first sub-signal) may include a fluctuation region corresponding to the video signal abnormal region, and a voltage of the fluctuation region may exceed the voltage $V_H$ provided by the voltage supply 731. Correspondingly, the signal at the point b may include a high-level region corresponding to the fluctuation region, the signal of which may become a high-level signal (first control signal). Consequently, a region of the signal at the point c (filtered video signal) corresponding to the high-level region (or the fluctuation region) may become a video signal normal region from a video signal abnormal region, and the size of the video signal abnormal region as well as the time of blank screen during the display of the video signal may be reduced without adopting the constant-current control technique. Problems related to an over-sized system and an increase of the hardware cost caused by the constant-current control technique may be avoided.

FIG. 21 illustrate the signals at the points a, e, b, c of the video signal processor 1900 when a video signal transmitted by the POC system 400 is not having a step change. The video signal may not include any video signal abnormal region. The voltage of the first sub-signal may be within the first preset voltage range, and the first control signal may not be outputted by the fluctuation detection unit 700 (only the second control signal is presented). Consequently, a removing of the second sub-signal may not be performed, and the signals at the point a and the point c may be substantially identical.

Figure 22:
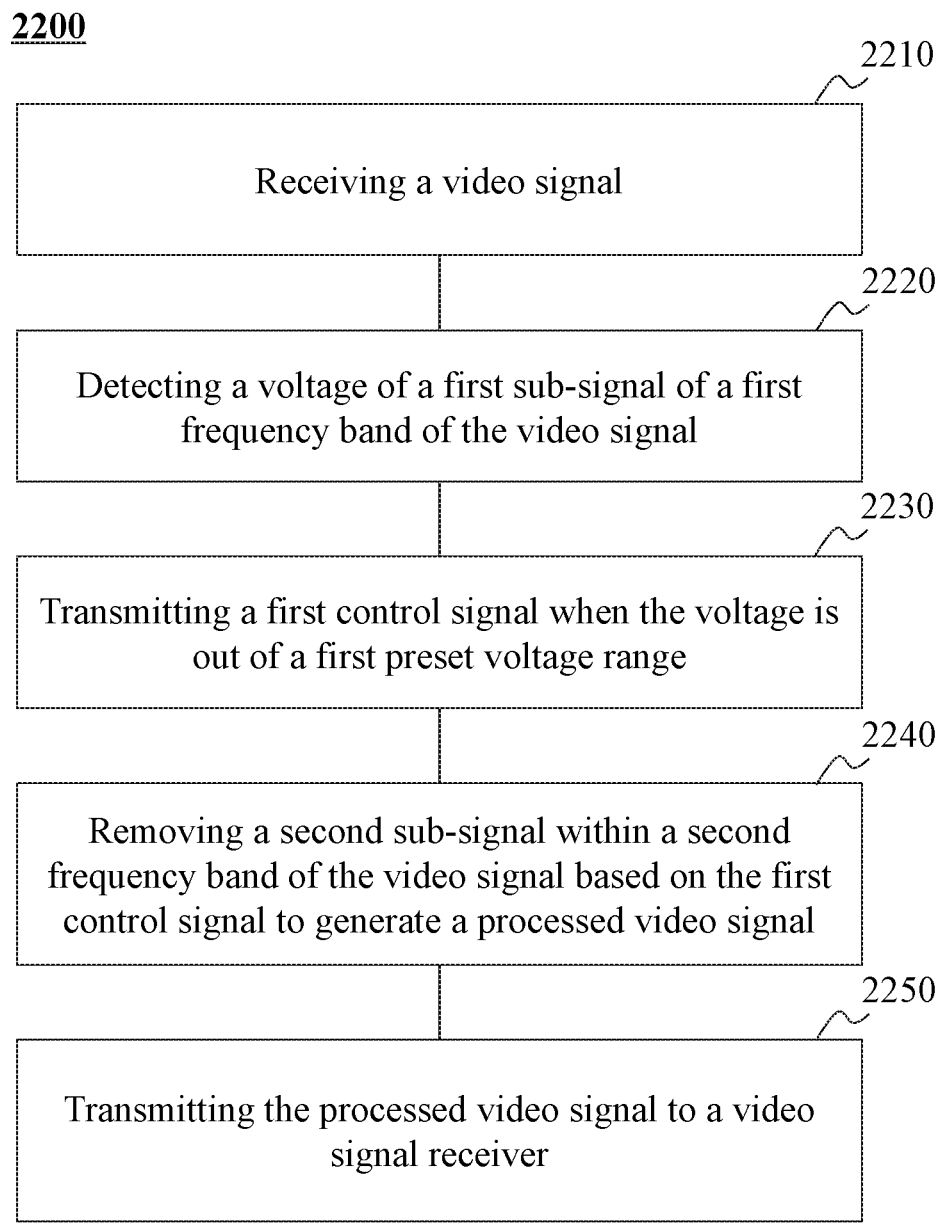
FIG. 22 is a schematic diagram illustrating an exemplary dynamic processing of a video signal in response to a real-time detection of a step-change of the video signal according to some embodiments of the present disclosure.

FIG. 22 is a schematic diagram illustrating an exemplary dynamic processing of a video signal according to some embodiments of the present disclosure. Process 2200 may be performed by the video signal processor 423 (e.g., illustrated in FIG. 4) or an embodiment thereof.

In 2210, a video signal may be received by the video signal processor 423 (or 523). The video signal may be outputted by the video signal transmitter 411, transmitted through the coaxial cable 430, separated from the power supply (by the backend interface 424), and then transmitted to the video signal processor 423 from the signal-out terminal of the backend interface 424.

In 2220, the detection module 431 (or the fluctuation detection unit 542) may detect a voltage of a first sub-signal of a first frequency band of the video signal. In some embodiments, the detection module 431 (or the sub-signal acquisition unit 541) may obtain (or isolate) the first sub-signal from the video signal, and then obtain the voltage of the first sub-signal. Alternatively or additionally, the detection module 431 may directly obtain the voltage without isolating the first sub-signal from the video signal (e.g., by analyzing the waveform of the video signal). The voltage detection may be performed in real-time.

In 2230, the detection module 431 (or the fluctuation detection unit 542) may transmit a first control signal when the voltage is out of a first preset voltage range. The step-change of the transmitted video signal may cause the voltage of the first sub-signal to be out of the first preset voltage. In response to the step-change detected in real-time, the detection module 431 may transmit the first control signal to the fluctuation filter module 432, initiating a dynamic processing of the video signal.

In 2240, the fluctuation filter module 432 may remove a second sub-signal of a second frequency band of the video signal upon receiving the first control signal to generate a filtered video signal. The second sub-signal of the second frequency band may include the sub-signal affected by the step-change of the video signal, by removing the second sub-signal, the filtered video signal may be normally received and/or displayed.

In some embodiments, the filtered video signal may be further compensated for signal loss or signal attenuation and a compensated video signal may be obtained. The compensation may be performed by the video signal processor 423 or an embodiment thereof. Both of the filtered video signal and the compensated video signal may be referred to as a processed video signal.

In 2250, the filtered video signal may be transmitted to the video signal receiver 421. If a signal compensation is performed upon the filtered video signal, the compensated video signal may be transmitted to the video signal receiver 421.

As described herein, the first frequency band and the second frequency band may be the same or different. In some embodiments, the second frequency band may cover the first frequency band and an adjacent frequency band. As a sub-signal (or video signals) of a lower frequency band of the video signal may be affected more by the step change, in order to determining whether the video signal is abnormal, the first sub-signal for fluctuation detection may also be the sub-signal of the lower frequency band. For removing the sub-signal being affected more by the step-change, the second sub-signal being removed from the video signal may also be a sub-signal of a lower frequency band. In some embodiments, the first frequency band may be included in the second frequency band. For example, the first frequency band may be the same as the second frequency band. When the voltage of the first sub-signal is out of the present range, the video signal may be determined as abnormal, and the sub-signal of the first frequency band (including the first sub-signal) of the video signal may be determined as abnormal. As the first frequency band is the same as the second frequency band, the removed second sub-signal is the determined abnormal signal. The video signal obtained by removing the second sub-signal (filtered video signal) may then be transmitted to the video signal receiver 421. The filtered video signal may be successfully displayed, ensuring that a long-time blank screen may not occur during a displaying (e.g., by the display 141) of the filtered video signal received by the video signal receiver 421. In other words, when it is detected that (by the detection module 423) a voltage of a first sub-signal is out of the first preset voltage range, the sub-signal of the first frequency band (including the first sub-signal) may be removed (by the fluctuation filter module 432). It is understood that, when the sub-signal of the first frequency band is removed, sub-signals of another frequency band (e.g., an adjacent frequency band) may also be removed as well (the second frequency band may include the first frequency band and the another frequency band).

In some embodiments, when the video signal is not determined as abnormal (e.g., a voltage of the first sub-signal is within the first preset voltage range), the fluctuation filter module 432 may not remove the second sub-signal. The process 2200 may further comprise: generating (e.g., by the detection module 431 or the fluctuation detection unit 542) a second control signal when a voltage of the first sub-signal is within the first preset voltage range; and transmitting, based on the second control signal, the video signal to the video signal receiver without filtering the second sub-signal. When the voltage of the first sub-signal is within the first preset voltage range, the video signal may be determined as normal, and a filtering is not needed. The video signal received by the fluctuation filter module 432 may be transmitted to the video signal receiver without filtering the second sub-signal, so that a normal video signal may not be processed by the video signal processor 423 or 523.

It may be noted that the above descriptions of the dynamic processing of a video signal are only for demonstration purposes, and not intended to limit the scope of the present disclosure. It is understandable that, after learning the major concept and the mechanism of the present disclosure, a person of ordinary skill in the art may alter process 2200 in an uncreative manner. For example, the operations above may be implemented in an order different from that illustrated in FIG. 22. One or more optional operations may be added to the flowcharts. One or more operations may be divided or be combined. All such modifications are within the protection scope of the present disclosure.

Figure 23:
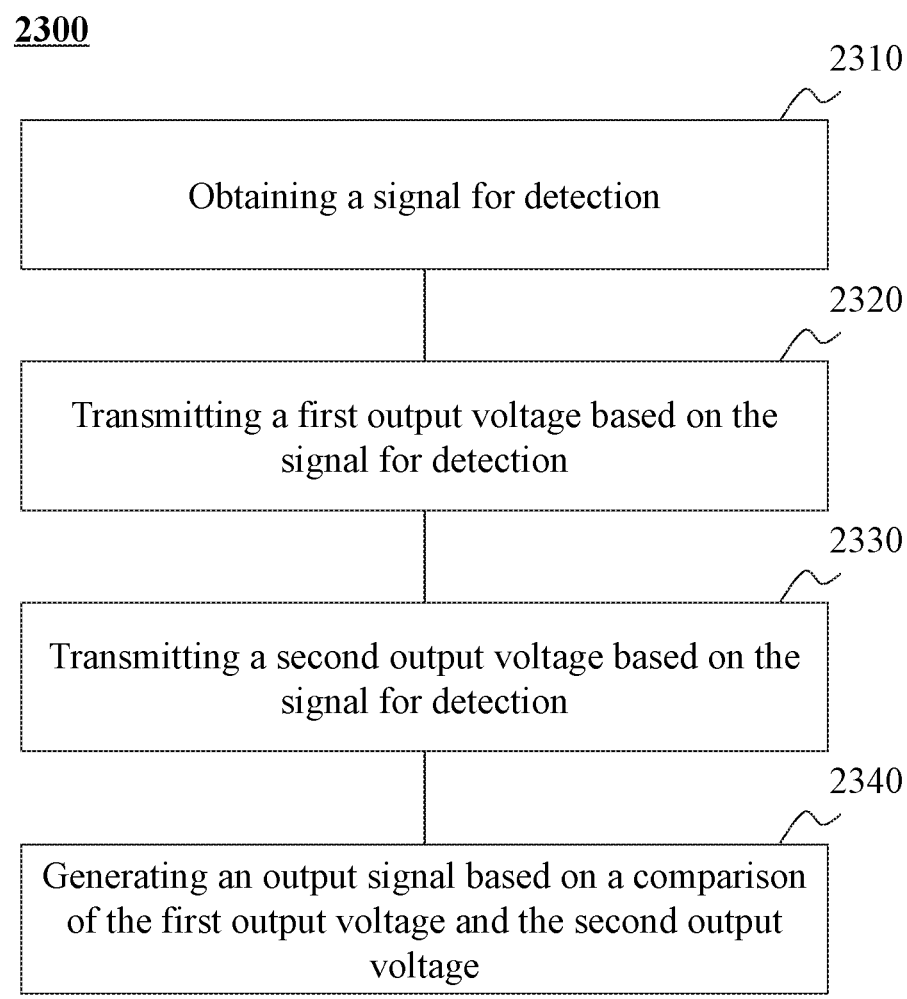
FIG. 23 is a schematic diagram illustrating an exemplary process for a fluctuation detection of a signal according to some embodiments of the present disclosure.

FIG. 23 is a schematic diagram illustrating an exemplary process for a fluctuation detection of a signal (e.g., the first sub-signal) according to some embodiments of the present disclosure. Process 2300 may be performed by the fluctuation detection unit 800 illustrated in FIG. 8 or an embodiment thereof. When a voltage of the signal for the fluctuation detection is out of a first preset voltage range, the signal may be determined as having a fluctuation. In some embodiments, process 2300 may be performed to achieve operation 2230 of process 2200 illustrated in FIG. 22.

In 2310, the fluctuation detection unit 800 may obtain a signal for detection. The signal for detection may be a first sub-signal of the video signal transmitted in the POC system 500 when the fluctuation detection unit 800 is integrated in to the POC system 500. The signal for detection may also be any designated signal when the fluctuation detection unit 800 is integrated in other signal related systems for determining if the designated signal is out of the first preset voltage range.

In 2320, the first fluctuation unit 810 may output a first output signal based on the signal for detection. When the signal for detection is having a first fluctuation, the first output voltage may be equal to a sum of a first reference voltage and an amplitude (in the form of a voltage) of the first fluctuation. Otherwise (e.g., when the signal for detection is not having a first fluctuation), the first output voltage may be equal to the first reference voltage.

In 2330, the second fluctuation unit 810 may output a second output voltage based on the signal for detection. When the signal for detection is having a second fluctuation, the second output voltage may be equal to a difference between a second reference voltage and an amplitude (in the form of a voltage) of the second fluctuation. Otherwise (e.g., when the signal for detection is not having a first fluctuation), the second output voltage may be equal to the second reference voltage.

The first fluctuation may be in the form of a positive wave. In some embodiments, the first fluctuation may include a positive pulse (e.g., a rectangle pulse, a triangle pulse, a trapezoidal pulse). The second fluctuation may be in the form of a negative wave. In some embodiments, the second fluctuation may include a negative pulse (e.g., a rectangle pulse, a triangle pulse, a trapezoidal pulse).

The second reference voltage may be larger than the first reference voltage. The difference between the second reference voltage and the first reference voltage may correspond to an allowable voltage range (the first preset voltage range) of an amplitude of the signal for detection. In some embodiments, the first reference voltage may be equal to a voltage of the signal for detection without a fluctuation. Alternatively, the second reference voltage may be equal to the voltage of the signal for detection without a fluctuation.

In 2340, the comparator 830 may transmit an output signal based on a comparison of the first output voltage and the second output voltage. In some embodiments, the output signal may be a first control signal when the signal for detection is having a fluctuation (no matter the first fluctuation or the second fluctuation) with an amplitude (or voltage) out of the first preset voltage range, the output signal may be a second control signal when the signal for detection is having a fluctuation (not matter the first fluctuation or the second fluctuation) with an amplitude (or voltage) within the first preset voltage range. The output signal may be a high-level signal or a low-level signal based on the first output voltage, the second output voltage, and the connection manner between the comparator 830, the first fluctuation unit 810 and the second fluctuation unit 820. Detailed descriptions of the generating the output signal are provided elsewhere in the present disclosure (e.g., in connection with FIGS. 8, 12, 14, and 17), which are not repeated here.

In some embodiment, the first fluctuation unit 810 may be coupled to the non-inverting input terminal of the comparator 830, and the second fluctuation unit 820 may be coupled to the inverting terminal of the comparator 830. When the first output voltage is higher than the second output voltage, the output signal may be a high-level signal, indicating that the signal for detection is having a fluctuation with an amplitude out of the allowable voltage range. When the first output voltage is lower than or equal to the second output voltage, the output signal may be a low-level signal, indicating that the signal for detection is not having a fluctuation or having a fluctuation with an amplitude within the allowable voltage range. If the fluctuation detection unit 542 is integrated in to the POC system 500. The high-level output signal may serve as the first control signal, and the low-level output signal may serve as the second control signal.

Figure 24:
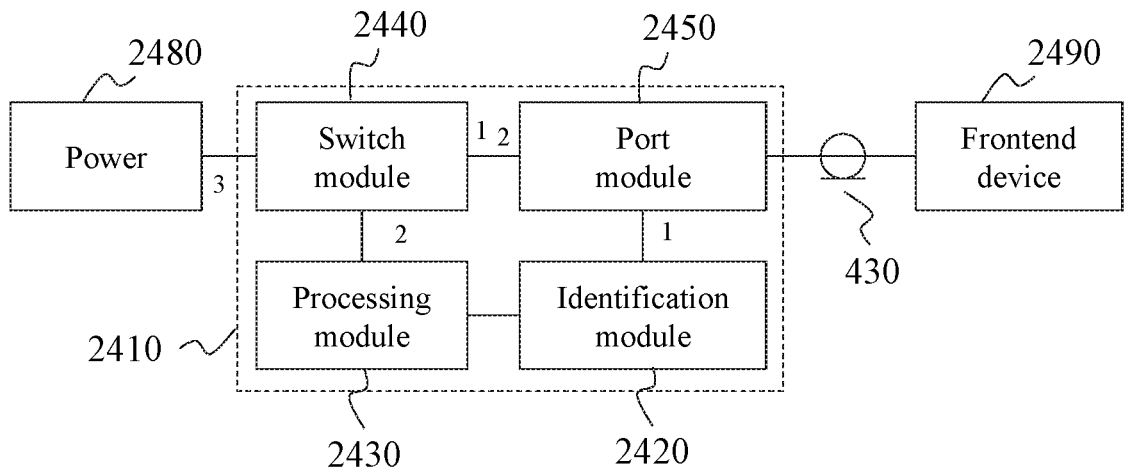
FIG. 24 is a schematic diagram illustrating an exemplary backend interface according to some embodiments of the present disclosure.

FIG. 24 is a schematic diagram illustrating an exemplary backend interface according to some embodiments of the present disclosure. Backend interface 2410 is an exemplary embodiment of the backend interface 124 (e.g., illustrated in FIG. 1). The backend interface 2410 may also be an exemplary embodiment of the backend interface 424 (e.g., illustrated in FIG. 4). The backend interface 2410 may be included in a backend device 2400, which may be an exemplary embodiment of the backend device 120 (or 420). The backend interface 2410 may be configured to determine a frontend device 2490 connecting with or plugged into the backend interface 2410 is a POC device or a non-POC device. The frontend device 2490 may be an exemplary embodiment of the signal side device 110 (or 410). If a POC device is connecting with the backend interface 2410, the backend interface 2410 may provide power supply (electric current) to the POC device through a coaxial cable 430. If a non-POC device is connecting with the backend interface 2410, the backend interface 2410 may not provide power supply to the non-POC device.

A POC device is a frontend device capable of receiving power supply from a backend device such as the backend device 430 or an embodiment thereof through a coaxial cable while transmit signals (e.g., video signals) to the backend device through the same coaxial cable. A non-POC device is a frontend device that may only transmit signals through a coaxial cable to a backend device and may need an additional cable or electric path for receiving power supply (electric current). Transmitting power supply through the coaxial cable for transmitting signals to a non-POC device may cause the non-POC device to be burned out. It may be noted that, the term "POC device" or "non-POC device" may be referred when the related power supply and signal transmission system is a POC system. For any other MTSP system, a "POC device" may be equivalent to a frontend device that supports a MTSP transmission, a "non-POC device" may be equivalent to a frontend device that does not support the MTSP transmission.

The backend device 2400 may include a power 2480, and a backend interface 2410. The power 2480 and the backend interface 2410 may be exemplary embodiments of the power 122 and the backend interface 124, respectively, the descriptions of which are not repeated here. The backend interface (e.g., a circuit or circuits) 2410 may include an identification module (e.g., a circuit or circuits) 2420, a processing module (e.g., a circuit or circuits) 2430, a switch module (e.g., a circuit or circuits) 2440, and a port module (e.g., a circuit or circuits) 2450. A first terminal of the port module 2450 may be coupled to a first terminal of the identification module 2420. A second terminal of the port module 2450 may be coupled to a first terminal of the switch module 2440. A second terminal of the identification module 2420 may be coupled to a first terminal of the processing module 2430. A second terminal of the processing module 2430 may be coupled to a second terminal of the switch module 2440. The switch module 2440 may further include a third terminal for connecting with the power 422 or a signal blocking module (e.g., the signal blocking module 425). The port module 2450 may include a port, which may serve as a backend cable terminal of the backend interface 2400, for plugging in the frontend device 2490 through a coaxial cable 430.

In some embodiments, the backend device 2400 may be configured to only provide power supply to a frontend device 2490 that is a POC-device. The third terminal of the switch module 2440, which may be viewed as a power-in terminal of the backend interface 2410, may be directly coupled to the power 2480 (as illustrated in FIG. 24).

Figure 27:
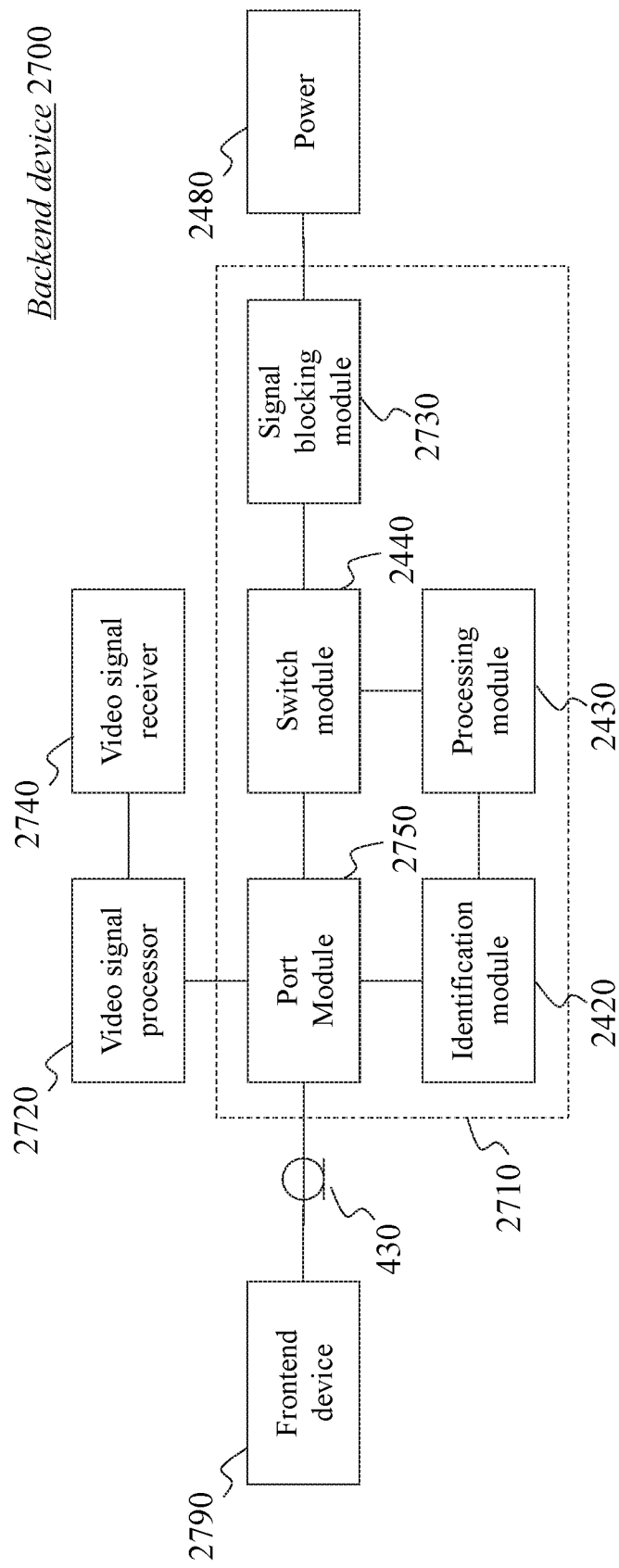
FIG. 27 is a schematic diagram illustrating an exemplary backend device according to some embodiments of the present disclosure.

In some embodiments, the backend device 2400 may be configured to provide power supply to a frontend device 2490 and receive a video signal (e.g., a video signal) transmitted by the frontend device 2490 simultaneously. The backend interface 2410 may further include a signal blocking module (e.g., the signal blocking module 425 illustrated in FIG. 4) for separating the video signal from the power supply provided by the power 2480. The third terminal of the switch module 2440 may be coupled to a first terminal of the signal blocking module. A second terminal of the signal blocking module, which may be viewed as a power-in terminal of the backend interface 2410, may be coupled to the power 422 (e.g., as illustrated in FIG. 27). The port module 2450 may further include a third terminal, which may serve as a signal-out terminal of the backend interface 2400, for connecting with the video signal processor 123 or an embodiment thereof. In some embodiments, the port module 2450 may further include a power supply blocking unit (e.g., the capacitor 416 illustrated in FIG. 4) for blocking the power supply received by the power-in terminal of the backend interface 2410 while allow a pass of a signal received by the power-in terminal of the backend interface 2410.

The identification module 2420 may connect with the port module 2450 and the processing module 2430. The port module 2450 may include a port for connecting with a frontend device 2490 through the coaxial cable 430. In some embodiments, the port module 2450 may include one or more ports for plugging in one or more frontend devices through one or more coaxial cables 430.

The identification module 2420 may be configured to obtain a voltage across the frontend device 2490 (or a voltage at the port of the port module 2450) in real-time when the power supply (e.g., DC current) provided by the power 422 has not been transmitted to the frontend device 2490 (or the coaxial cable 430). In other words, the identification module 2420 may monitor a voltage at the port of the port module 2450. The identification module 2420 may determine whether a frontend device 2490 is plugged into the backend device 2400 (or the port or the port module 2450) based on the voltage obtained in real-time. For example, upon obtaining a voltage equal to a first predetermined voltage, the identification module 2420 may determine that a frontend device 2490 is plugged into the port module 2450. The identification module 2420 may also adopt other techniques known in the art to determine whether a frontend device 2490 (or any other devices) is plugged into the backend device 2400. The identification module 2420 may be implemented by software or hardware.

Upon determining that a frontend device 2490 is plugged into the backend device 2400, the identification module 2420 may determine a rise time of the voltage at the port of the port module 2450. For example, upon obtaining a voltage equal to the first predetermined voltage, the identification module 2420 may set a current time point (the time point when the voltage obtained or detected by the identification module 2420 is the first predetermined voltage) as a first time point; upon obtaining a voltage equal to a second predetermined voltage, the identification module 2420 may set a current time point (the time point when the voltage obtained or detected by the identification module 2420 is the second predetermined voltage) as a second time point. The second predetermined voltage may be higher than the first predetermined voltage. The identification module 2420 may then determine a rise time (a time during which the obtained voltage is varied from the first predetermined voltage to the second predetermined voltage) based on the first time point and the second time point. The identification module may transmit the determined rise time to the processing module 2430 (e.g., in the form of a signal or data).

If the identification module 2420 determines that there is no frontend device 2490 plugged into the backend device 2400 (or the port or the port module 2450), the identification module 2420 may continue monitoring the voltage at the port of the port module 2450.

The processing module 2430 may connect with the identification module 2420 and the switch module 2440. The power 122 may be coupled to a power-in terminal of the backend interface 2410. In some embodiments, the power 122 may connect with the switch module 2440 (e.g., as illustrated in FIG. 24). The switch module 2440 may also connect with the port module 2450. The processing module 2430 may be configured to receive the rise time transmitted by the identification module 2420 and determine whether the rise time is within a preset time range. Upon determining that the rise time is within the preset time range, the processing module 2430 may determine that the frontend device 2490 connecting with the port module 2450 is a POC device and turn on the switch module 2440. The power 422 may then provide power supply (electric current) to the frontend device 2490 through the switch module 2440, the port module 2450, and the coaxial cable 430. Upon determining that the rise time is out of the preset time range, the processing module 2430 may determine that the frontend device 2490 connecting with the port module 2450 is not a POC device and turn off the switch module 2440. Then, the frontend device 2490 may not receive the power supply from the power 422. The processing module 2430 and the switch module 2440 may be implemented by software or hardware.

The processing module 2430 and the identification module 2420 may be integrated into a same chip or a same circuit. Alternatively, the processing module 2430 and the identification module 2420 may be implemented by different chips or circuits. In some embodiments, the processing module 2430 and the identification module 2420 may further include circuits or electric components facilitate their jobs.

In some embodiments, the identification module 2420 may connect with the port module 2450 and the processing module 2430. The port module 2450 may connect with a frontend device through a coaxial cable 430. The switch module 2440 may connect with the power 422 and the port module 2450 respectively. When the switch module 2440 is turned on, the backend device 2400 may be at a power-out mode (the state at which the backend device 2400 provides power supply to the connected frontend device 2490). If a frontend device 2490 is connecting with the port module 2450 when the backend device 2400 is at the power-out mode, the power 422 may provide power supply to the connected frontend device 2490. If a non-POC device is connecting with the backend device 2400 when the backend device 2400 is at the power-out mode, the frontend device 2490 may be burned out. In order to prevent a non-POC device connecting with the backend device 2400 from being burned out, the switch module 2440 may be turned off during the determination whether the connected frontend device 2490 is a POC device. That is, the determination whether the connected frontend device 2490 is a POC device is performed when the backend device 2400 is at a power-cut mode (the state at which the backend device 2400 does not provide power supply to the connected frontend device 2490).

When the backend device 2400 is at the power-cut mode, the identification module 2420 may obtain a voltage across the frontend device 2490 (or a voltage at the port of the port module 2450) in real-time. The identification module 2420 obtaining the voltage may be implemented by software and/or a circuit. When the port module 2450 is not connecting with a frontend device 2490, the voltage obtained by the identification module 2420 may be at a higher voltage level. When the port module 2450 is connecting with a frontend device 2490, the identification module 2420, the port module 2450, the frontend device 2490, and the coaxial cable 430 may form an electric path, and the voltage obtained by the identification module 2420 may be at a lower voltage level. Therefore, at the moment of a frontend device 2490 being connected with the port module 2450, a voltage across the frontend device 2490 or the port of the port module 2450 may be stored as a first predetermined voltage in the identification module 2420. When a voltage obtained by the identification module 2420 is the first predetermined voltage, the identification module 2420 may determine that a frontend device 2490 is connecting with the port module 2450, and set a current time point (the time point when the voltage obtained or detected by the identification module 2420 is the first predetermined voltage) as a first time point.

Figure 39:
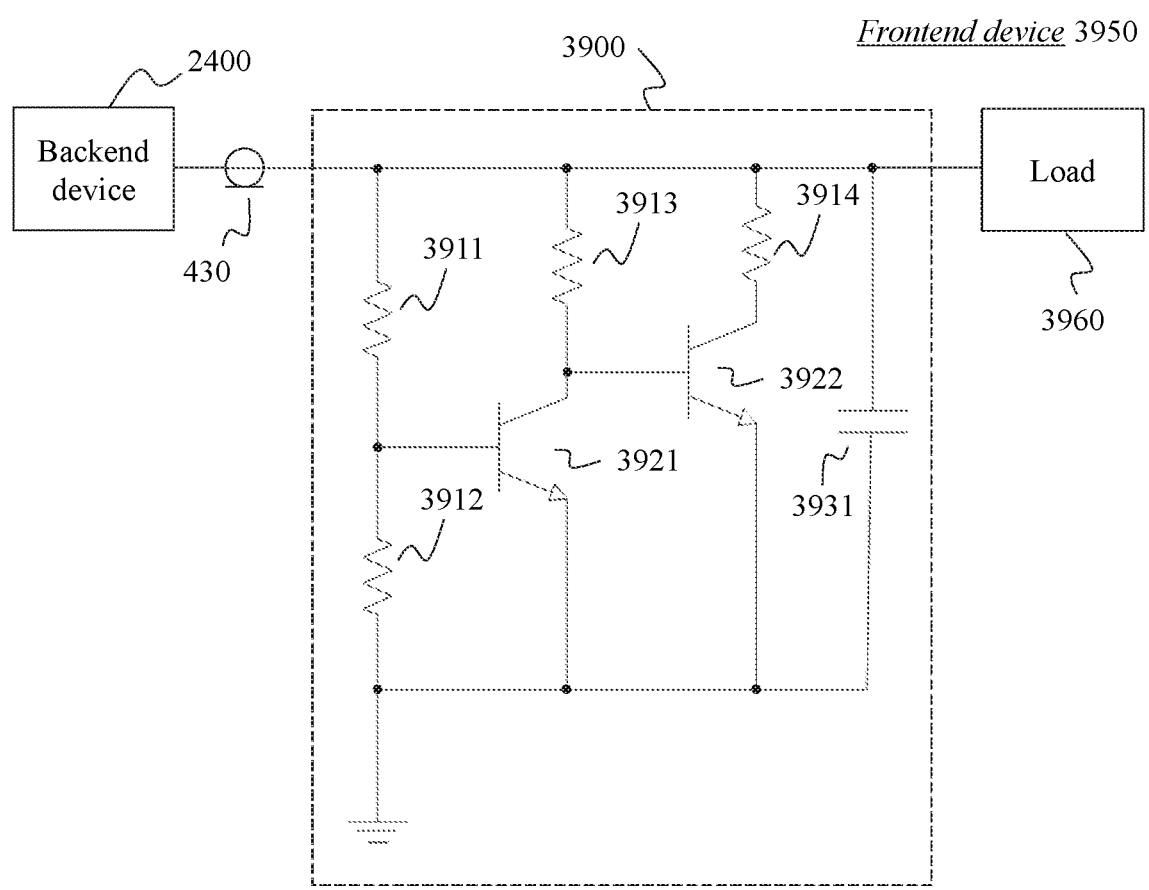
FIG. 39 is a schematic diagram illustrating an exemplary frontend interface according to some embodiments of the present disclosure.
Figure 43:
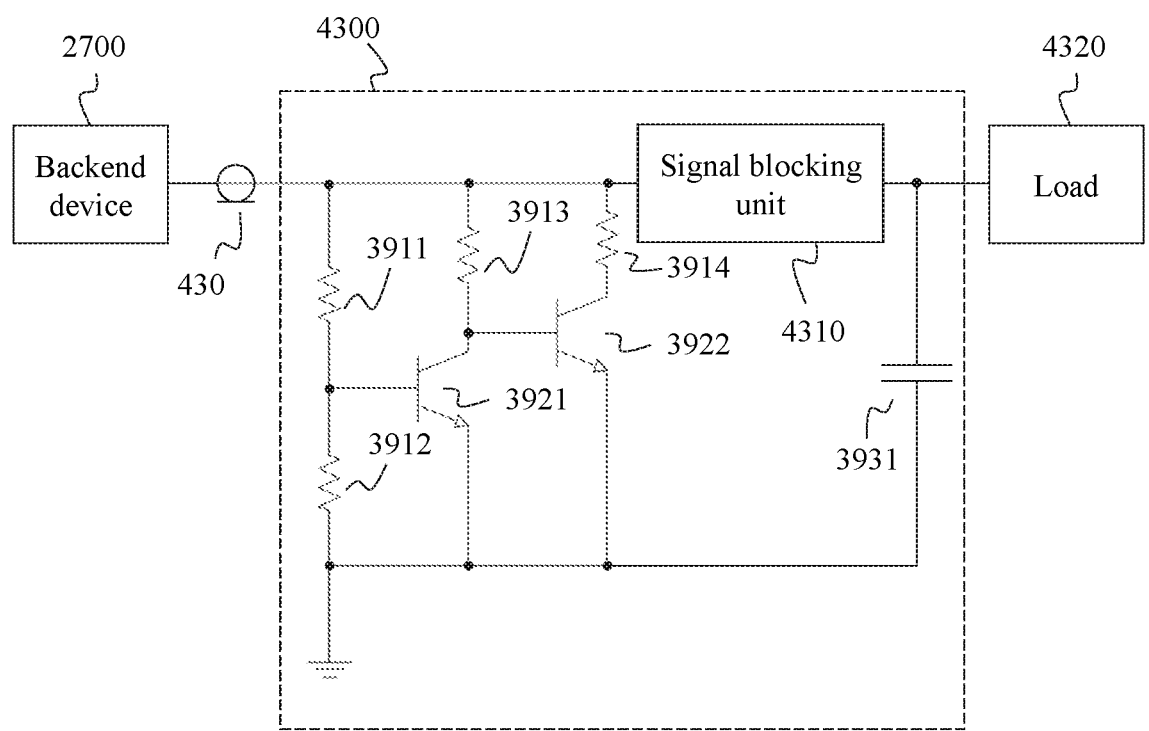
FIG. 43 is a schematic diagram illustrating an exemplary signal blocking module according to some embodiments of the present disclosure.

In some embodiments, the frontend device 2490 may include a featured capacitor (e.g., as illustrated in FIGS. 39 and 43). When a frontend device 2490 is plugged into the backend device 2400, during a certain time interval, a voltage across the frontend device 2490 may increase. The identification module 2420 may store a second predetermined voltage, which is higher than the first predetermined voltage. When a voltage obtained by the identification module 2420 is the second predetermined voltage, the identification module 2420 may set a current time point (the time point when the voltage obtained or detected by the identification module 2420 is the second predetermined voltage) as a second time point. Based on the first time point and the second time point, the identification module 2420 may determine a rise time of the voltage across the frontend device 2490, and transmit the determined rise time to the processing module 2430.

Figure 25:
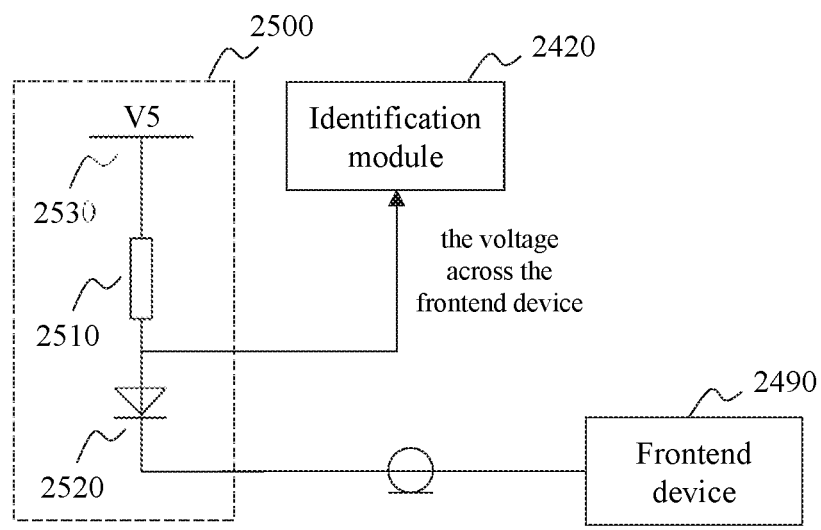
FIG. 25 is a schematic diagram illustrating an exemplary circuit for obtaining a voltage across a frontend device according to some embodiments of the present disclosure.

In some embodiments, the identification module 2420 may obtain a voltage across the frontend device (or a voltage at the port of the port module 2450) using a circuit illustrated in FIG. 25.

It may be noted that, the above description about the backend device 2400 is only for illustration purposes, and is not intended to limit the present disclosure. It is understandable that, after learning the major concept and the mechanism of the present disclosure, a person of ordinary skill in the art may alter the backend device 2400 in an uncreative manner. The alteration may include combining and/or splitting modules or units, adding or removing optional modules or sub-modules, etc. All such modifications are within the protection scope of the present disclosure. It may also be understood that, the connection relationship between the modules and/or units of the backend device 2400 are also only for demonstration purposes and not intended to be limiting, and may be varied accordingly when modules or units of the backend device 2400 are combined or split, and/or when optional modules or units are added or removed.

FIG. 25 is a schematic diagram illustrating an exemplary circuit for obtaining a voltage across a frontend device according to some embodiments of the present disclosure. The identification module 2420 may obtain a voltage across a frontend device 2490 (or a voltage at the port of the port module 2450) through a circuit 2500. The circuit 2500 may include a resistor 2510, a diode 2520, and a voltage supply 2530. The circuit 2500 may be included in the port module 2450 or the identification module 2420.

A first terminal of the resistor 2510 may be coupled to the voltage supply 2530, and a second terminal of the resistor 2510 may be coupled to an anode of the diode 2520. A cathode of the diode 2520 may connect with the coaxial cable 430 or be coupled to the port module 2450. The second terminal of the resistor 2510 may be coupled to the identification module 2420 or a component of the identification module 2420 for obtaining the voltage across the frontend device 2490. The voltage supply 2530 may output a voltage V5 (e.g., 1.2 V, 1.5 V, 3.3 V, 5V, or any other proper value).

At the moment a frontend device 2490 is plugged into a backend device (e.g., the backend device 2400) including the circuit 2500, the backend device may be at a power-cut mode. The anode 2520 may be turned on, and a current outputted by the voltage supply 2530 may be transmitted to the signal side device 410 through the resistor 2510 and the diode 2520. At the moment the current is transmitted, a step signal with a very high frequency may be generated. As the step signal has a very high frequency, a featured capacitor (e.g., capacitor 3931 as illustrated in FIGS. 39 and 43) of the frontend device 2490 may have an impedance of 0 (proximate) towards the step signal. Consequently, at the moment the frontend device 2490 is plugged into the backend device, a voltage of 0 (proximate) may be obtained by the identification module 2420. When the frontend device 2490 is not plugged into the backend device, a voltage equal to the voltage V5 may be obtained by the identification module 2420.

In some embodiments, the identification module 2420 may obtain the voltage at the port or the voltage across the frontend device 2490 based on the voltage V5 and a voltage across the resistor 2510. For example, the identification module 2420 may first obtain the voltage across the resistor 2510, then obtain the voltage at the port or the voltage across the frontend device 2490 by subtracting the voltage across the resistor 2510 from the voltage V5.

In some embodiments, the first predetermined voltage stored in the identification module 2420 may be 0 (or any other proper value). Upon obtaining a voltage of 0, the identification module 2420 may determine that a frontend device 2490 is plugged into the port module 2450 and set the current time point as the first time point. The identification module 2420 may also store a second predetermined voltage that is higher than the first predetermined voltage and lower than the voltage V5 outputted by the voltage supply 2530). For example, the voltage V5 may be 3.3 V, and the second predetermined voltage may be 1.2 V, 1.5 V, 2.2 V, 2.3 V, 3.0 V, etc. Upon obtaining a voltage equal to the second predetermined voltage, the identification module 2420 may set the current time point as the second time point. Based on the first time point and the second time point, the identification module 2420 may determine a rise time of the voltage across the frontend device 2490 and transmit the determined rise time to the processing module 2430.

Figure 26:
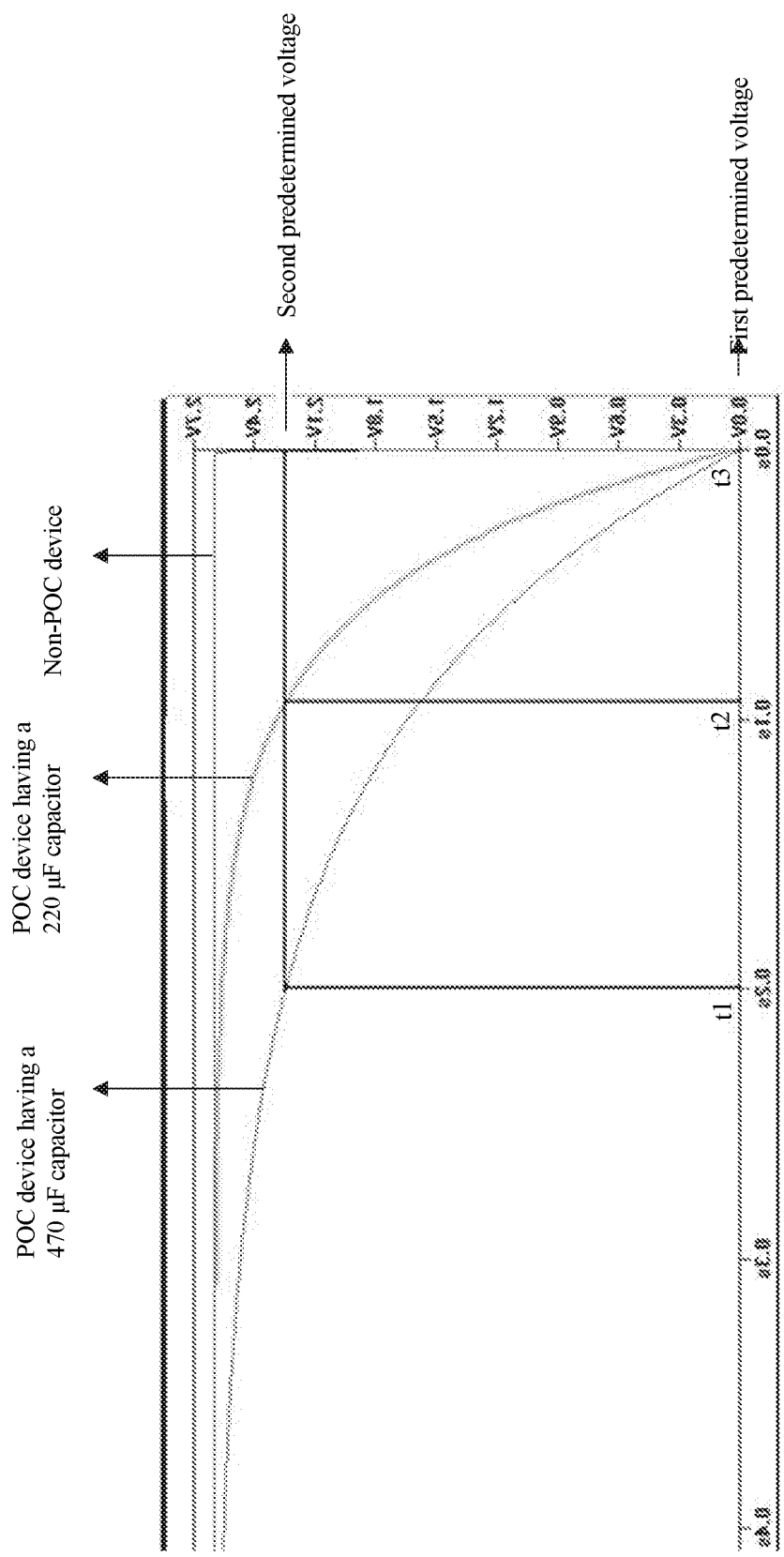
FIG. 26 is a schematic diagram illustrating a rise-time difference between a non-POC device and a POC device.

The processing module 2430 may receive the rise time transmitted by the identification module 2420. A non-POC device may include a featured capacitor having a relatively small capacitance. When a non-POC device is plugged into the backend device 2400, a voltage across the non-POC device may increase from the first predetermined voltage to the second predetermined voltage in a very short time (as illustrated in FIG. 26), almost instantly. In contrast, a POC device may include a featured capacitor (e.g., as illustrated in FIGS. 39 and 43) having a relatively large capacitance. If a POC device is connecting with the port module 2450, a voltage across the POC device may increase from the first predetermined voltage to the second predetermined voltage in a time (rise time) longer than that of a non-POC device.

When the frontend device 2490 is a POC device, the backend device may be switched to a power-cut mode and provide power supply to the frontend device 2490. A voltage of the power supply may be higher than the voltage V5, and the diode 2520 may be turned off. Therefore, the power supply may be blocked and may not be received by the identification module 2420.

FIG. 26 is a schematic diagram illustrating a rise-time difference between a non-POC device and a POC device. As shown in FIG. 26, a rise time t3 for a voltage across a non-POC device increasing from a first predetermined voltage (e.g., 0 V) to a second predetermined voltage (e.g., 2.25 V) is very short, close to 0. A rise time t2 for a voltage across a POC device including a featured capacitor of a lower capacitance (e.g., 220 μF) is relatively longer, close to 0.1 s. A rise time t1 for a voltage across a POC device including a featured capacitor of a higher capacitance (e.g., 470 μF) is even longer, close to 0.2 s. Therefore, the processing module 2430 may store a preset time range. Upon receiving a rise time transmitted by the identification module 2420, the processing module 2430 may determine whether the rise time is within the preset time range. Upon determining that the rise time is within the preset time range, the processing module 2430 may determine that a POC device is connecting with the port module 2450. Upon determining that the rise time is out of the preset time range, the processing module 2430 may determine that a non-POC device is connecting with the port module 2450. Merely for example, the preset time range may be 0.08 s to 0.22 s.

If a frontend device 2490 plugged into the backend device 2400 is determined as a POC device, providing power supply to the frontend device may not cause the frontend device to be burned out. Therefore, the processing module 2430 may transmit a turn-on signal to the switch module 2440, causing the switch module 2440 to be turned on. The power 422 may then provide power supply to the frontend device 2490 through the switch module 2440, the port module 2450, and the coaxial cable 430. If a frontend device 2490 plugged into the backend device 2400 is determined as a non-POC device, the processing module 2430 may transmit a turn-off signal to the switch module 2440, causing the switch module 2440 to be turned off (or remains to be turned off). Consequently, the power supply may not be provided to the frontend device 2490, avoiding the non-POC device being burned out.

In the embodiment illustrated in FIG. 24, when the backend device 2400 is at the power-cut mode (the switch module 2440 is turned off), the identification module 2420 may obtain a voltage across a frontend device 2490 plugged into the backend device 2400 (or a voltage at the port of the port module 2450) in real-time, and determine a rise time based on the obtained voltage. The identification module 2420 may then transmit the determined rise time to the processing module 2430. Since a difference between rise times of a POC device and a non-POC device is relatively large, the processing module 2430 may determine whether the received rise time is within a preset time range. Upon determining that the rise time is within the preset time range, the processing module 2430 may determine that the frontend device 2490 is a POC device and cause the switch module 2440 to be turned on, so that the frontend device 2490 may be powered up by the power 422 of the backend device 2400. Upon determining that the rise time is out of the preset time range, the processing module 2430 may determine that the frontend device 2490 is a non-POC device and cause the switch module 2440 to be turned off (or remains to be turned off). Consequently, when a non-POC device is wrongly recognized as a POC device and plugged into the backend device 2400, the backend device 2400 may not transmit power supply (e.g., DC current) to the non-POC device, preventing the non-POC device from being burned out.

FIG. 27 is a schematic diagram illustrating an exemplary backend device according to some embodiments of the present disclosure. Backend device 2700 is an exemplary embodiment of the backend device 2400 (e.g., illustrated in FIG. 24). Compared to the backend device 2400, the backend device 2700 may include a backend interface 2710, a video signal processor 2720, and a video signal receiver 2740. The backend interface 2710, the video signal processor 2720, and the video signal receiver are exemplary embodiments of the backend interface 2410 (e.g., illustrated in FIG. 24), the signal processor 123 (e.g., illustrated in FIG. 1), and the signal receiver 121 (e.g., illustrated in FIG. 1), respectively. The backend interface 2710 may include a signal blocking module (e.g., a circuit or circuits) 2730 and a port module (e.g., a circuit or circuits) 2750. The signal blocking module 2730 may be the same as or similar to the signal blocking module 425, the descriptions of which are not repeated here. The port module 2750 may be an exemplary embodiment of the port module 2450.

A first terminal of the signal blocking module 2730 may be coupled to the third terminal of the switch module 2440. A second terminal of the signal blocking module 2730, which may be viewed as a power-in terminal of the backend interface 2710, may be coupled to the power 2480. A first terminal of the port module 2750 may be coupled to the first terminal of the identification module 2420. A second terminal of the port module 2750 may be coupled to the first terminal of the switch module 2440.

The port module 2750 may include a port and a third terminal. The port of the port module 2750 may serve as a backend cable terminal of the backend interface 2710 for connecting with a frontend device 2790 through a coaxial cable 430. The frontend device 2790 is an exemplary embodiment of the frontend device 2490 (or 110). The frontend device 2790 may receive power supply from the backend device 2700 while transmit a video signal to the backend device 2700. The third terminal may serve as a signal-out terminal of the backend interface 2710 for connecting with the video signal processor 2720. The port module 2750 may further include a power supply blocking unit (e.g., the capacitor 416 illustrated in FIG. 4) for blocking the power supply received by the power-in terminal of the backend interface 2710 while allow a pass of a signal received by the power-in terminal of the backend interface 2710

The signal blocking module 2730 may connect with the power 2480 and the switch module 2440. The signal blocking module 2730 may be configured to block the video signal transmitted by the frontend device 2790 to the power 2480 when the switch module 2440 is turned on. The video signal processor 2720 may connect with the video signal receiver 2740 and the port module 2750. An input terminal of the video signal processor 2720 may be coupled to or connect with the third terminal of the port module 2750. An output terminal of the video signal processor 2720 may be coupled to the video signal receiver 2740.

The video signal processor 2720 may perform a compensation for signal attenuation or signal loss on a received video signal. The video signal generated through the compensation (or be referred to as a compensated video signal) may be transmitted to the video signal receiver 2740.

Alternatively or additionally, the video signal processor 2720 may receive the video signal transmitted by the frontend device 2790, process (e.g., filter) the received video signal in a manner as described in connection with FIGS. 5 to 23, and generate a filtered video signal therefrom. The video signal processor 2720 may be the same as or similar to the video signal processor 423 or 523, or include a component that is the same as or similar to the video signal processor 423 or 523.

In some embodiments, the video signal processor 2720 may first process the received video signal in the manner as described in connection with FIGS. 5 to 23 to generate a filtered video signal therefrom, then perform a signal compensation upon the filtered video signal to generate a compensated video signal.

In some embodiments, the video signal receiver 2740 may transmit a reverse control signal to the frontend device 2790, causing the frontend device 2790 to perform a corresponding operation. For example, the frontend device 2790 may include or connect with a camera (e.g., the camera 131). The reverse control signal may cause the camera to perform a zooming operation and/or cause one or more inferred lights of the camera to be turned on. The reverse control signal may be transmitted in a direction opposite to the direction of the video signal.

In the embodiments illustrated in FIG. 27, the backend device 2700 may provide power supply (electric current) to the frontend device 2790, while the frontend device 2790 may transmit video signals to the backend device 2700. The backend device 2700 may include the video signal receiver 2740 for receiving a video signal transmitted by the frontend device 2790. For improving a quality of the video signal received by the video signal receiver 2740, the backend device 2700 may also include the signal blocking module 2730 and the video signal processor 2720. The signal blocking module 21 may connect with the power 2480 and the switch module 2440. When the switch module 2440 is turned on, the power 2480 may provide power supply to the frontend device 2790 through the signal blocking module 2730, the switch module 2440, the port module 2750, and the coaxial cable 430. The signal blocking module 2730 may block the video signal transmitted by the frontend device 2790 to the power 2480, so that an attenuation of the video signal may be reduced, and the video signal may be successfully transmitted to the video signal receiver 2740.

Additionally, during the transmission of the video signal from the frontend device 2790 to the video signal receiver 2740 and the processing of the video signal performed by the video signal processor 2720 (e.g., removing a second sub-signal), an attenuation or signal loss of the video signal is unavoidable. For ensuring the quality of the video signal received by the video signal receiver 2740, the video signal processor 2720 may further compensate (e.g., through signal amplifying) for the signal attenuation or signal loss of the video signal, and transmit the video signal generated through the compensation to the video signal receiver 2740. The compensation for the signal attenuation or signal loss is well known in the art, the descriptions of which are not repeated here.

The signal blocking module 2730 may be implement by software or hardware. An exemplary circuit for implementing the signal blocking module 2730 is illustrated in FIG. 28.

Figure 28:
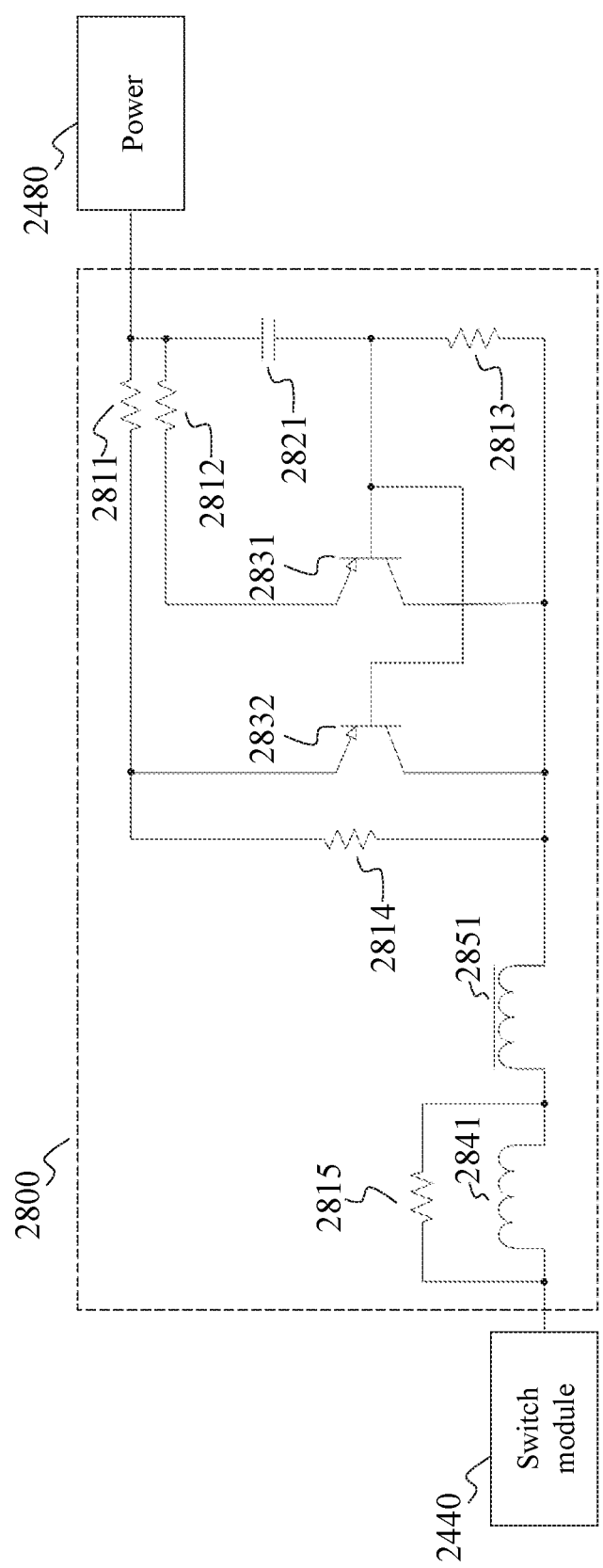
FIG. 28 is a schematic diagram illustrating an exemplary signal blocking module according to some embodiments of the present disclosure.

FIG. 28 is a schematic diagram illustrating an exemplary signal blocking module according to some embodiments of the present disclosure. Signal blocking module 2800 may be an exemplary embodiment of the signal blocking module 2730 (e.g., illustrated in FIG. 27), the signal blocking module 425 (e.g., illustrated in FIG. 4) or the signal blocking module 415 (e.g., illustrated in FIG. 4). It may be noted that, the signal blocking module 2800 is only provided for demonstration purposes and is not intended to be limiting.

The signal blocking module 2800 may include a resistor 2811, a resistor 2812, a resistor 2813, a resistor 2814, a capacitor 2821, a transistor 2831, a transistor 2832, an inductor 2841, and a ferrite bead 2851. For demonstration purposes, the transistors 2831 and 2832 may be described herein by way of example with reference to a p-type bipolar junction transistor (BJT). However, it is understood that the principle of the transistors 2831 and 2832 may be applied to all kinds of transistors, which may include bipolar junction transistors (BJTs), field-effect transistors (FETs), or the like, or a combination thereof (e.g., Darlington transistor). In some embodiments, the transistors 2831 and 2832 may be MOSFETs.

A first terminal of the resistor 2811, which may be viewed as a second terminal of the signal blocking module 2800, may be coupled to the power 2480 (or the coaxial cable 430 and the capacitor 416 when the signal blocking module 200 is integrated into the frontend device 410). A first terminal of the resistor 2812 may be coupled to the first terminal of the resistor 2811. A second terminal of the resistor 2812 may be coupled to an emitter terminal of the transistor 2831. A second terminal of the resistor 2811 may be coupled to an emitter terminal of the transistor 2832 and a first terminal of the resistor 2814. A first terminal of the capacitor 1821 may be coupled to the first terminal of the resistor 2811. A second terminal of the capacitor 1821 may be coupled to a first terminal of the resistor 2813, a base terminal of the transistor 2831, and a base terminal of the transistor 2832. A second terminal of the resistor 2813, a collector terminal of the transistor 2831, a collector terminal of the transistor 2832, and a second terminal of the resistor 2814 may be coupled to a first terminal of the ferrite bead 2851. A second terminal of the ferrite bead 2851 may be coupled to a first terminal of the inductor 2841 and a first terminal of the resistor 2815. A second terminal of the inductor 2841, which may be viewed as a first terminal of the signal blocking module 2800, may be coupled to a second terminal of the resistor 2816 and the third terminal of the switch module 2440 (or the load 412 when the signal blocking module 200 is integrated into the frontend device 410).

The resistor 2811, the resistor 2812, the resistor 2813, the resistor 2814, the capacitor 2821, the transistor 2831 and the transistor 2832 may block a sub-signal of a lower frequency band of the video signal transmitted by the frontend device 2790. Specifically, a voltage across the capacitor 2821 may not change suddenly. Therefore, through the charging and discharging of the capacitor 2821, a voltage $V_{be1}$ across the base terminal and the emitter terminal of the transistor 2831 and a voltage $V_{be2}$ across the base terminal and the emitter terminal of the transistor 2832 may be clamped. By controlling the voltage $V_{be1}$ and the voltage $V_{be2}$, a current $I_{be1}$ passing through the base terminal and the emitter terminal of the transistor 2831 and a current $I_{be2}$ passing through the base terminal and the emitter terminal of the transistor 2832 may be controlled.

Therefore, in response to the sub-signal of a lower frequency band of the video signal transmitted by the frontend device 2790, the capacitor 2821 may be charged and discharged through the resistor 2813. Meanwhile, the voltage $V_{be1}$ and the voltage $V_{be2}$ may be changed correspondingly, and the current $I_{be1}$ and the current $I_{be2}$ may also be varied. Therefore, by controlling an electric resistance of the resistor 2813 and a capacitance of the capacitor 2821, a time constant for the capacitor 2821 to be charged and discharged may be manipulate, so that a response time of the signal blocking module 2800 to the sub-signal of a lower frequency band may be controlled. For example, when the electric resistance of the resistor 2813 and/or the capacitance of the capacitor 2821 is larger, the response time to the sub-signal of a lower frequency band may be longer, and an equivalent impedance of the signal blocking module 2800 to the sub-signal of a lower frequency band may be larger. When the electric resistance of the resistor 2813 and/or the capacitance of the capacitor 2821 is smaller, the response time to the sub-signal of a lower frequency band may be shorter, and the equivalent impedance of the signal blocking module 2800 to the sub-signal of a lower frequency band may be smaller. Therefore, the electric resistance of the resistor 2813 and/or the capacitance of the capacitor 2821 may be increased to increase the impedance of the signal blocking module 2800 to the sub-signal of a lower frequency band. Therefore, the signal the sub-signal of a lower frequency band of the transmitted video signal may be blocked.

The inductor may block a medium-high-frequency sub-signal of the video signal transmitted by the frontend device 2790. A relationship between an inductive reactance of the inductor 2841 and a signal frequency may be illustrated in Equation (1), which may be expressed as:

$$X_L = 2\pi L f \qquad (1)$$

where $X_L$ refers to the inductive reactance of the inductor 2641 towards the video signal received from the switch module 2440 (or its sub-signals), L refers to an inductance of the inductor 2841, and f refers to the signal frequency, e.g., of the video signal or any one of its sub-signals. According to the Equation (1), to the medium-high-frequency sub-signal of the video signal having a relatively high frequency, the inductor 2841 may have a relatively large inductive reactance. Therefore, the medium-high-frequency sub-signal of the transmitted video signal may be blocked. As the inductor 2841 may need a certain amount of current flux and a relatively large inductance to present a large impedance towards the medium-high-frequency sub-signal of the video signal transmitted by the frontend device 2790, which may cause a low self-resonant frequency of the inductor 2841. Therefore, the ferrite bead 2851 may be optionally added into the signal blocking module 2800 to increase the impedance of the signal blocking module 2800 towards high-frequency sub-signals.

Figure 29:
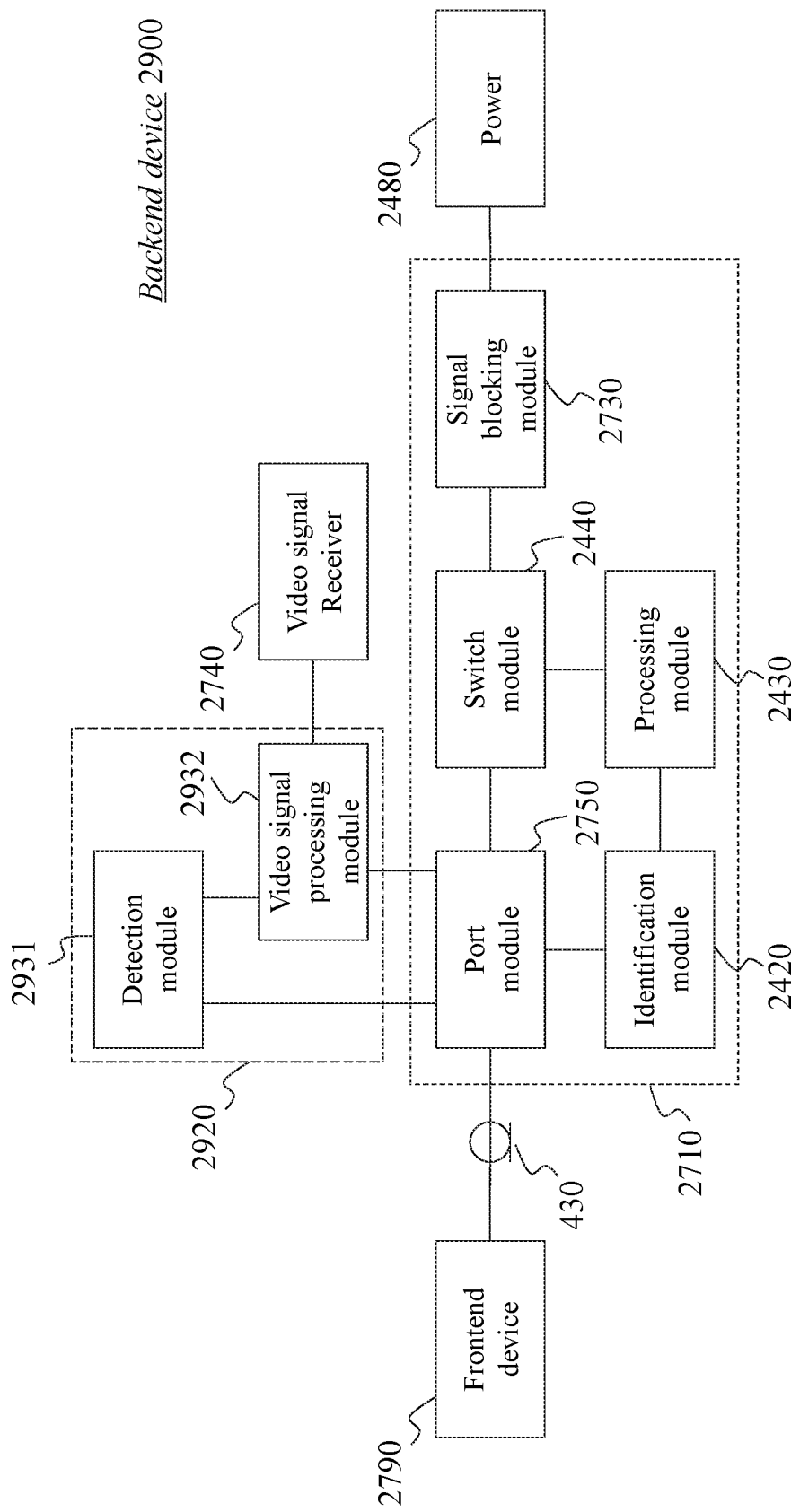
FIG. 29 is a schematic diagram illustrating an exemplary backend device according to some embodiments of the present disclosure.

FIG. 29 is a schematic diagram illustrating an exemplary backend device according to some embodiments of the present disclosure. Backend device 2900 is an exemplary embodiment of the backend device 2700 (e.g., illustrated in FIG. 27). Compared to the backend device 2700, the backend device 2900 may include a video signal processor 2920, which is an exemplary embodiment of the video signal processor 2720. The video signal processor 2920 may include a detection module 2931 and a video signal processing module 2932.

When the frontend device 2790 is having a relatively large change or fluctuation on its power consumption, the video signal transmitted by the frontend device 2790 may have a step change, i.e., the video signal may include a sub-signal having an amplitude higher than that of a normal video signal. The change or fluctuation of the frontend device 2790's power consumption may be caused by a change of the power of the load 412, for example, one or more infrared lights of the camera 131 are turned on, the camera 131 zooms, etc. The sub-signal (or abnormal sub-signal) having the abnormally high amplitude may be of a lower frequency band of the video signal. The existence of the sub-signal may cause an unsuccessful identification of the video signal by the backend device 120 or an embodiment thereof. As a result, the video signal may be lost, causing a long-time blank screen during the displaying of the video signal. The video signal processor 2920 (as well as the video signal processors 423 and 523) may ensure that the received video signal may be successfully identified when the frontend device 2790 is having a relatively large change or fluctuation of the power consumption.

The detection module 2931 may be an exemplary embodiment of the detection module 431 and may have same or similar descriptions. An input terminal of the detection module 2931 may connect with the port module 2750. For example, the input terminal of the detection module 2931 may be coupled to the third terminal or an additional port of the port module 2750. In some embodiments, the detection module 2931 may be implemented by a combination of the circuit illustrated in FIG. 6 and any one of the circuits illustrated in FIGS. 12, 14, and 17.

The detection module 2931 may perform a low-pass filtering on the video signal transmitted by the frontend device 2790 and obtain a filtered signal (a first sub-signal of a first frequency band). The detection module 2931 may also determine whether the first sub-signal is within a first preset voltage range. Upon determining that the first sub-signal is out of the first preset voltage range, the detection module 2931 may transmit a first control signal to the video signal processing module 2932.

The video signal processing module 2932 may have the functions of the fluctuation filter module 432. A first input terminal of the video signal processing module 2932 may be coupled to the output terminal of the detection module 2931. An output terminal of the video signal processing module 2932 may be coupled to the video signal receiver 2740. A second input terminal may connect with the port module 2750. For example, the second input terminal of the video signal processing module 2932 may be coupled to the third terminal or an additional port of the port module 2750. The second input terminal of video signal processing module 2932 may be coupled to the input terminal of the detection module 2931 or not.

Upon receiving the first control signal transmitted by the detection module 2931, the video signal processing module 2932 may remove a second sub-signal of a second frequency band of the video signal to generate a filtered video signal. The second frequency band may include the first frequency band. In some embodiments, the second sub-signal may be a sub-signal with a voltage out of the first preset voltage range. The video signal processing module 2932 may also perform a compensation for signal attenuation or signal loss upon the filtered video signal. The obtained video signal after the compensation may be transmitted to the video signal receiver 2740.

Detailed descriptions of the detection module 2931 and the video signal processing module 2932 may be found elsewhere in the present disclosure (e.g., in connection with FIGS. 4 to 23, 30, and 31).

Figure 30:
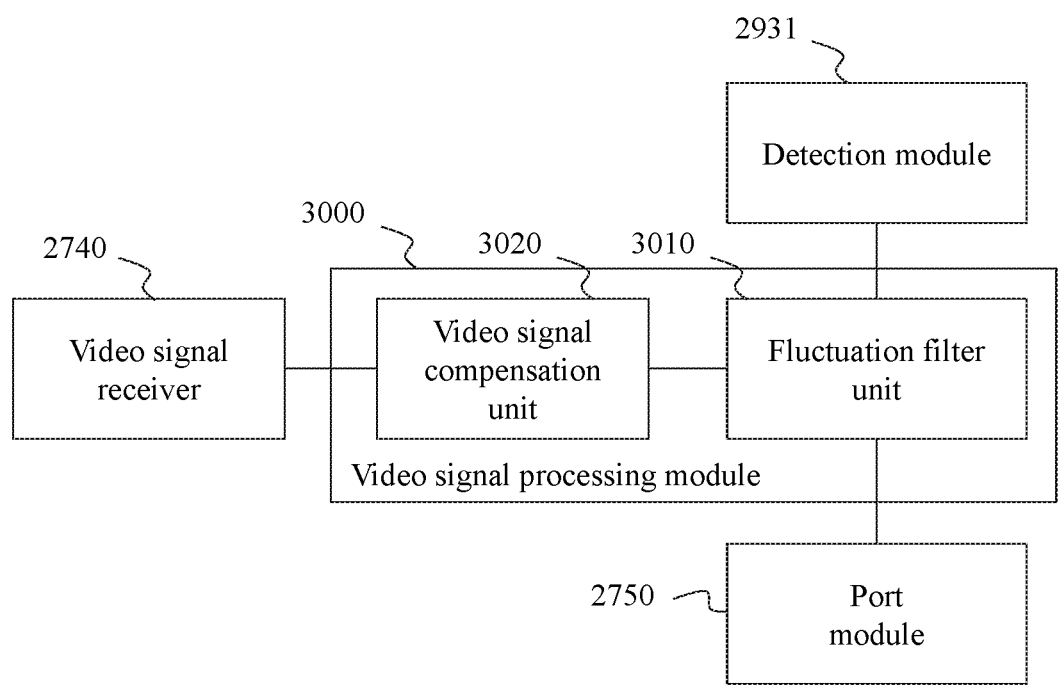
FIG. 30 is a schematic diagram illustrating an exemplary video signal processing module according to some embodiments of the present disclosure.

FIG. 30 is a schematic diagram illustrating an exemplary video signal processing module according to some embodiments of the present disclosure. Video signal processing module 3000 may be an exemplary embodiment of the video signal processing 2932 (e.g., illustrated in FIG. 29). The video signal processing module 3000 may include a fluctuation filter unit 3010 and a video signal compensation unit 3020.

A first input terminal of the fluctuation filter unit 3010, which may also be viewed as a first input terminal of the video signal processing module 300, may be coupled to the output terminal of the detection module 2931. A second input terminal of the fluctuation filter unit 3010 may be coupled to or connect with the third terminal of the port module 2750. An output terminal of the fluctuation filter unit 3010 may be coupled to an input terminal of the video signal compensation unit 3020. An output terminal of the video signal compensation unit 3020, which may also be viewed as an output terminal of the video signal processing module 3000, may be coupled to the video signal receiver 2740.

The fluctuation filter unit 3010 may be an embodiment of the fluctuation filter module 432. In some embodiments, the fluctuation filter unit 3010 may be implemented by the circuit illustrated in FIG. 18. The fluctuation filter unit 3010 may connect with the detection module 2931. Upon receiving a first control signal transmitted by the detection module 2931, the fluctuation filter unit 3010 may remove a second sub-signal of a second frequency band of a video signal received from the port module 2750 to obtain a filtered video signal. The second sub-signal may have a relatively large amplitude caused by the step change of the video signal. The fluctuation filter unit 3010 may transmit the filtered video signal to the video signal compensation unit 3020, which is connected with the video signal receiver 2740. The video signal compensation unit 3020 may perform a compensation for the signal loss or signal attenuation of the filtered video signal, and transmit the video signal generated through the compensation to the video signal receiver 2740.

Figure 31:
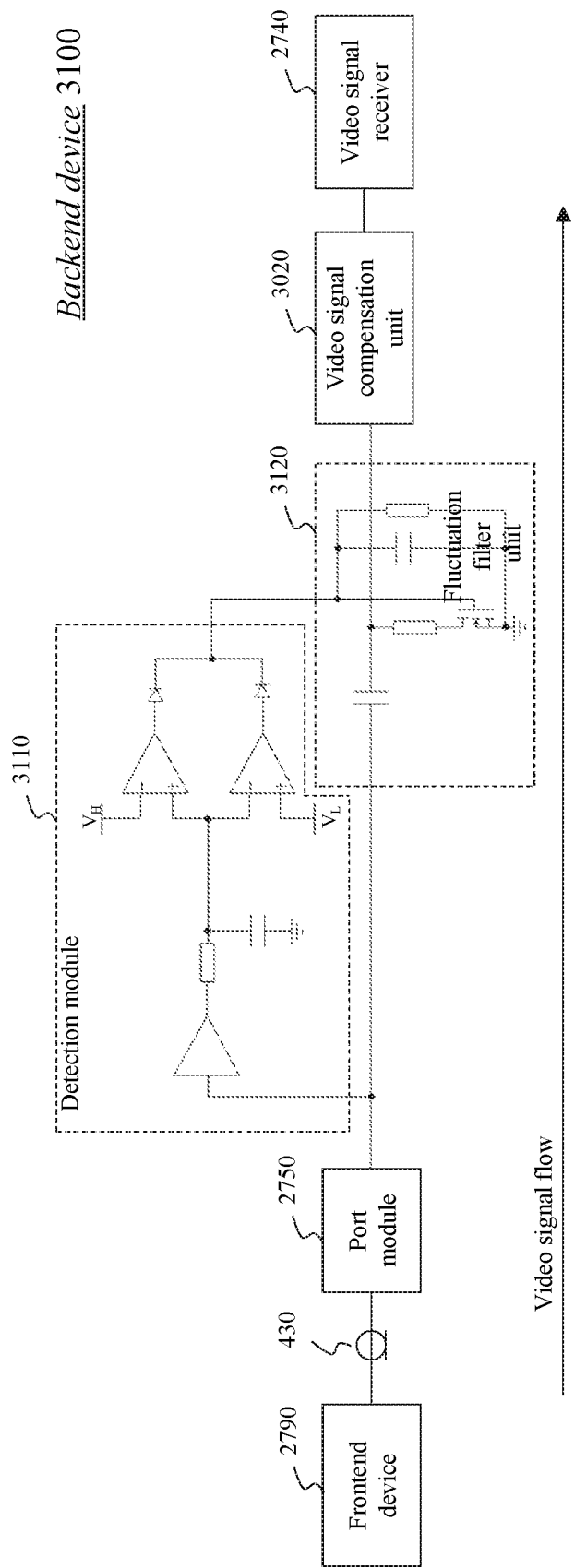
FIG. 31 is a schematic diagram illustrating an exemplary video signal transmitting route according to some embodiments of the present disclosure.

For demonstration purposes, an exemplary video signal transmitting route of a POC system including an embodiment of the video signal processing module 3000 is illustrated in FIG. 31.

FIG. 31 is a schematic diagram illustrating an exemplary video signal transmitting route according to some embodiments of the present disclosure. As shown in FIG. 31, a frontend device 2790 may be connected to a backend device 3100 through a coaxial cable 430. The backend device 3100 may be an exemplary embodiment of the backend device 2900 (e.g., illustrated in FIG. 29). Compared to the backend device 2900, the backend device 3100 may include an embodiment of the video signal processor 2920, which may be formed by a detection module 3110, a fluctuation filter unit 3120, and the video signal compensation unit 3020 illustrated in FIG. 30.

The frontend device 2790 may generate and transmit a video signal. The video signal may be transmitted through a coaxial cable 430. During the transmission, the video signal may be mixed with a power supply provided to the frontend device 2790 through the same coaxial cable 430. The video signal may then be separated from the power supply (e.g., DC current) by the port module 2750, and then received by a detection module 3110 and fluctuation filter unit 3120.

The detection module 3110 may be an exemplary embodiment of the detection module 2931 and may be implemented by a combination of the circuits illustrated in FIGS. 6 and 7. The detection module 3110 may separate a first sub-signal of a first frequency band from the video signal and determine if an amplitude of the first sub-signal is out of a first preset voltage range. For example, the detection module 3110 may determine if the amplitude is above the voltage $V_H$. Upon determining that the amplitude of the first sub-signal is out of the first preset voltage range, the detection module 3110 may output a first control signal (e.g., a high-level signal), which may be transmitted to the fluctuation filter unit 3120. Upon determining that the amplitude of the first sub-signal is within the first preset voltage range (e.g., below or equal to the voltage $V_H$), the detection module 3110 may output a second control signal (e.g., a low-level signal), which may be transmitted to the fluctuation filter unit 3120.

The fluctuation filter unit 3120 may be an exemplary embodiment of the fluctuation filter module 423 and may be implemented by the circuit illustrated in FIG. 18. Upon receiving the first control signal, the fluctuation filter unit 3120 may remove (by filtering) a second sub-signal of a second frequency band of the received video signal to generate a filtered video signal, and transmit the filtered video signal to the video signal compensation unit 3020. Upon receiving the second control signal, the fluctuation filter unit 3120 may transmit the received video signal to the video signal compensation unit 3020 without removing the second sub-signal.

Detailed descriptions of the detection module 3110 and the fluctuation filter unit and their working mechanisms are similar to those of the video signal processor 1900 (illustrated in FIG. 19), which are not repeated here. It may be noticed that, the detection module 3110 and/or the fluctuation filter unit 3120 may also be implemented by different circuits. For example, the detection module 3110 may be a combination of the circuit illustrated in FIG. 6 and any one of the circuits illustrated in FIGS. 12, 14, and 17.

The video signal outputted by the fluctuation filter unit 3120 may then be received by the video signal compensation unit, which may compensate for signal loss or signal attenuation of the received video signal. The video signal generated through the compensation may then be transmitted to the video signal receiver 2740. After received by the video signal receiver 2740, the video signal may be stored in a storage device (e.g., the storage 142) or be displayed (e.g., by the display 141).

The power supply route is not illustrated in FIG. 31. It may be noted that, the frontend device 2790 may be a non-POC device and may be powered up through another power supply technique. The backend device 3100 may cut off the power supply to the non-POC device through mechanisms described in connection with FIGS. 24 to 28, and the non-POC device may normally transmit a video signal to the video signal receiver 2740 through the video signal transmitting route illustrated in FIG. 30 without being burned out.

Figure 32:
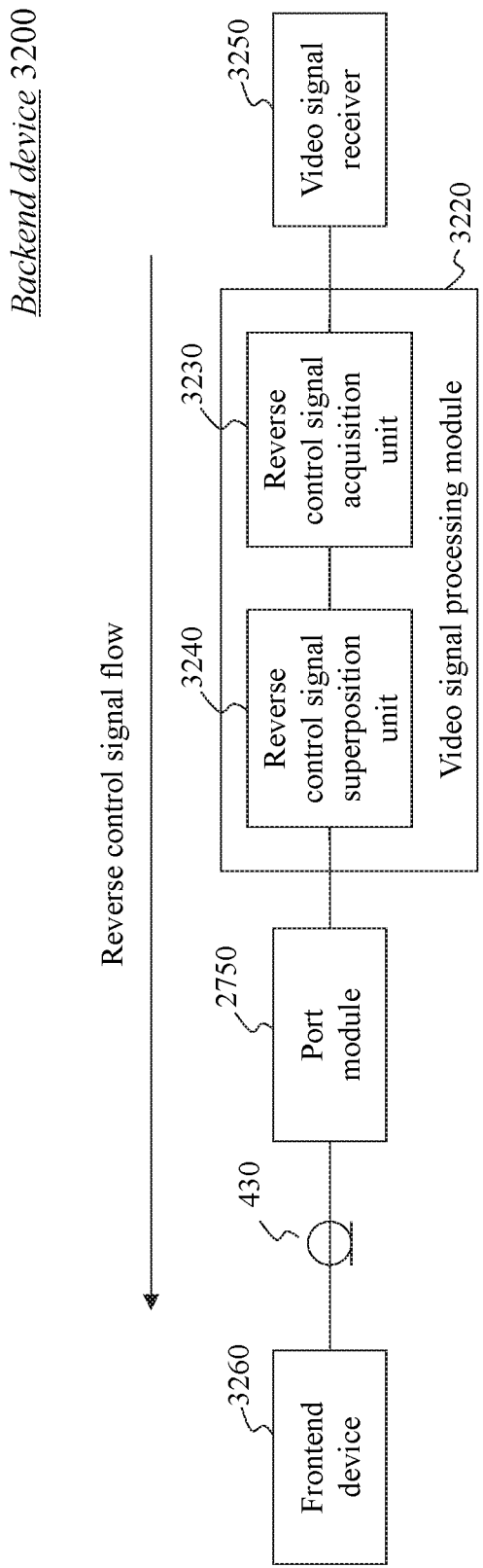
FIG. 32 is a schematic diagram illustrating an exemplary video signal processing module according to some embodiments of the present disclosure.

FIG. 32 is a schematic diagram illustrating an exemplary video signal processing module according to some embodiments of the present disclosure. Video signal processing module 3220 may be an exemplary embodiment of the video signal processing module 3000 (e.g., illustrated in FIG. 30). The video signal processing module 3220 may be included in a backend device 3200, which may be an exemplary embodiment of the backend device 2900 (e.g., illustrated in FIG. 29). Besides providing power supply to a connected frontend device 2790 and receiving video signals therefrom, the backend device 3200 may also be configured to transmit a reverse control signal to a frontend device 3260, causing the signal side device 3260 to perform a corresponding operation. The frontend device 3260 may be an exemplary embodiment of the signal device 2790. The video signal processing module 3220 may dynamically process a video signal in response to a real-time detection of the step change of the video signal. The video signal processing module 3220 may also facilitate a transmission of a reverse control signal transmitted by the backend device 2900.

For demonstration purposes and simplicity, only modules and units related to the reverse control signal is illustrated in FIG. 32, which is not intended to be limiting. Additional modules facilitating the transmission of the reverse control signal may also be included into the backend device 3200 and/or the video signal processing module 3220, and be set along the path of the reverse control signal.

The backend device 3200 may also include a video signal receiver 3250, which may be an exemplary embodiment of the video signal receiver 2740. The video signal processing module 3230 may process the received video signal to generate a filtered video signal or a compensated video signal (e.g., in a manner described in connection with FIG. 29). The processed video signal may then be transmitted from the video signal processing module 3220 to the video signal receiver 3250. The video signal receiver 3250 may receive a filtered video signal or a compensated video signal from the video signal processing module 3220. The video signal receiver 3250 may also transmit a reverse control signal to the video signal processing module 3220 through the reverse control signal flow path as illustrated in FIG. 32. The reverse control signal may be transmitted from the video signal receiver 3250 to the video signal processing module 3220 through a cable or electric path for transmitting processed video signal.

The video signal processing module 3220 may be configured to obtain the reverse control signal, and superpose the reverse control signal on the video signal transmitted from the port module 2750 to generate a superposed signal (or be referred to as a second superposed signal). If the frontend device 3260 is a POC device, the second superposed signal may further be mixed with the power supply (e.g., DC current) provided by the backend device 3200 during the transmission through the coaxial cable 430 to generate a mixed signal, and the frontend device 3260 may further include mechanism for separating the second superposed signal and/or the reverse control signal from the mixed signal.

The video signal processing module 3220 may include a reverse control signal acquisition unit 3230 and a reverse control signal superposition unit 3240 for performing the operations related to the reverse control signal. An input terminal of the reverse control signal acquisition unit 3230 may be coupled to the video signal receiver 3250. An output terminal of the reverse control signal acquisition unit 3230 may be coupled to an input terminal of the reverse control single superposition unit 3240. An output terminal of the reverse control signal superposition unit 3240 may be coupled to or connect with the third terminal of the port module 2750. The reverse control signal acquisition unit 3230 may be configured to obtain (e.g., by separating) the reverse control signal, and transmit the obtained reverse control signal to the reverse control signal superposition unit 3240. The reverse control signal superposition unit 3240 may superpose the received reverse control signal on the video signal transmitted from the port module 2750, generating a second superposed signal.

When the video signal receiver 3250 is outputting a reverse control signal, the processed video signal transmitted from the video signal processing module 3220 may be superposed with the reverse control signal, generating a superposed signal (or be referred to as a first superposed signal). The reverse control signal acquisition unit 3230 may obtain or extract the reverse control signal from the first superposed signal. The reverse control signal acquisition unit 3230 and the reverse control signal superposition unit 3240 may also be configured so that the first superposed signal and the second superposed signal may not interfere with each other.

The first superposed signal may not be normally displayed or received by the video signal receiver 3250. In some embodiments, the video signal receiver 3250 may include a component (e.g., a circuit) for obtaining or extracting the processed video signal from the first superposed signal. Alternatively, the first superposed signal may be blocked and may not be received by the video signal receiver 3250 when the frontend device 3260 is outputting a reverse control signal so that the video signal receiver 3250 may not receive the first superposed signal (or at least a majority of it). In some embodiments, the reverse control signal may have a high level and a low level. When the reverse control signal outputted by the video signal receiver 3250 is at the high level (the video signal receiver 3250 is outputting an increased voltage), the reverse control signal superposition unit 3240 may block the first superposed signal and the first superposed signal may not reach the video signal receiver 3250. When the reverse control signal outputted by the video signal receiver 3250 is at the low level (the video signal receiver 3250 is not outputting the increased voltage), the compensated video signal or the filtered video signal outputted by the video signal processing module 3220 may not be affected by the reverse control signal and be normally received and displayed by the video signal receiver 3250.

An exemplary embodiment of the video signal processing module 3220 is described in connection with FIG. 33, which is only for demonstration purposes and not intended to be limiting.

Figure 33:
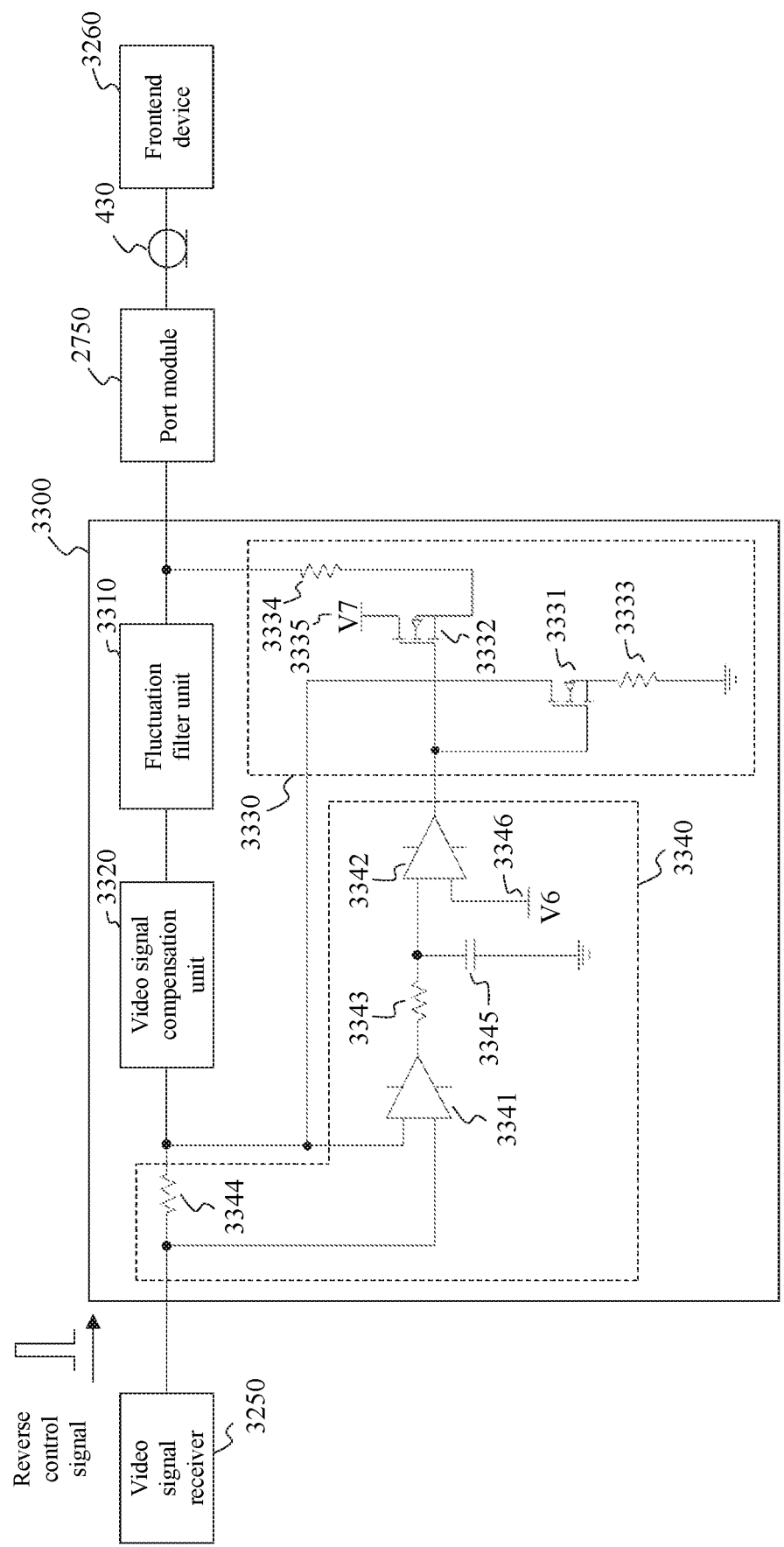
FIG. 33 is a schematic diagram illustrating an exemplary video signal processing module according to some embodiments of the present disclosure.

FIG. 33 is a schematic diagram illustrating an exemplary video signal processing module according to some embodiments of the present disclosure. Video signal processing module 3300 may be an exemplary embodiment of the video signal processing module 3000 (e.g., illustrated in FIG. 30). The video signal processing module may also be an exemplary embodiment of the video signal processing module 3220 (e.g., illustrated in FIG. 32). The video signal processing module 3300 may process a video signal transmitted from the port module 2750 to generate a filtered video signal, then perform a signal compensation upon the filtered video signal to generate a compensated video signal, which is then transmitted to the video signal receiver 3250. The video signal processing module 3300 may also extract a reverse control signal generated by the video signal receiver 3250 and superpose the extracted reverse control signal on the video signal transmitted from the port module 2750 for generating a second superposed signal. The reverse control signal may have a high level and a low level. When the reverse control signal outputted by the video signal receiver 3250 is at the high level (the video signal receiver 3250 is outputting an increased voltage), the video signal processing module 3300 may block the first superposed signal. When the reverse control signal outputted by the video signal receiver 3250 is at the low level (the video signal receiver 3250 is not outputting the increased voltage), the compensated video signal outputted by the video signal compensation unit may be normally received by the video signal receiver 3250.

The video signal processing module 3300 may include a fluctuation filter unit 3310, a video signal compensation unit 3320, a reverse control signal acquisition unit 3340, and a reverse control signal superposition unit 3330. An input terminal of the fluctuation filter unit, which may be viewed as an input terminal of the video signal processing module 3300, may be coupled to the third terminal of the port module 2720 and a first terminal of the reverse control signal superposition unit 3330. An output terminal of the fluctuation filter unit 3310 may be coupled to an input terminal of the video signal compensation unit 3320. An output terminal of the video signal compensation unit 3320 may be coupled to a first terminal of the reverse control signal acquisition unit 3340 and a second terminal of the reverse control signal superposition unit 3330. A second terminal of the reverse control signal acquisition unit 3340 may be coupled to the video signal receiver 3250. A third terminal of the reverse control signal acquisition unit 3340 may be coupled to a third terminal of the reverse control signal superposition unit 3330.

The fluctuation filter unit 3310 and the video signal compensation unit 3320 may be the same as or similar to the fluctuation filter unit 3010 and the video signal compensation unit 3020, respectively, the descriptions of which are not repeated here. In some embodiments, the video signal processing module 3300 may only perform the compensation to the video signal transmitted from the port module 2750, and the fluctuation filter unit 3310 may be removed. Alternatively, the video signal processing module 3300 may only process the video signal transmitted from the port module 2750 without performing the compensation, and the video signal compensation unit 3320 may be removed.

The reverse control signal acquisition unit 3340 and the reverse control signal superposition unit 3330 may be embodiments of the reverse control signal acquisition unit 3230 and the reverse control signal superposition unit 3240, respectively. The reverse control signal acquisition unit 3340 may extract a reverse control signal generated by the video signal receiver 3250 and transmit the extracted reverse control signal (including a high level and a low level) to the reverse control signal superposition unit 3330. The video signal processing module 3300 may superpose the extracted reverse control signal to the video signal transmitted from the port module 2750. When the extracted reverse control signal is at the high level, the video signal processing module 3300 may block the first superposed signal. When the extracted reverse control signal is at the low level, the compensated video signal outputted by the video signal compensation unit may be normally received by the video signal receiver 3250.

The reverse control signal acquisition unit 3340 may include a resistor 3344, an amplifier 3341, a resistor 3343, a comparator 3345, a comparator 3342, and a voltage supply 3346. The voltage supply 3346 may output a voltage V6. A first terminal of the resistor 3344, which may be viewed as the first terminal of the reverse control signal acquisition unit 3340, may be coupled to the output terminal of the video signal compensation unit 3320, the second terminal of the reverse control signal superposition unit 3330, and a first input terminal (e.g., an inverting input terminal) of the amplifier 3341. A second terminal of the resistor 3344, which may be viewed as the second terminal of the reverse control signal acquisition unit 3340, may be coupled to the video signal receiver 3250 and a second input terminal (e.g., a non-inverting input terminal) of the amplifier 3341. An output terminal of the amplifier 3341 may be coupled to a first terminal of the resistor 3343. A second terminal of the resistor 3343 may be coupled to a first terminal of the capacitor 3345 and a first input terminal of the comparator 3342. A second terminal of the capacitor 3345 may be coupled to ground. A second input terminal of the amplifier 3346 may be coupled to the voltage supply 3346. An output terminal of the amplifier 3346, which may be viewed as the third terminal of the reverse control signal acquisition unit 3340, may be coupled to the third terminal of the reverse control signal superposition unit 3330.

The reverse control signal superposition unit 3340 may include a transistor 3331, a transistor 3332, a resistor 3333, a resistor 3334, and a voltage supply 3335. The voltage supply 3335 may output a voltage V7. For demonstration purposes, the transistors 3331 and 3332 are described herein by way of example with reference to an n-channel metal-oxide-semiconductor field-effect transistor (MOSFET). However, it is understood that the principle of the transistors 3331 and 3332 may be applied to all kinds of transistors, which may include bipolar junction transistors (BJTs), field-effect transistors (FETs), or the like, or a combination thereof (e.g., Darlington transistor).

A gate terminal of the transistor 3331, which may be viewed as the third terminal of the reverse control signal superposition unit 3340, may be coupled to a gate terminal of the transistor 3332 and the third terminal of the reverse control signal acquisition unit 3330. A drain terminal of the transistor 3331, which may be viewed as the second terminal of the reverse control signal superposition unit 3340, may be coupled to the first terminal of the reverse control signal acquisition unit 3330 and the output terminal of the video signal compensation unit 3320. A source terminal of the transistor 3331 may be coupled to a first terminal of the resistor 3333. A second terminal of the resistor 3333 may be coupled to ground. A drain terminal of the transistor 3332 may be coupled to the voltage supply 3335. A source terminal of the transistor 3332 may be coupled to a first terminal of the resistor 3334. A second terminal of the resistor 3334, which may be viewed as the first terminal of the reverse control signal superposition unit 3340, may be coupled to the third terminal of the third terminal module 2750 and the input terminal of the fluctuation filter unit 3310.

A reverse control signal may be transmitted from the video signal receiver 3250. An amplitude of the reverse control signal may be reduced due to the resistor 3344. At the same time, a compensated video signal may also be transmitted from the video signal compensation unit 3320. An amplitude of the compensated video signal may also be reduced due to the resistor 3344. A voltage at the first terminal of the resistor 3344 may be received by the first input terminal of the amplifier 3341 and a voltage at the second terminal of the resistor 3344 may be received by the second input terminal of the amplifier 3341. The voltage difference may be amplified by the amplifier 3341 (e.g., a differential amplifier), generating a first extracted signal. The resistor 3343 and the capacitor 3345 may form a low-pass circuit. The first extracted signal may pass through the low-pass circuit and a high frequency sub-signal (if any) of the first extracted signal may be removed, generating a second extracted signal. The second extracted signal may be transmitted to the first input terminal of the comparator 3342. The comparator 3342 may compare an amplitude of the second extracted signal with the voltage V6, so that when the reverse control signal outputted by the video signal receiver 3250 is at its high level, the comparator 3342 may generate a high-level signal; when the reverse control signal is at its low level, the comparator 3342 may generate a low-level signal. Consequently, the comparator 3342 may generate a third extracted signal. The third extracted signal may be the same as or similar to the reverse control signal, including a high level and a low level corresponding to the high level and the low level of the reverse control signal. The third extracted signal may also be referred to as the extracted reverse control signal or the reverse control signal.

The third extracted signal may be transmitted to the gate terminals of the transistor 3331 and the transistor 3332, causing the transistors 3331 and 3332 to be turned on or be turned off. So the third extracted signal may also be referred to as a switching signal. When the third extracted signal is at its high level, the transistor 3331 and the transistor 3332 may both be turned on. By turning on the transistor 3332, the third extracted signal or the reverse control signal may be superposed on the video signal transmitted from the port module 2750 through the resistor 3334, generating a second superposed signal. By turning on the transistor 3331, the compensated video signal outputted by the video signal compensation unit may be transmitted to the ground through the resistor 3333. When the third extracted signal is at its low level, the transistor 3331 and the transistor 3332 may be turned off. By turning off the transistor 3332, the third extracted signal may not affect the video signal transmitted from the port module 2750, which is equivalent to superpose the low-level third extracted signal or the reverse control signal on the video signal transmitted from the port module 2750. By turning off the transistor 3331, the compensated video signal may be received by the video signal receiver 3250. Because when the reverse control signal is at its high level, the second superposed video signal and/or the reverse control signal outputted by the video signal receiver 3250 may cause that the compensated video signal cannot be normally received by the video signal receiver 3250 or normally displayed. Through the mechanisms as illustrated in FIG. 33, the video signal receiver 3250 may not receive a signal when the outputted reverse control signal is at its high level, so that the reverse control signal (or a corresponding sub-signal of the second superposed signal) at the port module 2750 may not be fed back to the video signal receiver 3250. The second superposed signal may be further transmitted through the coaxial cable 430 to the frontend device 3260.

Figure 34:
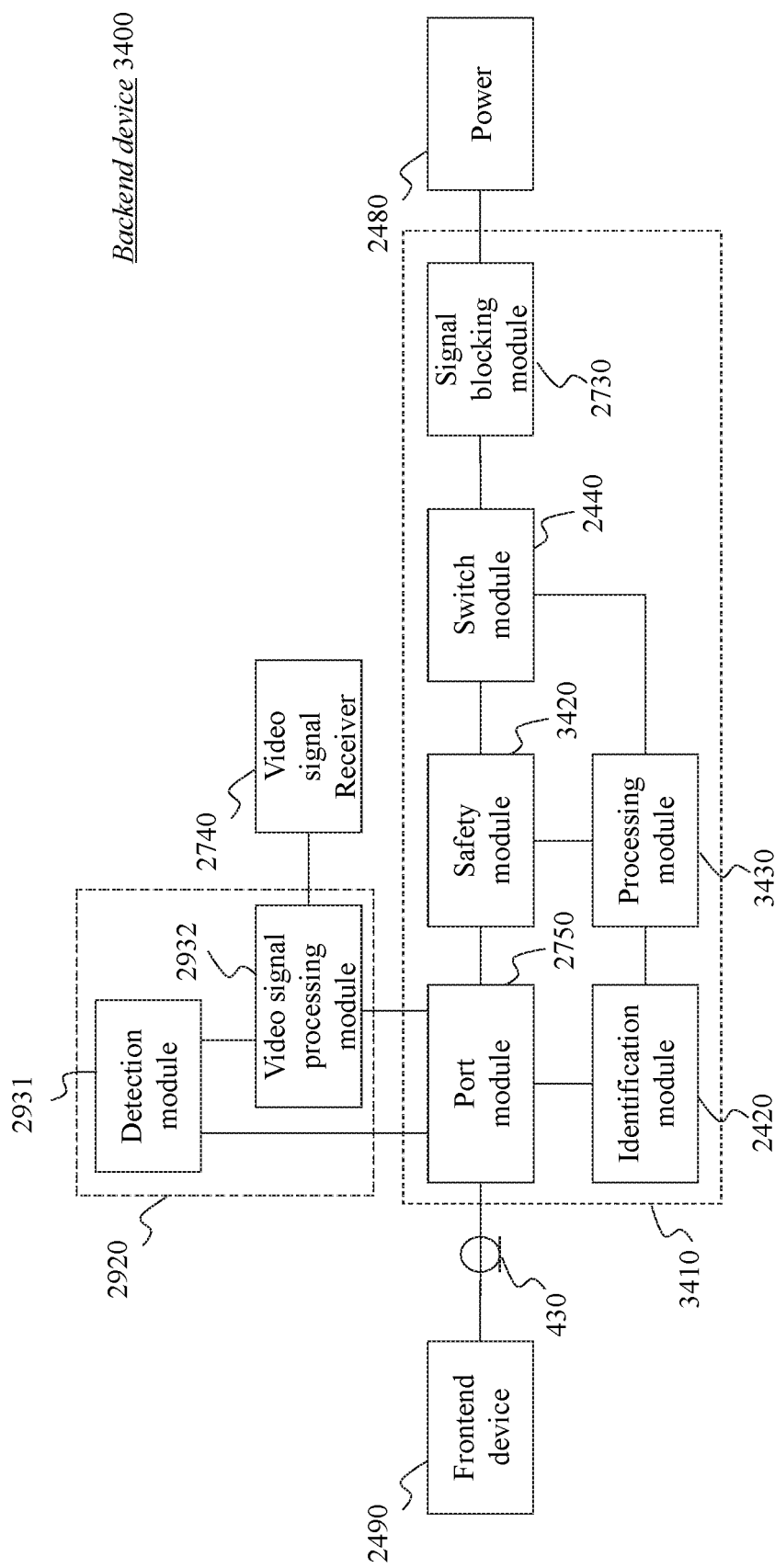
FIG. 34 is a schematic diagram illustrating an exemplary backend device according to some embodiments of the present disclosure.

FIG. 34 is a schematic diagram illustrating an exemplary backend device according to some embodiments of the present disclosure. Backend device 3400 may be an exemplary embodiment of the backend device 2900 (e.g., illustrated in FIG. 29). The backend device 3400 may also be an exemplary embodiment of the backend device 3200 (e.g., illustrated in FIG. 32). The backend device 3400 may include a backend interface 3410, which is an exemplary embodiment of the backend interface 2710 (e.g., illustrated in FIG. 27). Compared to the backend interface 2710, the backend interface 3410 may include a processing module 3430 and may further include a safety module 3420. The processing module 3430 may be an exemplary embodiment of the processing module 2430 (e.g., illustrated in FIG. 24).

In addition to processing the video signal in response to a step change of the video signal described in connection with FIG. 29, the backend device 3400 may stop providing power supply (or change to a power-cut mode) through the safety module 3420 and optionally the process module 3430 when an overcurrent occurs (e.g., a short-circuit is presented) and/or the frontend device 2790 (or 3260) is unplugged from the backend device 3400 (or the coaxial cable 430).

A first terminal of the safety module 3420 may be coupled to the second terminal of the port module 2750. A second terminal of the safety module 3420 may be coupled to the first terminal of the switch module 2440. A first terminal of the processing module 3430 may be coupled to the second terminal of the identification module 2420. A second terminal of the processing module 3430 may be coupled to the second terminal of the switch module 2440. In some embodiments, a third terminal of the processing module 3430 may be coupled to a third terminal of the safety module 3420. In some embodiments, the third terminal of the processing module 3430 may be coupled to the power 2480 or a fourth terminal of the switch module 2440.

The safety module 3420 may be configured to determine whether a current passing through it is within a preset current range. Upon determining that the current is out of the preset current range, the safety module 3420 may transmit a warning signal. The warning signal may cause the backend device 3400 to stop providing power supply to the frontend device 2490 or to the cable 430. In some embodiments, the safety module 3400 may transmit the warning signal to the processing module 3430. Upon receiving the warning signal, the processing module 3430 may turn-off the switch module 2440, and the backend device 3400 may be switched to a power-cut mode. In some embodiments, the safety module 3400 may transmit the warning signal to the switch module 2440, causing the switch module 2440 to be turned off. In some embodiments, the safety module 3400 may transmit the warning signal to the power 2480 causing the power 2480 to stop transmitting power supply.

Alternatively, the safety module 3420 may be configured to generate a safety signal based on a current passing through it and transmit the safety signal to the processing module 3430. The processing module 3430 may determine whether an amplitude of the received safety signal is out of a second preset voltage range. Upon determining that the amplitude of the safety signal is out of the second preset voltage range, the processing module 3430 may transmit the warning signal.

When the backend device 3400 is providing power supply to the frontend device 2790 (at the power-out mode), an overcurrent may occur or the frontend device 2790 may be unplugged. If an overcurrent occurs and the backend device 3400 remains at the power-out mode, the components of the backend device 3400 and/or the frontend device 2790 may be burned out. If the frontend device 2790 is unplugged and the backend device 3400 remains at the power-out mode, a high voltage may be presented at the port module 2750. When the frontend device 2790 is plugged into the backend device 3400 again, the identification module 2420 may not successfully identify whether the frontend device 2790 is connecting with the backend device 3400 (or the port module 2750). For example, the backend device 3400 may include the circuit 2500 illustrated in FIG. 25 for identifying whether a frontend device 2790 is connecting with the backend device 3400. The high voltage presented at the port module 2750 may cause the diode 2520 to be turned off, and the identification module 2420 may constantly obtain a voltage (e.g., the voltage V5) higher than the first predetermined voltage, and may not successfully identify whether a frontend device 2790 is connecting with the backend device 3400. Additionally, if the backend device 3400 remains at the power-out mode when the frontend device 2790 is unplugged, when a non-POC device is plugged into the port module 2750, the non-POC device may be burned out immediately. The backend device 3400 may include the safety module 3420 to prevent the burning out of the components of the backend device 3400 and/or the frontend device 2790 when an overcurrent is occurring, and/or to avoid an identification failure when the frontend device 2790 is plugged into the backend device 3400 again.

In some embodiments, the safety module 3420 may detect if an overcurrent is occurring or the frontend device 2790 is unplugged. Specifically, when an overcurrent is occurring, a current passing through the safety module 3420 may be over high. When the frontend device 2790 is unplugged, a current passing through the safety module 3420 may be 0. In the aforementioned situations (or also be referred to as abnormal situations), a current passing through the safety module 3420 may be different from a current passing through the safety module 3420 when the backend device 3400 is normally providing power supply to the frontend device 2790. Therefore, the safety module 3420 may store a preset current range and may determine if a current passing through it is within the preset current range. Upon determining that the current is within the preset current range, which indicates that the backend device 3400 is normally providing power supply to the frontend device 2790, the safety module 3420 may not perform any operation. Upon determining that the current is out of the preset current range, the safety module 3420 may determine that an abnormal situation is occurring, and transmit a warning signal, for example, to the processing module 3430. Upon receiving the warning signal, the processing module 3430 may transmit a turn-off signal to the switch module 2440, causing the switch module 2440 to be turned off, and the backend device 3400 may be switched to a power-cut mode. Consequently, the burning out of the components of the backend device 3400 and/or the frontend device 2790 when an overcurrent is occurring may be prevented. Alternatively or additionally, an identification failure when the frontend device 2790 is plugged into the backend device 3400 again may be avoided as well.

The safety module 3420 may be implemented by software or hardware. Exemplary embodiments of the safety module 3420 which are implemented by circuits are illustrated in FIGS. 35 and 36.

Figure 35:
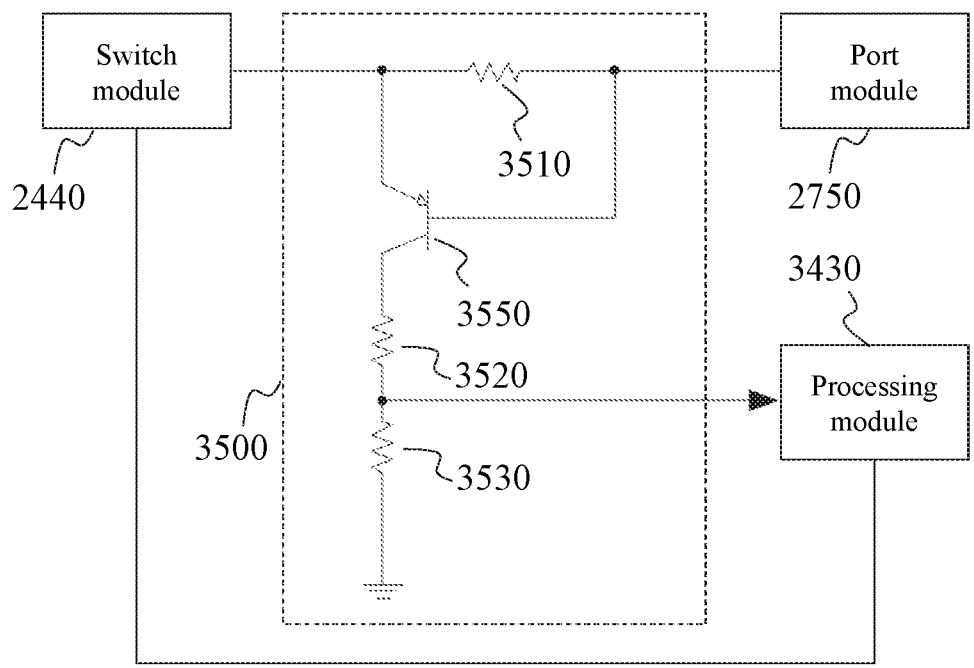
FIGS. 35 and 36 are schematic diagrams illustrating exemplary safety modules according to some embodiments of the present disclosure.
Figure 36:
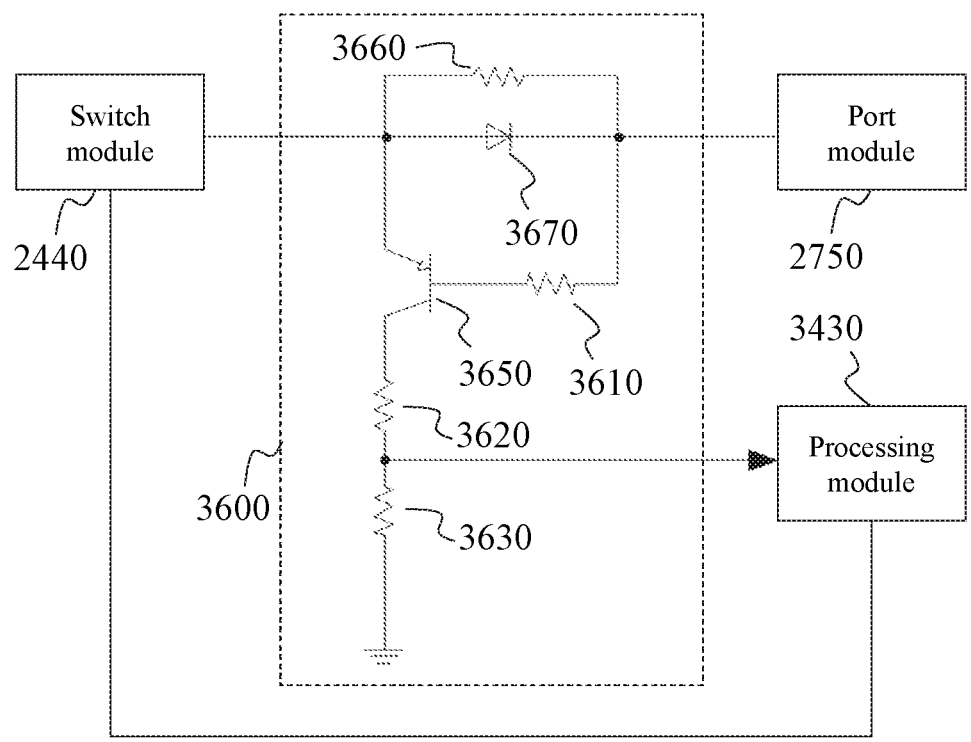

FIG. 35 is a schematic diagram illustrating an exemplary safety module according to some embodiments of the present disclosure. Safety module 3500 may be an exemplary embodiment of the safety module 3420 (e.g., illustrated in FIG. 34). The safety module 3500 may prevent the burning out of the components of the backend device and/or the frontend device when an overcurrent is occurring. The safety module 3500 may include a resistor 3510, a transistor 3550, a resistor 3520, and a resistor 3530. The transistor 3550 is described herein by way of example with reference to a p-type bipolar junction transistor (BJT). However, it is understood that the principle of the transistor 3550 may be applied to all kinds of transistors, which may include bipolar junction transistors (BJTs), field-effect transistors (FETs), or the like, or a combination thereof (e.g., Darlington transistor). In some embodiments, the transistor 3550 may be MOSFETs.

A first terminal of the resistor 3510, which may be viewed as a first terminal of the safety module 3500, may be coupled to the second terminal of the port module 2750 and a base terminal of the transistor 3550. A second terminal of the resistor 3510, which may be viewed as a second terminal of the safety module 3500, may be coupled to the first terminal of the switch module 2440 and an emitter terminal of the transistor 3550. A collector terminal of the transistor 3550 may be coupled to a first terminal of the resistor 3520. A second terminal of the resistor 3520, which may be viewed as a third terminal of the safety module 3500, may be coupled to the third terminal of the processing module 3430 and a first terminal of the resistor 3530. A second terminal of the resistor 3630 may be coupled to ground.

When a current passing through the safety module 3500 (i.e., the current passing through the resistor 3510) is increased, a voltage across the resistor may be increased, and a voltage across the base terminal and the emitter terminal of the transistor 3550 may be increased correspondingly. Consequently, a current passing through the resistor 3530 may be increased, and a voltage across the resistor 3530 may be increased as well. Therefore, a first safety signal transmitted from the first terminal of the resistor 3530 to the processing module 3430 may be pulled to a higher signal level. Upon receiving the first safety signal, the processing module 3430 may determine whether a signal level (or amplitude) of the first safety signal is out of a second preset voltage range. When the current passing through the safety module 3500 is out of a preset current range, an amplitude of the first safety signal may be out of the second preset voltage range. Upon determining that the amplitude of the first safety signal is out of the second preset voltage range, the processing module 3430 may transmit a turn-off signal to the switch module 2440, causing the switch module 2440 to be turned off, so that the components of the backend device and the frontend device may be protected from an overcurrent and/or a short circuit. When the first safety signal is out of the second preset voltage range, the first safety signal may also be referred to as a warning signal.

FIG. 36 is a schematic diagram illustrating an exemplary safety module according to some embodiments of the present disclosure. Safety module 3600 may also be an exemplary embodiment of the safety module 3420 illustrated (e.g., in FIG. 34). The safety module 3600 may avoid an identification failure when a frontend device is unplugged and then plugged (a same frontend device or a different one) into the backend device again. The safety module 3600 may include a resistor 3610, a transistor 3650, a resistor 3620, a resistor 3630, a resistor 3660, and a diode 3670. The transistor 3650 is described herein by way of example with reference to a p-type bipolar junction transistor (BJT). However, it is understood that the principle of the transistor 3550 may be applied to all kinds of transistors, which may include bipolar junction transistors (BJTs), field-effect transistors (FETs), or the like, or a combination thereof (e.g., Darlington transistor). In some embodiments, the transistor 3550 may be MOSFETs.

A cathode of the diode 2670, which may be viewed as a first terminal of the safety module 3600, may be coupled to the second terminal of the port module 2750, a first terminal of the resistor 3660, and a first terminal of the resistor 3610. A second terminal of the resistor 3610 may be coupled to a base terminal of the transistor 3650. An anode of the diode 2670, which may be viewed as a second terminal of the safety module 3600, may be coupled to the first terminal of the switch module 2440, a second terminal of the resistor 3660, and an emitter terminal of the transistor 3650. A collector terminal of the transistor 3650 may be coupled to a first terminal of the resistor 3620. A second terminal of the resistor 3620, which may be viewed as a third terminal of the safety module 3600, may be coupled to the third terminal of the processing module 3430 and a first terminal of the resistor 3630. A second terminal of the resistor 3630 may be coupled to ground.

When a frontend device is unplugged from the port module 2750, a current passing through the safety module 3600 (i.e., the current passing through the diode 3510) may be decreased to 0. The diode 3670 may be turned off, and a voltage across the base terminal and the emitter terminal of the transistor 3650 may be decreased. Consequently, the transistor 3650 may be turned off, and a current passing through the resistor 3530 may be reduced to 0, and a voltage across the resistor 3530 may also be decreased to 0. Therefore, a second safety signal transmitted from the first terminal of the resistor 3630 to the processing module 3430 may be pulled to a low-signal level. Upon receiving the second safety signal, the processing module 3430 may determine whether a signal level (or amplitude) of the second safety signal is out of a third preset voltage range. Upon determining that the amplitude of the second safety signal is out of the third preset voltage range, the processing module 3430 may transmit a turn-off signal to the switch module 2440, causing the switch module 2440 to be turned off. When the second safety signal is out of the third preset voltage range, the second safety signal may also be referred to as a warning signal.

It may be noted that, the safety modules 3500 and 3600 are only for demonstration purposes and not intended to be limiting. Additional components may be added into the safety module 3500 and/or the safety module 3600. In some embodiments, the circuits of the safety modules 3500 and 3600 may be combined to form an integrated safety module. For example, the safety modules 3500 and 3600 may be coupled in series to form the integrated safety module. As another example, the resistor 3630 and the resistor 3530 may be the same and be shared by the circuits of the safety modules 3500 and 3600. The first safety signal may also be the second safety signal while the second preset voltage range may also be the third preset voltage range. The integrated safety module may have both the functions of the safety module 3500 and the functions of the safety module 3600.

Figure 37:
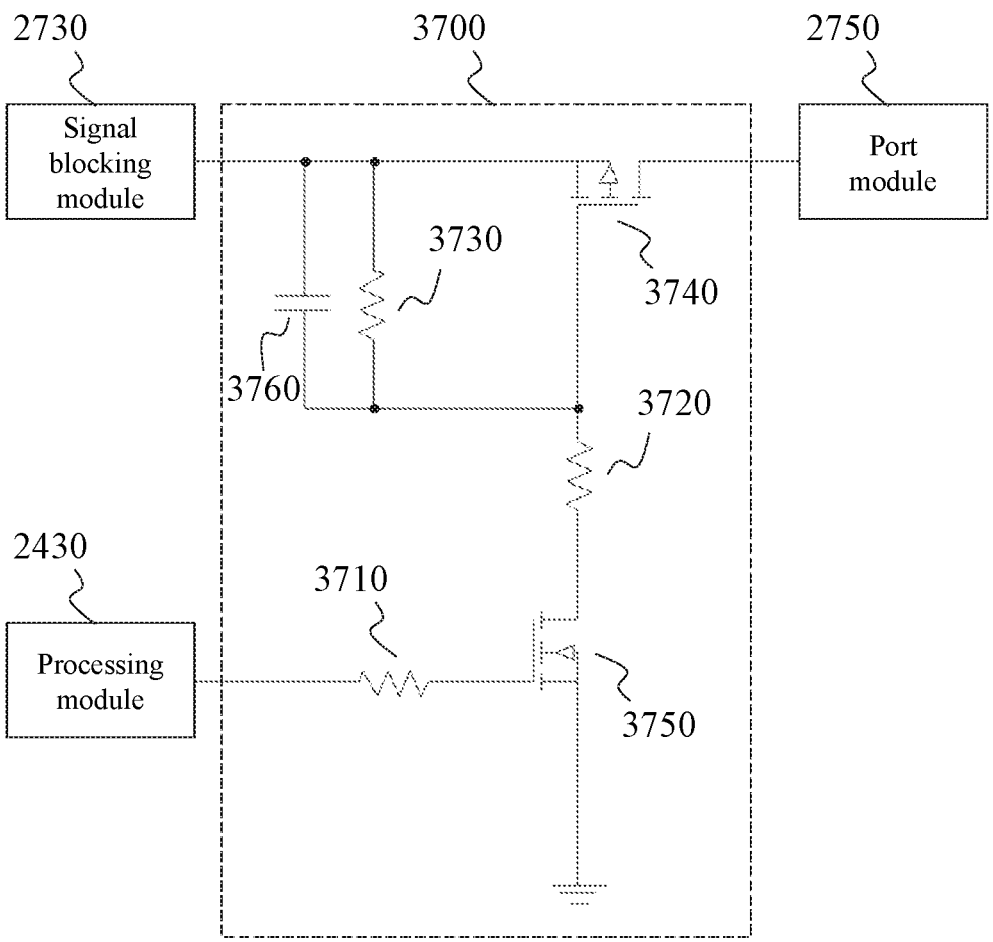
FIG. 37 is a schematic diagram illustrating an exemplary switch module according to some embodiments of the present disclosure.

FIG. 37 is a schematic diagram illustrating an exemplary switch module according to some embodiments of the present disclosure. Switch module 3700 may be an exemplary embodiment of the switch module 2440 (e.g., illustrated in FIG. 24). The switch module 3700 may be turned on or turned off in response to a turned-on signal or a turned-off signal transmitted by the processing module 2430 or 3430 (e.g., illustrated in FIGS. 24 and 34, respectively). The switch module 3700 is only for demonstration purposes and not intended to be limiting.

The switch module 3700 may include a resistor 3710, a resistor 3720, a resistor 3730, a transistor 3740, a transistor 3750, and a capacitor 3760. For demonstration purposes, the transistors 3740 and 3750 are described herein by way of example with reference to an n-channel metal-oxide-semiconductor field-effect transistor (MOSFET). However, it is understood that the principle of the transistors 3740 and 3750 may be applied to all kinds of transistors, which may include bipolar junction transistors (BJTs), field-effect transistors (FETs), or the like, or a combination thereof (e.g., Darlington transistor).

A source terminal of the transistor 3740, which may be viewed as a third terminal of the switch module 3700, may be coupled to the first terminal of the signal blocking module 2730, a first terminal of the capacitor 3760, and a first terminal of the resistor 3730. A drain terminal of the transistor 3740, which may be viewed as a first terminal of the switch module 3700, may be coupled to the second terminal of the port module 2750 (or 2450) or the second terminal of the safety module 3420 (or 3500, 3600). A gate terminal of the transistor 3740 may be coupled to a second terminal of the capacitor 3760, a second terminal of the resistor 3730, and a first terminal of the resistor 3720. A second terminal of the resistor 3720 may be coupled to a drain terminal of the transistor 3750. A first terminal of the resistor 3710, which may be viewed as a second terminal of the switch module 3700 may be coupled to the processing module 2430 (or 2730). A second terminal of the resistor 3710 may be coupled to a gate terminal of the transistor 3750. A source terminal of the transistor 3750 may be coupled to ground.

When the processing module 2430 is transmitting the turn-off signal (e.g., a low-level signal), the transistor 3750 may be turned off. The resistor 3720 may not be coupled to ground, and there may be no current passing through the resistor 3730. Thus a voltage across the resistor 3730 may be 0, and the transistor 3740 may be turned off. Consequently, the switch module 3700 may be turned off, and the backend device may be switched to or remains at the power-cut mode. When the processing module 2430 is transmitting the turn-on signal (e.g., a high-level signal), the transistor 3750 may be turned on. The resistor 3720 may be coupled to ground, and the signal blocking module 2730, the resistor 3730, and the resistor 3720 may form an electric path. A voltage across the resistor 3730 may cause the transistor 3740 to be turned on, and the backend device may be switched to or remains at the power-out mode. The capacitor 3760 may stabilize the voltage across the resistor 3730.

Figure 38:
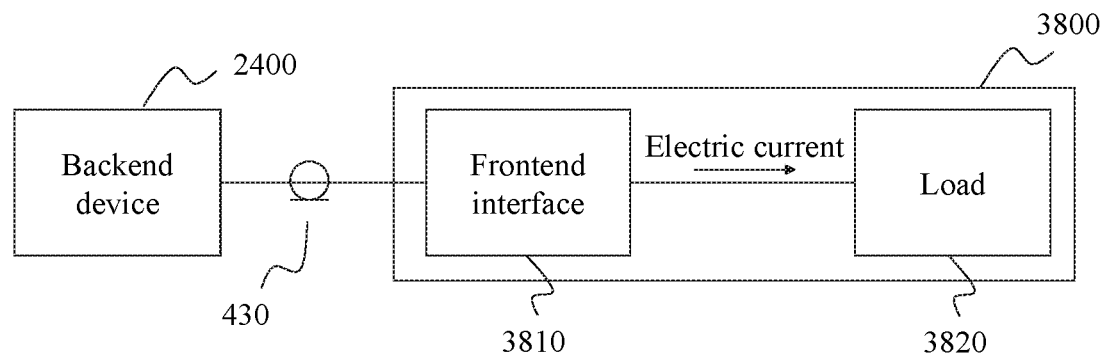
FIG. 38 is a schematic diagram illustrating an exemplary frontend device according to some embodiments of the present disclosure.

FIG. 38 is a schematic diagram illustrating an exemplary frontend device according to some embodiments of the present disclosure. Frontend device 3800 is an exemplary embodiment of the frontend device 2490 (e.g., illustrated in FIG. 24). The frontend device 3800 may receive power supply from a backend device 2400 (e.g., illustrated in FIG.

24) or an embodiment thereof. The frontend device 3800 may include a frontend interface 3810. Load 3820 may represent all the electric components of the frontend device 3800 powered by the backend device 2400. A frontend cable terminal of the frontend interface 3810 may be coupled to the coaxial cable 430. A power-out terminal of the frontend interface 3810 may be coupled to the load 3820.

The frontend interface 3810 may receive power supply (electric current) from the backend device 2400 through a coaxial cable 430 and transmit the power supply to the load 3820. In some embodiments, the frontend interface 3810 may facilitate the backend device 2400 identifying whether the frontend device 3800 is a POC device. Alternatively or additionally, the frontend interface 3810 may also facilitate a discharge of the frontend device 3800 when the frontend device 3800 is unplugged from the backend device 2400. An exemplary embodiment of the frontend interface 3810 is illustrated in FIG. 39.

In some embodiments, the frontend device 3800 may further transmit a video signal to the backend device 2400 through the coaxial cable 430. Additional components may be integrated into the frontend device 3800 and the frontend interface 3810 (e.g., illustrated in FIGS. 4 and 40).

FIG. 39 is a schematic diagram illustrating an exemplary frontend interface according to some embodiments of the present disclosure. Frontend interface 3900 may be an exemplary embodiment of the frontend interface 3810 (e.g., illustrated in FIG. 38). The frontend interface 3900 may be included in a frontend device 3950, which is an exemplary embodiment of the frontend device 3800 (e.g., illustrated in FIG. 38). Load 3960 may represent all the electric components of the frontend device 3950 powered by a backend device 2400 (e.g., illustrated in FIG. 24) or an embodiment thereof. The frontend interface 3900 may facilitate the backend device 2400 identifying whether the frontend device 3950 plugged into the frontend device 3950 is a POC device. The frontend interface 3900 may also facilitate a discharge of the frontend device 3950 when the frontend device 3950 is unplugged from the backend device 2400.

Frontend interface 3900 may include a resistor 3911, a resistor 3922, a resistor 3913, a resistor 3914, a transistor 3921, a transistor 3922, and a capacitor 3931. For demonstration purposes, the transistors 3921 and 3922 may be described herein by way of example with reference to a p-type bipolar junction transistor (BJT). However, it is understood that the principle of the transistors 3921 and 3922 may be applied to all kinds of transistors, which may include bipolar junction transistors (BJTs), field-effect transistors (FETs), or the like, or a combination thereof (e.g., Darlington transistor). In some embodiments, the transistors 3921 and 3922 may be MOSFETs.

A first terminal of the transistor 3911, which may be viewed as a power-out terminal of the frontend interface 3900 may be coupled to the backend device 2400 through a coaxial cable 430. A first terminal of the resistor 3913 may be coupled to the first terminal of the resistor 3911. A second terminal of the resistor 3913 may be coupled to a collector terminal of the transistor 3921 and a base terminal of the transistor 3922. A first terminal of the resistor 3914 may be coupled to the first terminal of the resistor 3911. A second terminal of the resistor 3914 may be coupled to a collector terminal of the transistor 3922. A first terminal of the capacitor 3931 may be coupled to the first terminal of the resistor 3911. A second terminal of the capacitor 3931 may be coupled to ground. A second terminal of the resistor 3911 may be coupled to a first terminal of the resistor 3912 and a base terminal of the transistor 3921. A second terminal of the resistor 3912, an emitter terminal of the transistor 3921, and an emitter terminal of the transistor 3931 may be coupled to ground.

The capacitor 3931 may be the aforementioned featured capacitor for the identification module 2420 determining whether the frontend device 3950 is a POC device. However, the capacitor 3931 may cause a slow discharge of the frontend device 3950. The rest part of the frontend interface 3900 may improve the discharge speed of the frontend device 3950 so that the influence of the capacitor 3931 may be reduced.

When the frontend device 3950 is plugged into the backend device 2400, the backend device 2400 may obtain a voltage across the frontend device 3950, for example, through the circuit 2500 illustrated in FIG. 25. As the backend device 2400 is at the power-cut mode, the voltage 2530, the resistor 2510, the diode 2520, the resistor 3911, and the resistor 3912 may form an electric path. The resistors 3913 and 3911 may have a relatively high electric resistance. The resistors 3911, 3912, and 3913 may be configured so that the transistor 3921 may be turned off when the backend device 2400 is at the power-cut mode. The transistor 3922 may be turned on, and the resistor 3914 may be coupled to ground. The rise time of the voltage across the frontend device 3950 may then be decided by the electric resistance of the resistor 2510, the electric resistance of the resistor 3914, and the capacitance of the capacitor 3931.

Upon determining that the frontend device 3950 is a POC device, the backend device 2400 may be switched to the power-out mode, and a relatively high current may be transmitted from the backend device 2400 to the load 3960 through the coaxial cable 430 and the frontend interface 3900. When the current passing through the frontend interface 3900 is relatively high, a voltage across the resistor 3912 may be higher, and the transistor 3921 may be turned on. As an electric path is formed between the collector terminal and the emitter terminal of the transistor 3921, the base terminal of the transistor 3922 may be coupled to ground, and the transistor 3922 may be turned off. The capacitor 3931 may block the power supply. As the electric resistance of the resistor 3911 and the electric resistance of the resistor 3913 is relatively large, the resistors 3911 and 3913 may also be viewed as blocking the power supply. The power supply may then be successfully received by the load 3960.

When the frontend device 3950 is unplugged from the backend device 2400, the capacitor 3931 may be slowly discharged, and a current passing through the frontend device 3950 (or the frontend interface 3900) may also be slowly decreased. However, when the current passing through the frontend device 3950 (or the frontend interface 3900) is decreased to a certain amount, the transistor 3921 may be turned off. As the electric path formed between the collector terminal and the emitter terminal of the transistor 3921 is cut off, a voltage at the base terminal of the transistor 3922 may be pulled higher, and the transistor 3922 may be turned on. As an electric path is formed between the collector terminal and the emitter terminal of the transistor 3922, the resistor 3914 may be coupled to ground through the collector terminal and the emitter terminal of the transistor 3922. The current passing through the frontend interface 3900 may then be decreased in a high speed, so that the frontend device 3950 may be discharged in a high speed.

In some embodiments, additional components may be added into the frontend interface 3900. For example, the frontend device 3950 may also transmit a video signal to a backend device (e.g., the backend device 2700 or an embodiment thereof) the frontend device 3950 is plugged into. The frontend interface 3900 may also be integrated with a signal blocking module (e.g., the signal blocking module 2800) and a power supply blocking module (e.g., the capacitor 416).

Figure 40:
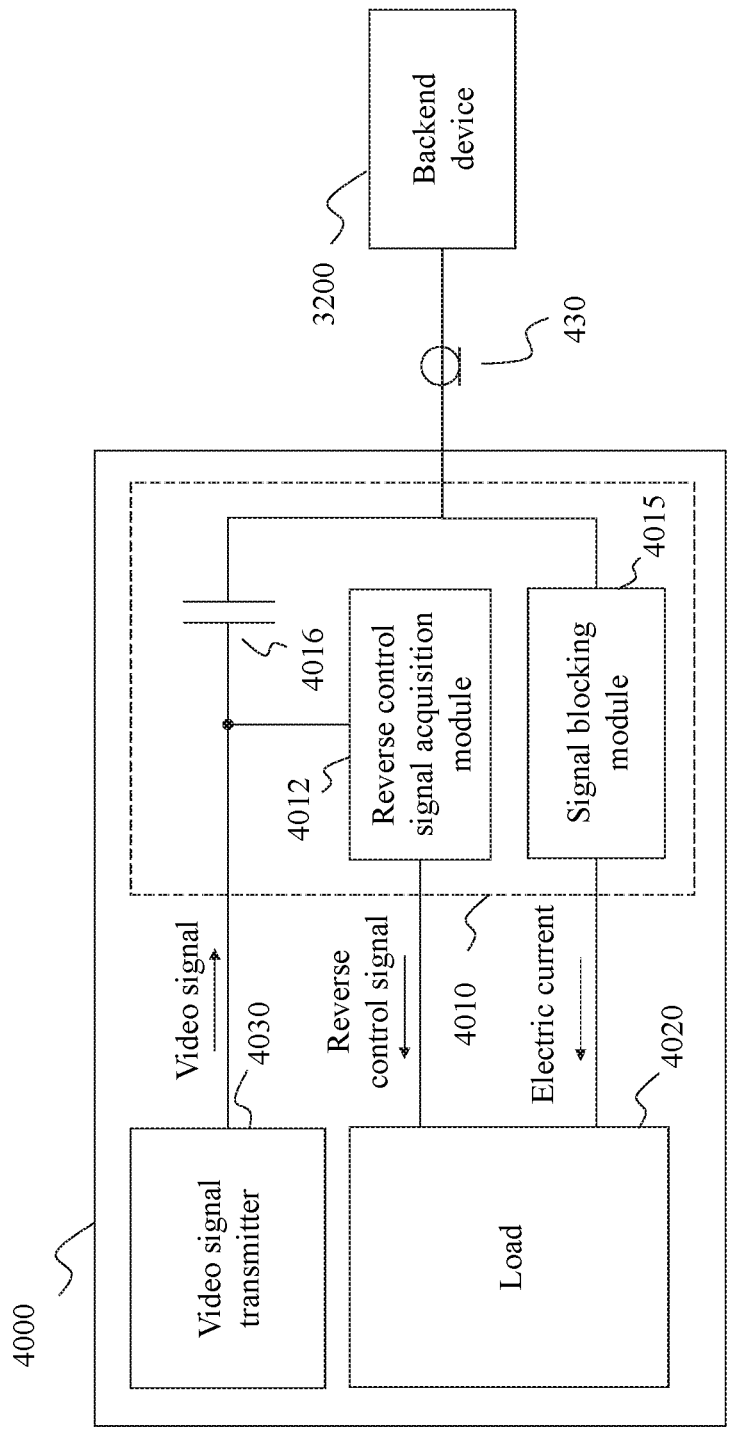
FIG. 40 is a schematic diagram illustrating an exemplary frontend device according to some embodiments of the present disclosure.

FIG. 40 is a schematic diagram illustrating an exemplary frontend device according to some embodiments of the present disclosure. Frontend device 4000 is an exemplary embodiment of the frontend device 3260 (e.g., illustrated in FIG. 32). The frontend device 4000 may transmit a video signal to a backend device 3200 (e.g., illustrated in FIG. 32) or an embodiment thereof. The frontend device 4000 may also receive power supply (electric current) from the backend device 3200 through a coaxial cable 430. The frontend device 4000 may further receive a reverse control signal from the backend device 3200 and perform an operation (e.g., turn on an infrared light, zoom a camera) corresponding to the reverse control signal.

The frontend device 4000 may include a frontend interface 4010 and a video signal transmitter 4030. Load 4020 may represent all the electric components of the frontend device 4000 powered by the backend device 3200. The load 4020 may also include modules and units that may response to the reverse control signal. The frontend interface 4010 and the video signal transmitter 4030 may be exemplary embodiments of the frontend interface 414 and the video signal transmitter 411 (e.g., illustrated in FIG. 4), respectively, the descriptions of which are not repeated here.

A frontend cable terminal of the frontend interface 4010 may be coupled to the coaxial cable 430. A power-out terminal of the frontend interface 4010 may be coupled to the load 4020. A signal-in terminal of the frontend interface 4010 may be coupled to the video signal transmitter 4030.

The frontend interface 4010 may include a signal blocking module 4015, a capacitor 4016 (may also be replaced by any other power supply blocking module, such as a high-pass circuit), and a reverse control signal acquisition module 4012. A first terminal of the signal blocking module 4015, which may be viewed as the frontend cable terminal, may be coupled to the coaxial cable 430 and a first terminal of the capacitor 4016. A second terminal of the signal blocking module 4015 may be coupled to a first terminal of the load 4020. A second terminal of the capacitor 4016 may be coupled to a first terminal of the reverse control signal acquisition module 4012 and the video signal transmitter 4030. A second terminal of the reverse control signal acquisition module 4012 may be couple to a second terminal of the load 4020.

The video signal transmitter 4030 may transmit a video signal to the backend device 3200. For reducing a signal attenuation of the video signal and improve the quality of the video signal, the signal blocking module 4015 may block the video signal transmitted from the video signal or a second superposed signal formed at least by the reverse control signal and the video signal to the load 4020, while allow the pass of the power supply (electric current). In some embodiments, the signal blocking module 4015 may include a circuit the same as or similar to as the one illustrated in FIG. 28, the descriptions of which are not repeated herein. To implement the signal blocking module 4015, the first terminal of the resistor 2811, which may be viewed as the first terminal of the signal blocking module 4015, may be coupled to the coaxial cable 430; the second terminal of the inductor 2841, which may be viewed as the second terminal of the signal blocking module 2800, may be coupled to the first terminal of the load 4020.

In some embodiments, the signal blocking module 4015 may further facilitate the backend device 3200 identify whether the frontend device 4000 is a POC device. The signal blocking module 4015 may also facilitate the discharge of the frontend device 4000 when the frontend device 4000 is unplugged from the backend device 3200. An exemplary embodiment of the signal blocking module 4015 is illustrated in FIG. 43.

The video signal transmitted from the video signal transmitter 4030 may be superposed or mixed with the reverse control signal and the power supply provided by the backend device 3200 to form a mixed signal. The capacitor 4016 (or any other power supply blocking module) may remove the power supply from the mixed signal, leaving a second superposed signal formed by the video signal and the reverse control signal. The reverse control signal acquisition module 4012 may be configured to obtain the reverse control signal from the second superposed signal. The obtained reverse control signal may be transmitted to the load 4020, causing the frontend device 4000 to perform a corresponding function.

Figure 41:
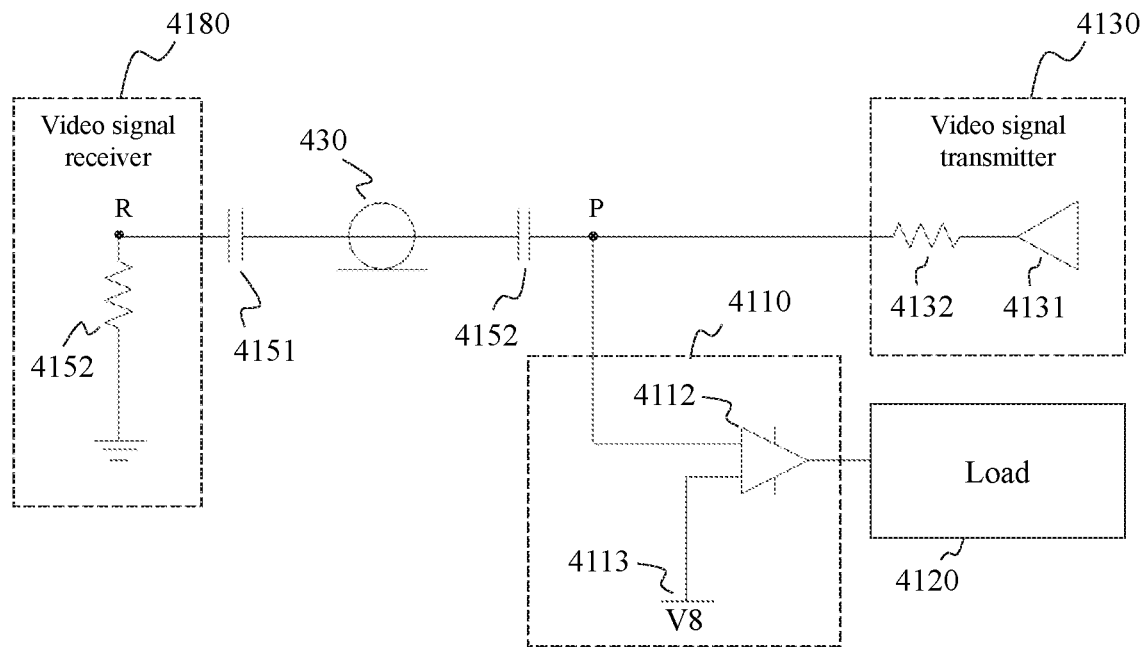
FIGS. 41 and 42 are schematic diagrams illustrating exemplary reverse control signal acquisition modules according to some embodiments of the preset disclosure.

FIG. 41 is a schematic diagram illustrating an exemplary reverse control signal acquisition module according to some embodiments of the preset disclosure. Reverse control signal acquisition module 4110 may be an exemplary embodiment of the reverse control signal acquisition module 4012 (e.g., illustrated in FIG. 40). The reverse control signal acquisition module 4110 may be included in a frontend device 4100 for obtaining a reverse control signal transmitted by a video signal receiver 4180, which is included in a backend device 4150. The frontend device 4100, the video signal receiver 4180, and the backend device 4150 may be exemplary embodiments of the frontend device 4000 (e.g., illustrated in FIG. 40), the video signal receiver 3250 (e.g., illustrated in FIG. 32), and the backend device 3200 (e.g., illustrated in FIG. 32), respectively, the descriptions of which may not be repeated here. For demonstration purposed and simplicity, only modules or components related to the acquisition of the reverse control signal are illustrated in FIG. 41.

In the POC system illustrated in FIG. 41, the backend device 4150 and the frontend device 4100 may be coupled with a coaxial cable 430. The frontend device 4100 may include a video signal transmitter 4130 and a reverse control signal acquisition module 4110. The video signal transmitter 4130 and the reverse control signal acquisition module 4110 may be exemplary embodiments of the video signal transmitter 4030 and the reverse control signal acquisition module 4012, respectively. Load 4120 may represent all the electric components of the frontend device 4100 powered by the backend device 4150 and may include modules and units responding to the reverse control signal transmitted by the backend device 4150. The video signal transmitter 4130 may include an amplifier 4131 (e.g., an operational amplifier) and a resistor 4132. The amplifier 4131 may transmit a video signal and the resistor 4132 may alter a first bias voltage at the point P. For example, the video signal transmitted by the amplifier 4131 may have a DC bias (or DC offset, e.g., the voltage outputted by the amplifier 4132 when no video signal is transmitted). The resistor 4132 may reduce the DC bias of the video signal, so that the first bias voltage may be a predetermined voltage, facilitating the reverse control signal acquisition module obtaining a reverse control signal transmitted by the video signal receiver 4130. The video signal receiver 4130 may include a resistor 4152. The resistor 4152 may alter a second biasing voltage at the point R. After the alteration of the second bias voltage, the video signal may be acquired at the point R and be displayed, analog-to-digital converted, and/or stored, etc.

The backend device 4150 may include at least one capacitor 4151 (e.g., capacitor 426 included in the backend interface 424, capacitor 1840 included in the fluctuation filter module 1800). The frontend device 4100 may also include at least one capacitor 4152 (e.g., capacitor 4016 included in a frontend interface 4010 of the frontend device 4100). The capacitor 4151 and the capacitor 4152 may be set at two sides of the coaxial cable 430. The backend device 4150 may include a video signal processor (e.g., the video signal processor 423, 2720, 3220, or an embodiment thereof), which is not illustrated in FIG. 4130. The video signal processor may connect with the capacitor 4151 and the video signal receiver 4130. However, for a backend device 4150 without such a video signal processor, the capacitor 4151 may connect with the video signal receiver 4130.

The reverse control signal acquisition module 4110 may include a comparator 4112 and a voltage supply 4113. The voltage supply 4113 may output a voltage V8. A first input terminal of the comparator 4112, which may be viewed as a first terminal (point P) of the reverse control signal acquisition module 4110, may be coupled to the video signal transmitter 4130. A second input terminal of the comparator 4113 may be coupled to the voltage supply 4113. An output terminal of the comparator 4112, which may be viewed as a second terminal of the reverse control signal acquisition module 4110, may be coupled to the second terminal of the load 4020.

The reverse control signal acquisition module 4110 may be configured to obtain a reverse control signal from a second superposed signal formed at least by the reverse control signal and a video signal transmitted by the video signal transmitter 4030. The second superposed signal may pass through the capacitor 4152 and may be received by the first input terminal (e.g., a non-inverting input terminal) of the comparator 4112. The comparator 4112 may compare the second superposed signal with a voltage V8, which may be set based on the first bias voltage at point P. Based on the comparison result, the comparator 4112 may generate a fourth extracted signal the same as or similar to the reverse control signal, including a high level and a low level corresponding to the high level and the low level of the reverse control signal. The fourth extracted signal may also be referred to as an extracted reverse control signal or the reverse control signal. The extracted reverse control signal may be transmitted to the load 4020, causing the frontend device 4100 to perform a corresponding function.

The capacitors 4151 and 4152 may block the power supply (electric current) transmitted by the backend device 4150. However, as the first bias voltage and the second bias voltage may also be blocked by the capacitors 4152 and 4151, for a POC system with or without the capacitors 4152 and 4151, the first bias voltage and the second bias voltage may be different. For example, both the resistor 4132 and the resistor 4152 may have a same electric resistance (e.g., 75Ω), and a voltage $V_{DC}$ (DC bias) may be outputted by the amplifier 4131. When the capacitors 4152 and 4151 are not presented, due to the voltages across the resistors 4152 and 4132, the first bias voltage at the point P may be $V_{DC}/2$. When the capacitors 4152 and 4151 are presented, however, the voltage $V_{DC}$ outputted by the amplifier 4131 may not transmitted to the backend device 4150, and the first bias voltage may be $V_{DC}$. As the first bias voltage at the point P is changed, if the voltage V8 is not changed accordingly, the fourth extracted signal generated by the comparator 4112 may be different from the reverse control signal.

In some embodiments, to precisely obtain the reverse control signal, the voltage V8 may be changed in accordance to the change of the first bias voltage. In the aforementioned example, when the capacitors 4152 and 4151 are not presented, the voltage V8 may be equal to a voltage $V_{ref}$ so that the comparator 4112 may successfully generate a fourth extracted signal the same as or similar to the reverse control signal. In the POC system as illustrated in FIG. 41, the voltage V8 may be adjusted to $V_{ref}+V_{DC}/2$ so that the reverse control signal may be successfully obtained.

Alternatively, to precisely obtain the reverse control signal, the voltage V8 may remain unchanged while the first bias voltage may be adjusted. An exemplary embodiment is illustrated in FIG. 42.

Figure 42:
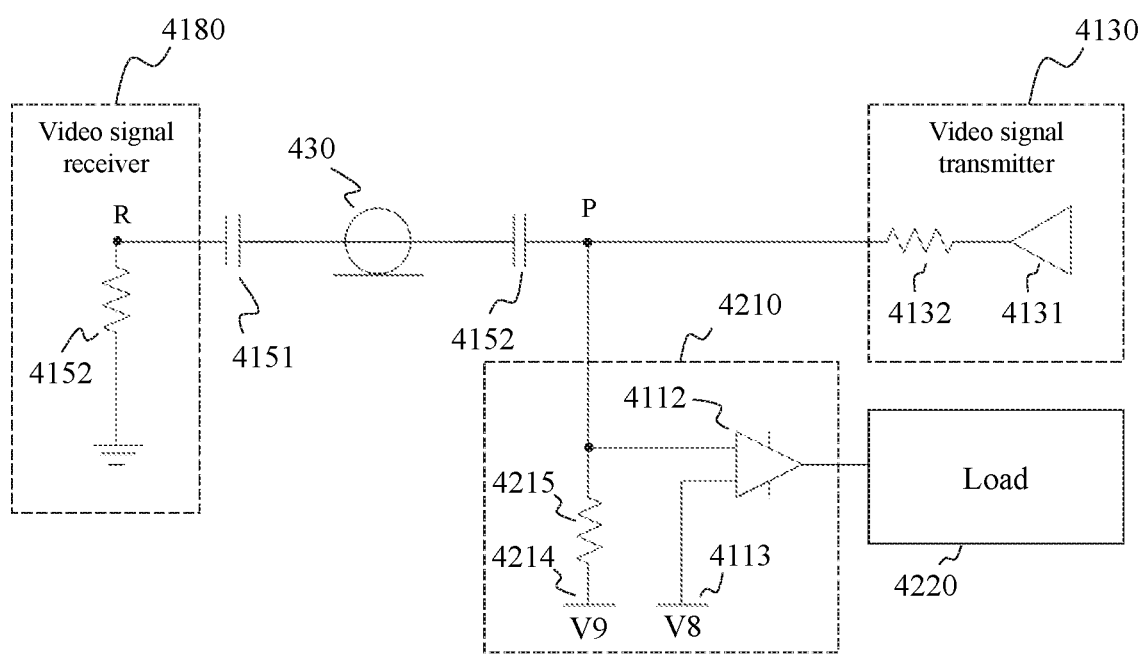

FIG. 42 is a schematic diagram illustrating an exemplary reverse control signal acquisition module according to some embodiments of the preset disclosure. Reverse control signal acquisition module 4210 may be an exemplary embodiment of the reverse control signal acquisition module 4012 (e.g., illustrated in FIG. 40). The reverse control signal acquisition module 4210 may be included in a frontend device 4200 for obtaining a reverse control signal transmitted by the backend device 4150 through a coaxial cable 430. For demonstration purposed and simplicity, only modules or components related to the acquisition of the reverse control signal are illustrated in FIG. 42.

The frontend device 4200 may be an exemplary embodiment of the frontend device 4000 (e.g., illustrated in FIG. 40). The frontend device 4200 may be the same as the frontend device 4100 (e.g., illustrated in FIG. 41) except that the frontend device 4200 may include a reverse control signal acquisition module 4210 instead of the reverse control signal acquisition module 4110. Load 4220 may represent all the electric components of the frontend device 4200 powered by the backend device 4150 and may include modules and units responding to the reverse control signal transmitted by the backend device 4150.

The reverse control signal acquisition module 4210 may also be an exemplary embodiment of the reverse control signal acquisition module 4012. Compared to the reverse control signal acquisition module 4110, the reverse control signal acquisition module 4210 may further include a voltage supply 4214 and a resistor 4215. A first terminal of the resistor 4215 may be coupled to the first input terminal of the comparator 4112. A second terminal of the resistor 4215 may be coupled to the voltage supply 4214. The voltage supply 4214 may output a voltage V9.

The frontend device 4200 may adjust the first bias voltage through configuring the voltage V9 and the resistor 4215. The voltage V8 outputted by the voltage supply 4113 may remain be equal to the voltage $V_{ref}$. Through configuring the voltage V9 and the resistor 4215, the first bias voltage at the point P may be tuned to a proper voltage, so that when the adjusted first bias voltage and the second superposed signal (or the reverse control signal when the video signal transmitter 4130 is not transmitting a video signal) received by the reverse control signal acquisition module 4210 is transmitted to the comparator 4112, the reverse control signal acquisition module 4210 may successfully obtain (or extract) the reverse control signal (the fourth extract signal), which may then be transmitted to the load 4220. The frontend device 4200 may perform a corresponding operation in response to the reverse control signal.

FIG. 43 is a schematic diagram illustrating an exemplary signal blocking module according to some embodiments of the present disclosure. Signal blocking module 4300 may be an exemplary embodiment of the signal blocking module 4015 (e.g., illustrated in FIG. 40). The signal blocking module 4300 may be included in a frontend device 4350, which is an exemplary embodiment of the frontend device 410 (e.g., illustrated in FIG. 4). Load 4320 may represent all the electric components of the frontend device 4350 powered by a backend device 2700 (e.g., illustrated in FIG. 27) or an embodiment thereof. In addition to block the video signal transmitted by a video signal transmitter (e.g., the video signal transmitter 411) of the frontend device 4350, the signal blocking module 4300 may further facilitate the backend device 2700 identifying whether the frontend device 4350 is a POC device. The frontend interface 3900 may also facilitate a discharge of the frontend device 4350 when the frontend device is unplugged from the backend device 2400.

As illustrated in FIG. 43, the signal blocking module 4300 may have a circuit structure the same as or similar to the circuit of the frontend interface 3900 illustrated in FIG. 39, except that a signal blocking unit 4310 is further integrated in to the frontend interface 3900. The first terminal of the resistor 3914, which is coupled to the first terminal of the capacitor 3931 in the frontend interface 3900, may be coupled to a first terminal of the signal blocking unit 4310. The first terminal of the capacitor 3931 may be coupled to a second terminal of the signal blocking unit 4310 and the load 4320.

The signal blocking unit 4310 may block the video signal transmitted by the video signal transmitter of the frontend device 4350. The signal blocking module 430 may prevent the video signal from being received by the load 4120 so that a signal attenuation of the video signal may be avoided or reduced. The signal blocking module 430 may also prevent the video signal from being transmitted to ground through the capacitor 3931. Other components of the signal blocking module 4300 may have the same functions as described in connection with FIG. 39. For example, the capacitor 3931 may facilitate the backend device 2700 identifying whether the frontend device 4350 is a POC device, and the transistors 3912 and 3913 may reduce the effect of the capacitor 3931 on the discharging speed of the frontend device 4350.

In some embodiments, the signal blocking unit 4310 may include a circuit the same as or similar to as the one illustrated in FIG. 28, the descriptions of which are not repeated herein. To implement the signal blocking unit 4310, the first terminal of the resistor 2811, which may be viewed as the first terminal of signal blocking unit 4310, may be coupled to the first terminal of the resistor 3914; the second terminal of the inductor 2841, which may be viewed as the second terminal of the signal blocking unit 4310, may be coupled to the first terminal of the capacitor 3931.

Figure 44:
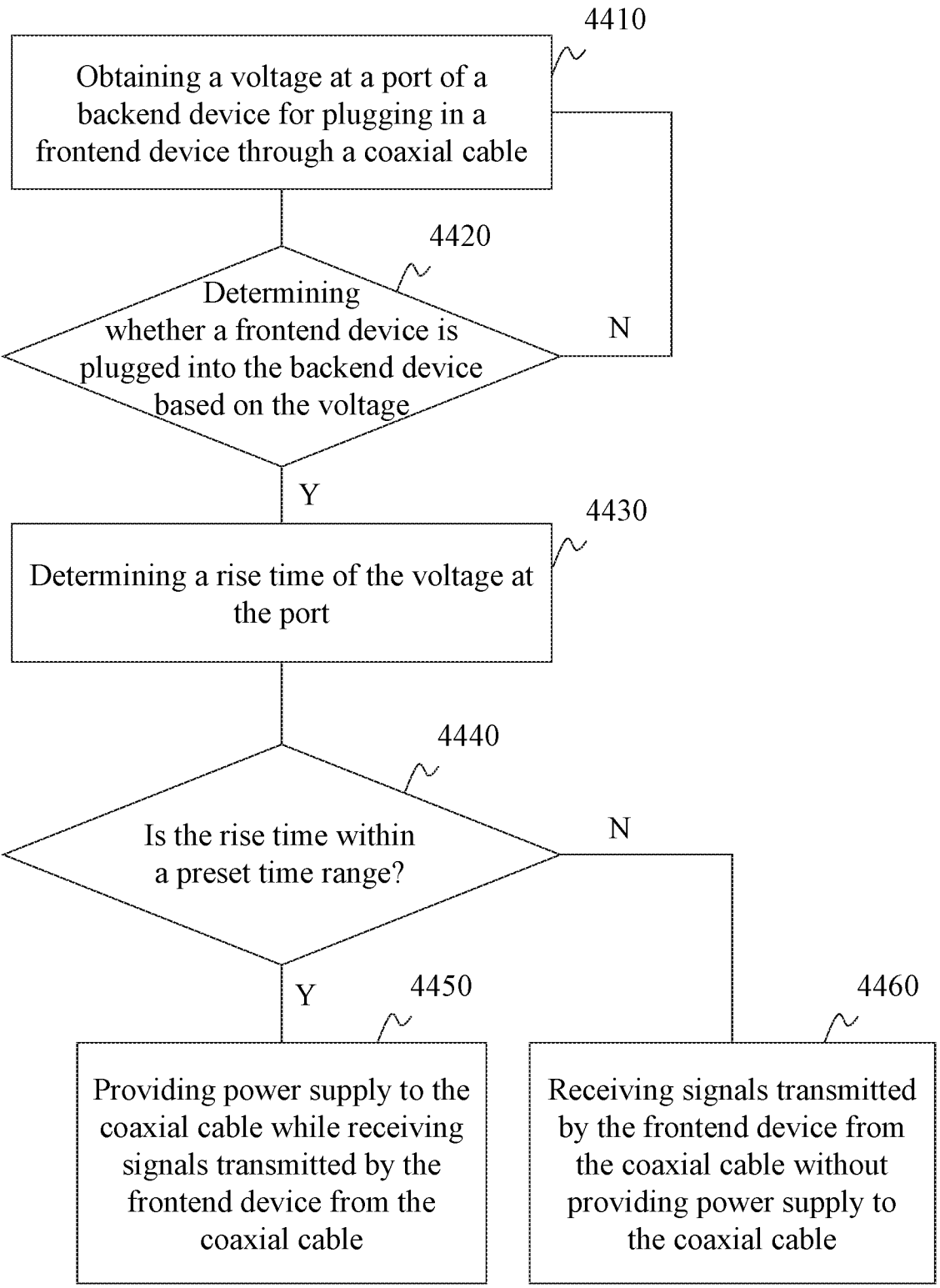
FIG. 44 is a schematic diagram illustrating an exemplary power supply providing process according to some embodiments of the present disclosure.

FIG. 44 is a schematic diagram illustrating an exemplary power supply providing process according to some embodiments of the present disclosure. Process 4400 may be performed by the backend device 2700 (e.g., illustrated in FIG. 27) or an embodiment thereof. Through process 4400, the backend device 2700 may determine whether to transmit a power supply to a frontend device 2790 (or an embodiment thereof) plugged in.

In 4410, the identification module 2420 may obtain a voltage at a port (e.g., the port of the port module 2450) of the backend device 2700 for plugging in a frontend device 2790 through a coaxial cable 430. The identification module 2420 may be configured to obtain the voltage at the port in real-time or periodically (e.g., once per second, tenth per second). The backend device 2700 may be at the power-cut mode during the operation 4410. In some embodiments, the identification module 2420 may monitor or obtain the voltage through the circuit 2500 as illustrated in FIG. 25.

In 4420, the identification module 2420 may determine whether a frontend device 2790 is plugged into the backend device based on the voltage at the port. For example, upon obtaining a voltage equal to a first predetermined voltage, the identification module 2420 may determine that a frontend device 2790 is plugged into the port module 2750. Detailed descriptions of the determination and the first predetermined voltage may be found elsewhere (e.g., in connection with FIGS. 24, 25, and 26) in the present disclosure, which are not repeated here. The identification module 2420 may also adopt other techniques known in the art to determine whether a frontend device 2790 (or any other devices) is plugged into the backend device 2700. Upon determining that a frontend device 2790 is plugged into the backend device, the identification module 2420 may perform operation 4430. Upon determining that no frontend device is plugged into the backend device, the identification module 2420 may continue monitoring the voltage at the port.

In 4430, the identification module 2420 may determine a rise time of the voltage at the port upon determining that a frontend device is plugged into the backend device 2700. For example, upon obtaining a voltage equal to the first predetermined voltage, the identification module 2420 may set a current time point (the time point when the voltage obtained or detected by the identification module 2420 is the first predetermined voltage) as a first time point; upon obtaining a voltage equal to a second predetermined voltage, the identification module 2420 may set a current time point (the time point when the voltage obtained or detected by the identification module 2420 is the second predetermined voltage) as a second time point. The second predetermined voltage may be higher than the first predetermined voltage. The identification module 2420 may then determine a rise time (a time during which the obtained voltage is varied from the first predetermined voltage to the second predetermined voltage) based on the first time point and the second time point.

The identification module 2420 may also determine the rise time based on a predetermined voltage (a third predetermined voltage) other than the first predetermined voltage. For example, the third predetermined voltage may be higher than the first predetermined voltage and lower than the second predetermined voltage. Upon obtaining a voltage equal to the third predetermined voltage, the identification module 2420 may set a current time point (the time point when the voltage obtained or detected by the identification module 2420 is the third predetermined voltage) as a third time point. The identification module 2420 may then determine a rise time (a time during which the obtained voltage is varied from the third predetermined voltage to the second predetermined voltage) based on the third time point and the second time point.

The identification module 2420 may then transmit the determined rise time to the processing module 2430. Alternatively or additionally, the identification module 2420 may transmit the rise time to a storage device. The processing module 2430 may obtain the rise time from the storage device. In some embodiments, the processing module 2430 and the processing module 2430 may be integrated into a same module, chip or circuit, and the rise time transmission may be omitted.

In 4440, the processing module 2430 may determine whether the rise time is within a preset time range. If the rise time is within the preset time range, the processing module 2430 may determine that the frontend device 2790 coupled in is a POC device, and the operation 4450 may be performed. If the rise time is out of the preset time range, the processing module 2430 may determine that the frontend device 2790 coupled in is a non-POC device, and the operation 4460 may be performed.

In 4450, the backend device 2700 may provide power supply to the coaxial cable while receiving signals transmitted by the frontend device 2490 from the coaxial cable. The power supply (electric current) and the signal (e.g., video signal) may be transmitted through the coaxial cable 430 in opposite directions. In some embodiments, the processing module 2430 may transmit a turn-on signal to the switch module 2440 causing the switch module 2440 to be turned on. The power 2480 may than transmit power supply through an electric path formed by the signal blocking module 2730, the switch module 2440, the port module 2750, the coaxial cable 430, to the frontend device 2470 (or the frontend device 2790). The video signal may be transmitted from the frontend device 2790 through the same coaxial cable 430 to the video signal receiver 2740. The video signal may be optionally processed by the video signal processor 2720. In some embodiments, the video signal processor 2720 may be removed from the backend device 2700 and the video signal may be directly transmitted from the port module 2750 to the video signal receiver 2740.

In 4460, the backend device 2700 may receive signals transmitted by the frontend device 2790 from the coaxial cable without providing power supply to the coaxial cable. For example, the processing module 2430 may transmit a turn-off signal to the switch module 2440 causing the switch module 2440 to be turned off. As the switch module 2440 is turned off since the operation 4410, the switch module 2440 may remain to be turned off. Alternatively, the processing module 2430 may not perform any specified operation upon determining that the rise time of the voltage at the port is out of the preset time range, and the switch module 2440 may remain to be turned off. Consequently, the backend device 2700 may not provide power supply to the frontend device 2790 through the coaxial cable 430. However, the video signal may stilled be transmitted from the frontend device 2790 through the coaxial cable 430 to the video signal receiver 2740.

In some embodiments, during the operation 4450 or 4460, the video signal may be processed in a manner as described in connection with FIGS. 4 to 23, the descriptions of which are not repeated here.

In some embodiments, during the operation 4450 or 4460, a reverse control signal may be transmitted from the backend device 2700 or 3200 (e.g., transmitted by the video signal receiver 2740 or 3250). The reverse control signal may be superposed on the video signal, transmitted through the coaxial cable 430, and received by the frontend device 2790 or 3260. The frontend device 2790 or 3260 may obtain the reverse control signal then perform a corresponding function.

It may be noted that the above descriptions of the power supply providing process are only for demonstration purposes, and not intended to limit the scope of the present disclosure. It is understandable that, after learning the major concept and the mechanism of the present disclosure, a person of ordinary skill in the art may alter process 4400 in an uncreative manner. For example, the operations above may be implemented in an order different from that illustrated in FIG. 44. One or more optional operations may be added to the flowcharts. One or more operations may be divided or be combined. All such modifications are within the protection scope of the present disclosure.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "unit," "module," or "system." Furthermore, aspects of the present disclosure may take the form of a computer program product embodied in one or more computer readable media having computer readable program code embodied thereon.

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purposes, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, for example, an installation on an existing server or mobile device.

Similarly, it should be appreciated that in the foregoing description of embodiments of the present disclosure, various features are sometimes grouped together in a single embodiment, figure, or description thereof for the purposes of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and describe.

What is claimed is:

1. A backend device for transmitting power supply to a frontend device and receiving an analog signal therefrom through a single cable, the backend device comprising:
   a power, configured to transmit the power supply;
   a signal processing circuit, configured to generate a processed signal based on the analog signal;
   a signal receiver, configured to receive the processed signal; and
   a backend interface, configured to receive the analog signal from the cable, receive the power supply from the power, separate the analog signal and the power supply, transmit the analog signal to the signal processing circuit, and transmit the power supply to the cable, wherein the backend interface comprises:
      a port for plugging in a frontend device;
      an identification module, configured to obtain a voltage at the port, determine whether a frontend device is plugged into the port based on the voltage, and determine a rise time of the voltage at the port upon determining that the frontend device is plugged into the port; and
      a processing module, configured to determine whether the rise time is within a preset time range and transmit a turn-on signal upon determining that the rise time is within the preset time range, wherein the turn-on signal causes the backend device to provide the power supply through the cable to the frontend device.

2. The backend device of claim 1, wherein the backend interface comprises:
   a signal blocking module, configured to block the analog signal while allow a pass of the power supply; and
   a power supply blocking module, configured to block the power supply while allow a pass of the analog signal.

3. The backend device of claim 1, wherein the backend interface further comprises:
   a safety module, configured to transmit a warning signal to the processing module when a current passing through the safety module is out of a preset current range or when the frontend device is unplugged from the port, wherein the warning signal causes the backend device to stop providing the power supply through the cable to the frontend device.

4. The backend device of claim 1, wherein to generate the processed signal, the signal processing circuit is further configured to:
   perform a compensation upon the analog signal.

5. The backend device of claim 1, wherein to generate the processed signal, the signal processing circuit is configured to:
   detect a voltage of a first sub-signal of a first frequency band of the analog signal; and
   remove a second sub-signal of a second frequency band of the analog signal from the analog signal when the voltage of the first sub-signal is out of a first preset voltage range, wherein the second frequency band covers the first frequency band.

6. The backend device of claim 5, wherein to generate the processed signal, the signal processing circuit is further configured to:
   transmit the analog signal to the signal receiver without removing the second sub-signal when the voltage of the first sub-signal is within the first preset voltage range.

7. The backend device of claim 5, wherein the first frequency band and the second frequency band are lower than 25 Hz.

8. The backend device of claim 1, wherein:
   the signal receiver is further configured to transmit a reverse control signal causing the frontend device to perform a corresponding operation, wherein the signal receiver receives the processed signal and transmits the reverse control signal through a same electronic path; and
   the signal processing circuit is further configured to:
      obtain the reverse control signal; and
      superpose the reverse control signal on the analog signal.

9. The backend device of claim 8, wherein the reverse control signal has a high level and a low level, and the signal processing circuit is further configured to block the processed signal when the reverse control signal is at the high level.

10. A method for a backend device transmitting power supply to a frontend device and receiving an analog signal therefrom through a single cable, comprising:
   by a power, transmitting the power supply;
   by a signal processing circuit, generating a processed signal based on the analog signal;

by a signal receiver, receiving the processed signal;

by a backend interface, receiving the analog signal from the cable, receiving the power supply from the power, separating the analog signal and the power supply, transmitting the analog signal to the signal processing circuit, and transmitting the power supply to the cable;

by a port, plugging in a frontend device;

by an identification module, obtaining a voltage at the port, determining whether a frontend device is plugged into the port based on the voltage, and determining a rise time of the voltage at the port upon determining that the frontend device is plugged into the port; and by a processing module, determining whether the rise time is within a preset time range and transmitting a turn-on signal upon determining that the rise time is within the preset time range, wherein the turn-on signal causes the backend device to provide the power supply through the cable to the frontend device.

11. The method of claim 10, further comprising:
by a signal blocking module, blocking the analog signal while allow a pass of the power supply; and
by a power supply blocking module, blocking the power supply while allow a pass of the analog signal.

12. The method of claim 10, further comprising:
by a safety module, transmitting a warning signal to the processing module when a current passing through the safety module is out of a preset current range or when the frontend device is unplugged from the port, wherein the warning signal causes the backend device to stop providing the power supply through the cable to the frontend device.

13. The method of claim 10, wherein the generating the processed signal further comprises:
performing a compensation upon the analog signal.

14. The method of claim 10, wherein the generating the processed signal further comprises:
detecting a voltage of a first sub-signal of a first frequency band of the analog signal; and
removing a second sub-signal of a second frequency band of the analog signal from the analog signal when the voltage of the first sub-signal is out of a first preset voltage range, wherein the second frequency band covers the first frequency band.

15. The method of claim 14, wherein the generating the processed signal further comprises:
transmitting the analog signal to the signal receiver without removing the second sub-signal when the voltage of the first sub-signal is within the first preset voltage range.

16. The method of claim 14, wherein the first frequency band and the second frequency band are lower than 25 Hz.

17. The method of claim 10, further comprising:
by the signal receiver, transmitting a reverse control signal causing the frontend device to perform a corresponding operation, wherein the receiving the processed signal and the transmitting the reverse control signal are performed through a same electronic path;
by the signal processing circuit, obtaining the reverse control signal; and
superposing the reverse control signal on the analog signal.

18. The method of claim 17, wherein the reverse control signal has a high level and a low level, the method further comprising:
by the signal processing circuit, blocking the processed signal when the reverse control signal is at the high level.

* * * * *